US012133388B2

(12) United States Patent
Funayama et al.

(10) Patent No.: US 12,133,388 B2
(45) Date of Patent: Oct. 29, 2024

(54) THREE-DIMENSIONAL MEMORY DEVICE WITH SELF-ALIGNED ETCH STOP RINGS FOR A SOURCE CONTACT LAYER AND METHOD OF MAKING THE SAME

(71) Applicant: SANDISK TECHNOLOGIES LLC, Addison, TX (US)

(72) Inventors: Kota Funayama, Yokkaichi (JP); Satoshi Shimizu, Yokkaichi (JP); Koichi Matsuno, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 458 days.

(21) Appl. No.: 17/583,456

(22) Filed: Jan. 25, 2022

(65) Prior Publication Data
US 2023/0240070 A1    Jul. 27, 2023

(51) Int. Cl.
*H10B 43/27*    (2023.01)
*H10B 41/27*    (2023.01)

(52) U.S. Cl.
CPC ............. *H10B 43/27* (2023.02); *H10B 41/27* (2023.02)

(58) Field of Classification Search
CPC ........ H10B 43/27; H10B 41/27; H10B 43/40; H10B 43/10; H10B 43/35
USPC ................................. 257/192; 438/285, 590
See application file for complete search history.

(56) References Cited

U.S. PATENT DOCUMENTS

| | | |
|---|---|---|
| 5,915,167 A | 6/1999 | Leedy |
| 9,799,670 B2 | 10/2017 | Nishikawa et al. |
| 9,831,266 B2 | 11/2017 | Kai et al. |
| 9,876,031 B1 | 1/2018 | Shimizu et al. |
| 9,917,100 B2 | 3/2018 | Zhang et al. |
| 9,985,098 B2 | 5/2018 | Matsumoto et al. |
| 10,008,570 B2 | 6/2018 | Yu et al. |
| 10,020,363 B2 | 7/2018 | Ogawa et al. |

(Continued)

FOREIGN PATENT DOCUMENTS

| | | |
|---|---|---|
| KR | 10-2018-0071100 A | 6/2018 |
| KR | 20180071100 A | 6/2018 |

OTHER PUBLICATIONS

Notification of Transmittal of the International Search Report and Written Opinion of the International Searching Authority for International Patent Application No. PCT/US2022/030057, mailed Oct. 24, 2022, 8 pages.

(Continued)

*Primary Examiner* — Didarul A Mazumder
(74) *Attorney, Agent, or Firm* — THE MARBURY LAW GROUP PLLC

(57) ABSTRACT

A memory device includes a lower source-level semiconductor layer, a source contact layer, an upper source-level semiconductor layer, and an alternating stack of insulating layers and electrically conductive layers, and a memory opening fill structure vertically extending through the alternating stack and down to an upper portion of the lower source-level semiconductor layer. The memory opening fill structure includes a vertical semiconductor channel, a memory film laterally surrounding the vertical semiconductor channel, and an annular semiconductor cap contacting a bottom surface of the memory film and contacting a top surface segment of the source contact layer. The annular semiconductor cap may be employed as an etch stop structure during a manufacturing process.

14 Claims, 48 Drawing Sheets

(56) References Cited

U.S. PATENT DOCUMENTS

| | | |
|---|---|---|
| 10,115,681 B1 | 10/2018 | Ariyoshi |
| 10,199,359 B1 | 2/2019 | Sakakibara et al. |
| 10,224,340 B2 | 3/2019 | Hada et al. |
| 10,224,373 B2 | 3/2019 | Sel et al. |
| 10,290,645 B2 | 5/2019 | Nakatsuji et al. |
| 10,290,650 B1 | 5/2019 | Iwai |
| 10,354,956 B1 | 7/2019 | Yu et al. |
| 10,381,373 B2 | 8/2019 | Okizumi et al. |
| 10,438,964 B2 | 10/2019 | Makala et al. |
| 10,559,582 B2 | 2/2020 | Nishikawa et al. |
| 10,629,613 B1 | 4/2020 | Shimizu et al. |
| 10,720,445 B1 | 7/2020 | Shimizu et al. |
| 10,748,925 B1 | 8/2020 | Tsutsumi et al. |
| 10,797,070 B2 | 10/2020 | Mushiga et al. |
| 10,804,291 B1 | 10/2020 | Rajashekhar et al. |
| 10,854,627 B1 | 12/2020 | Moriyama et al. |
| 10,861,869 B2 | 12/2020 | Nakamura et al. |
| 10,868,025 B2 | 12/2020 | Zhou et al. |
| 10,903,222 B2 | 1/2021 | Sakakibara et al. |
| 10,916,556 B1 | 2/2021 | Sakakibara et al. |
| 10,923,496 B2 | 2/2021 | Mushiga et al. |
| 10,923,498 B2 | 2/2021 | Otsu et al. |
| 10,957,648 B2 | 3/2021 | Hsu et al. |
| 10,964,715 B2 | 3/2021 | Kakazu et al. |
| 11,121,153 B1 | 9/2021 | Obu et al. |
| 11,127,759 B2 | 9/2021 | Obu et al. |
| 11,195,781 B2 | 12/2021 | Okina et al. |
| 11,201,107 B2 | 12/2021 | Okina et al. |
| 2014/0264542 A1* | 9/2014 | Simsek-Ege ........ H01L 29/7889 438/287 |
| 2017/0148800 A1 | 5/2017 | Nishikawa et al. |
| 2017/0148810 A1 | 5/2017 | Kai et al. |
| 2017/0148811 A1 | 5/2017 | Zhang et al. |
| 2017/0271261 A1* | 9/2017 | Tsutsumi ............... H10B 43/10 |
| 2018/0006049 A1* | 1/2018 | Inomata ............... H01L 23/5283 |
| 2018/0006052 A1* | 1/2018 | Hwang ............ H01L 21/76879 |
| 2018/0122904 A1 | 5/2018 | Matsumoto et al. |
| 2018/0122905 A1 | 5/2018 | Ogawa et al. |
| 2018/0122906 A1* | 5/2018 | Yu ........................ H10B 41/27 |
| 2018/0366486 A1 | 12/2018 | Hada et al. |
| 2018/0366487 A1 | 12/2018 | Okizumi et al. |
| 2018/0374866 A1 | 12/2018 | Makala et al. |
| 2019/0006381 A1 | 1/2019 | Nakatsuji et al. |
| 2019/0006418 A1 | 1/2019 | Sel et al. |
| 2019/0043830 A1 | 2/2019 | Sakakibara et al. |
| 2019/0214344 A1 | 7/2019 | Yu et al. |
| 2019/0326313 A1* | 10/2019 | Cui ........................ H10B 43/10 |
| 2019/0371807 A1 | 12/2019 | Nishikawa et al. |
| 2020/0020715 A1 | 1/2020 | Nakamura et al. |
| 2020/0027835 A1 | 1/2020 | Hsu et al. |
| 2020/0168619 A1* | 5/2020 | Zhou ..................... H10B 41/35 |
| 2020/0251479 A1 | 8/2020 | Sakakibara et al. |
| 2020/0251486 A1 | 8/2020 | Tsutsumi et al. |
| 2020/0335487 A1 | 10/2020 | Rajashekhar et al. |
| 2020/0335516 A1 | 10/2020 | Rajashekhar et al. |
| 2020/0357815 A1 | 11/2020 | Iwai et al. |
| 2020/0388626 A1 | 12/2020 | Baraskar et al. |
| 2020/0388688 A1* | 12/2020 | Baraskar ............. H01L 23/5226 |
| 2021/0265372 A1 | 8/2021 | Kanakamedala et al. |
| 2021/0265379 A1 | 8/2021 | Obu et al. |
| 2021/0265380 A1* | 8/2021 | Obu ................. H01L 29/41741 |
| 2021/0375910 A1 | 12/2021 | Baraskar et al. |
| 2021/0408025 A1 | 12/2021 | Hinoue |
| 2021/0408031 A1 | 12/2021 | Sharangpani et al. |
| 2021/0408033 A1 | 12/2021 | Baraskar et al. |
| 2021/0408035 A1 | 12/2021 | Sato et al. |

OTHER PUBLICATIONS

Endoh et al., "Novel Ultra High-Density Memory with a Stacked-Surrounding Gate Transistor (S-SGT) Structured Cell," IEDM Proc. (2001) 33-36.

U.S. Appl. No. 16/985,340, filed Aug. 5, 2020, SanDisk Technologies LLC.

U.S. Appl. No. 16/985,388, filed Aug. 5, 2020, SanDisk Technologies LLC.

U.S. Appl. No. 16/985,410, filed Aug. 5, 2020, SanDisk Technologies LLC.

U.S. Appl. No. 17/232,209, filed Apr. 16, 2021, SanDisk Technologies LLC.

U.S. Appl. No. 17/355,955, filed Jun. 23, 2021, SanDisk Technologies LLC.

U.S. Appl. No. 17/523,447, filed Nov. 10, 2021, SanDisk Technologies LLC.

* cited by examiner

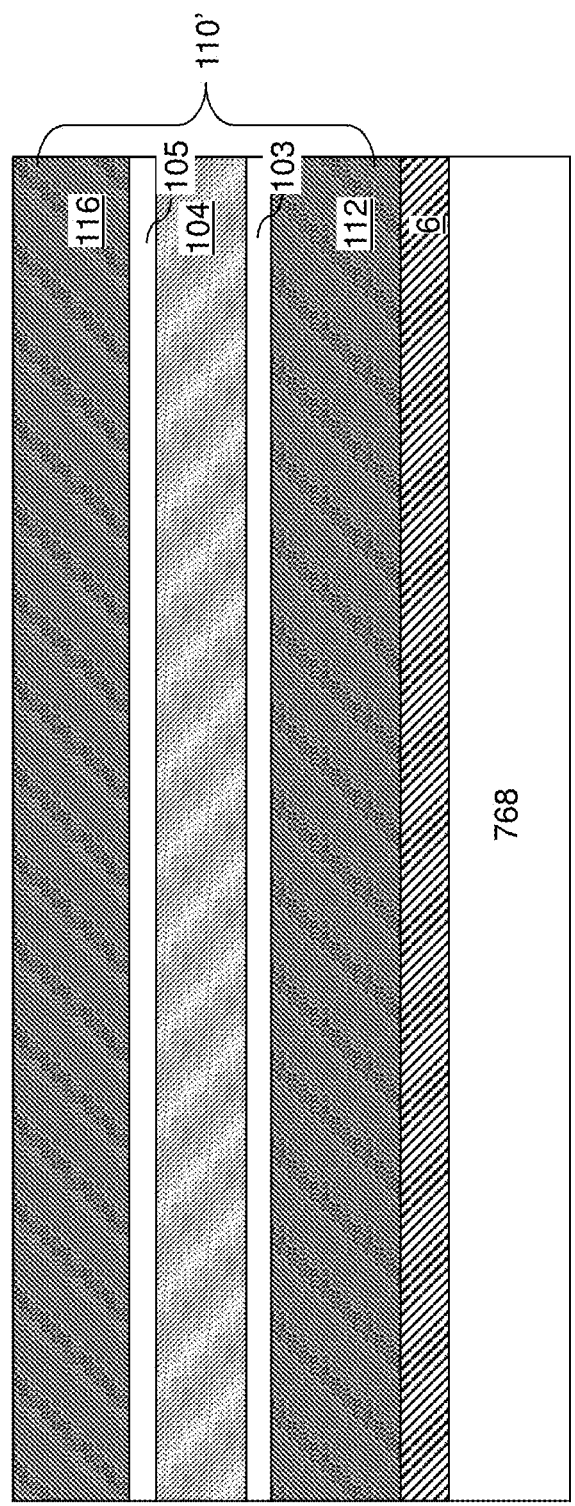

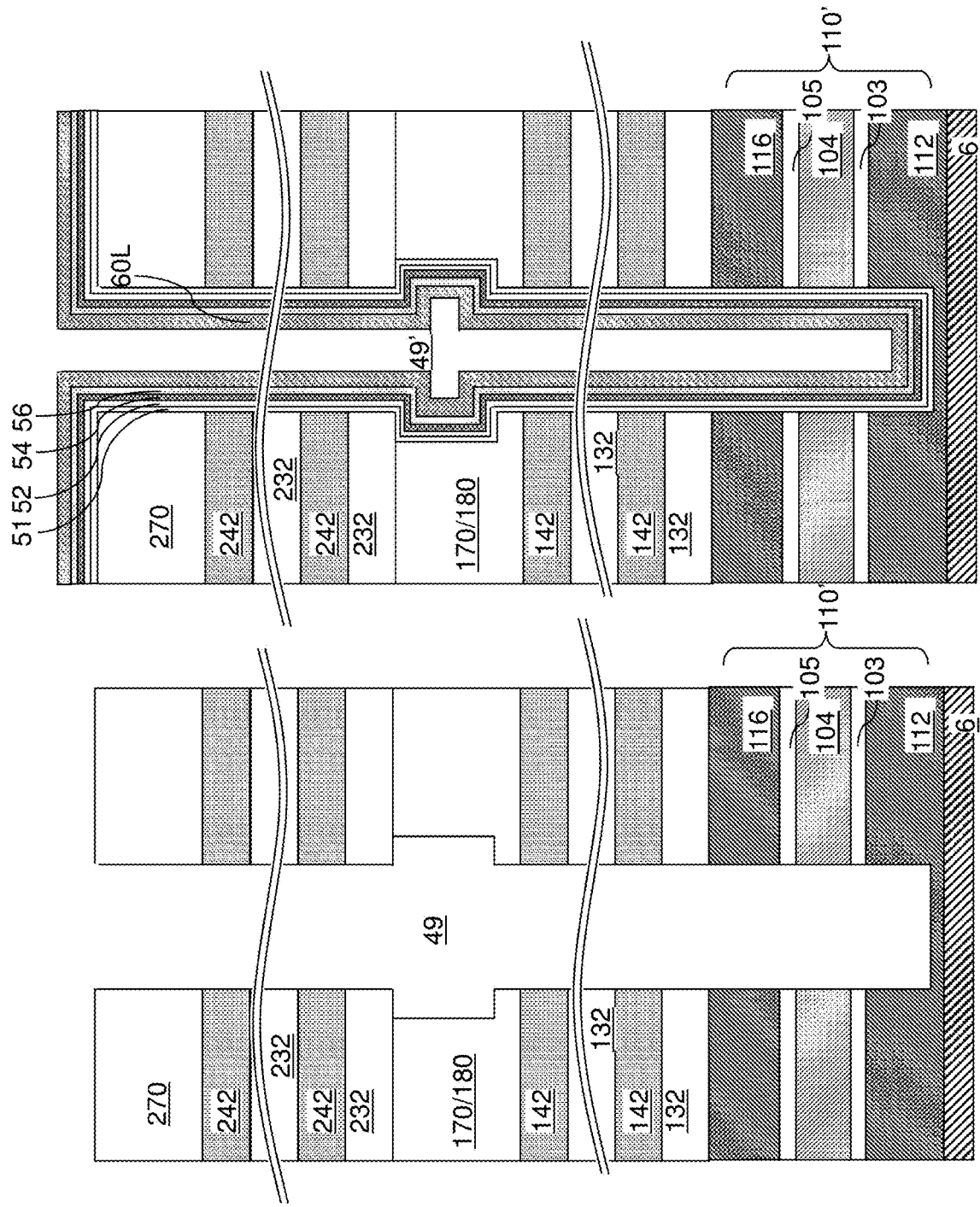

THREE-DIMENSIONAL MEMORY DEVICE WITH SELF-ALIGNED ETCH STOP RINGS FOR A SOURCE CONTACT LAYER AND METHOD OF MAKING THE SAME

FIELD

The present disclosure relates generally to the field of semiconductor devices, and particularly to a three-dimensional memory device including self-aligned etch stop rings for a source contact layer and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a memory device is provided, which comprises: a layer stack including a lower source-level semiconductor layer, a source contact layer, and an upper source-level semiconductor layer; an alternating stack of insulating layers and electrically conductive layers located over the layer stack; and a memory opening fill structure vertically extending through the alternating stack, the upper source-level semiconductor layer, the source contact layer, and an upper portion of the lower source-level semiconductor layer, wherein the memory opening fill structure comprises: a vertical semiconductor channel vertically extending through the alternating stack and into the upper portion of the lower source-level semiconductor layer; a memory film laterally surrounding the vertical semiconductor channel and vertically extending through the alternating stack and into an upper portion of the upper source-level semiconductor layer; and a first annular semiconductor cap contacting a bottom surface of the memory film and contacting a top surface segment of the source contact layer.

According to another embodiment of the present disclosure, a method of forming a memory device is provided, which comprises: forming an alternating stack of insulating layers and sacrificial material layers over a layer stack including a lower source-level semiconductor layer, a source-level sacrificial layer, and an upper source-level semiconductor layer; forming a memory opening through the alternating stack and into the layer stack; forming a memory opening fill structure in the memory opening, wherein the memory opening fill structure comprises a memory film and a vertical semiconductor channel; forming a source cavity by removing the source-level sacrificial layer selective to the memory film, the lower source-level semiconductor layer, and the upper source-level semiconductor layer; isotropically recessing portions of the memory film that are proximal to the source cavity; conformally depositing and isotropically etching a semiconductor fill material in the source cavity, wherein a remaining portion of the semiconductor fill material comprises a first annular semiconductor cap contacting a cylindrical surface segment of the upper source-level semiconductor layer and laterally surrounding the memory film; physically exposing a cylindrical surface segment of the vertical semiconductor channel by isotropically etching an additional portion of the memory film selective to the first annular semiconductor cap; forming a source contact layer in the source cavity directly on the cylindrical surface segment of the vertical semiconductor channel and directly on the first annular semiconductor cap; and replacing the sacrificial material layers with electrically conductive layers.

BRIEF DESCRIPTION OF THE DRAWINGS

FIG. 1C is a magnified view of the in-process source level material layers along the vertical plane C-C' of FIG. 1B.

FIGS. 9A-9D illustrate sequential vertical cross-sectional views of a memory opening during formation of a memory opening fill structure according to an embodiment of the present disclosure.

DETAILED DESCRIPTION

Figure 1A:
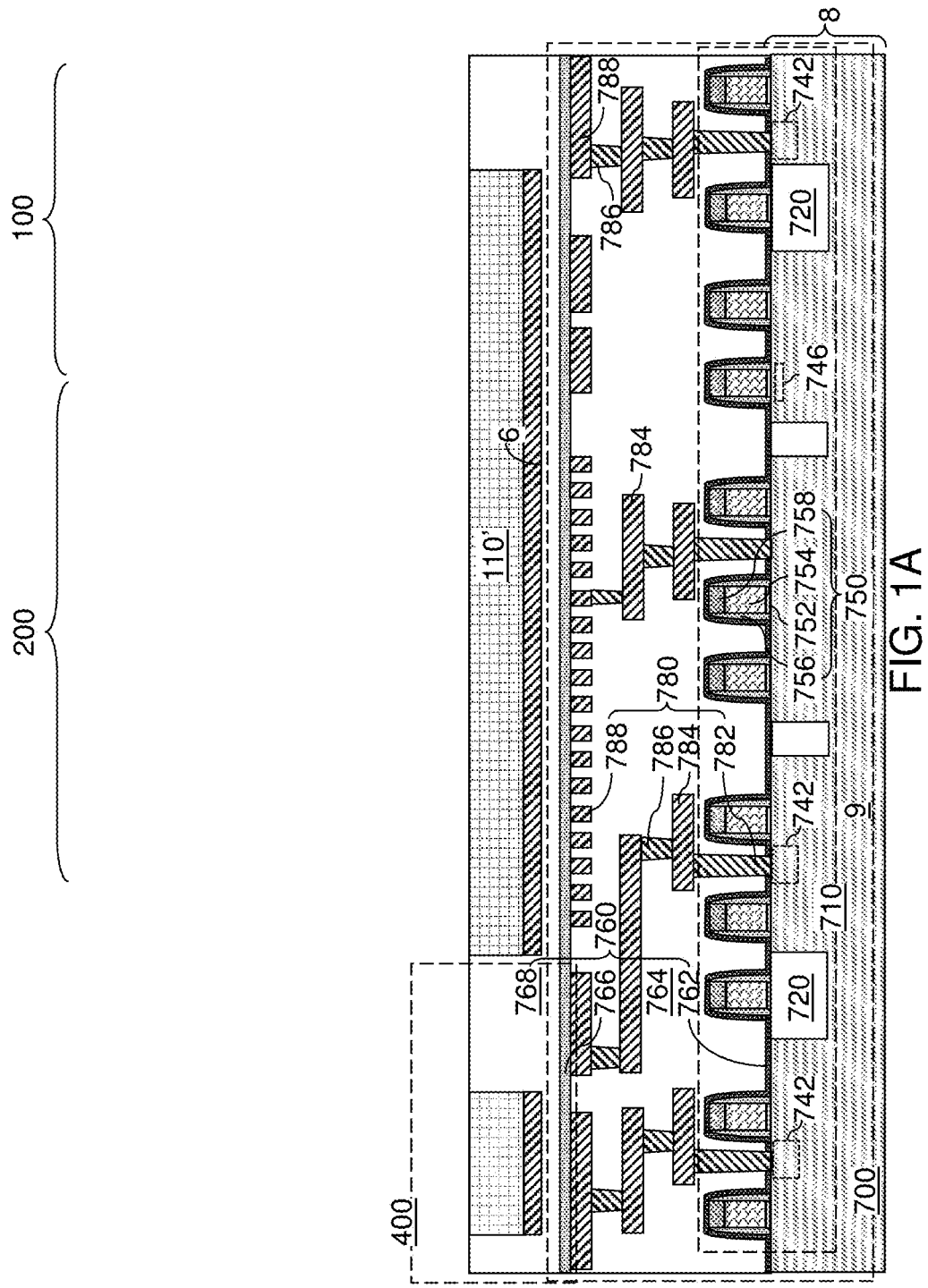
FIG. 1A is a vertical cross-sectional view of an exemplary structure after formation of semiconductor devices, lower level dielectric layers, lower metal interconnect structures, and in-process source level material layers on a semiconductor substrate according to an embodiment of the present disclosure.

As discussed above, embodiments of the present disclosure provide a three-dimensional memory device including self-aligned etch stop rings for a source contact layer and methods of manufacturing the same and methods of manufacturing the same, the various aspects of which are described herein in detail. The embodiments of the present disclosure may be used to form various semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1 \times 10^{-5}$ S/m to $1 \times 10^5$ S/m. As used herein, a "semiconductor material" refers to a material having electrical conductivity in the range from $1 \times 10^{-5}$ S/m to 1 S/m in the absence of electrical dopants therein, and is capable of producing a doped material having electrical conductivity in a range from 1 S/m to $1 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1 \times 10^5$ S/m. As used herein, an "insulator material" or a "dielectric material" refers to a material having electrical conductivity less than $1 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1 \times 10^{-5}$ S/m to $1 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
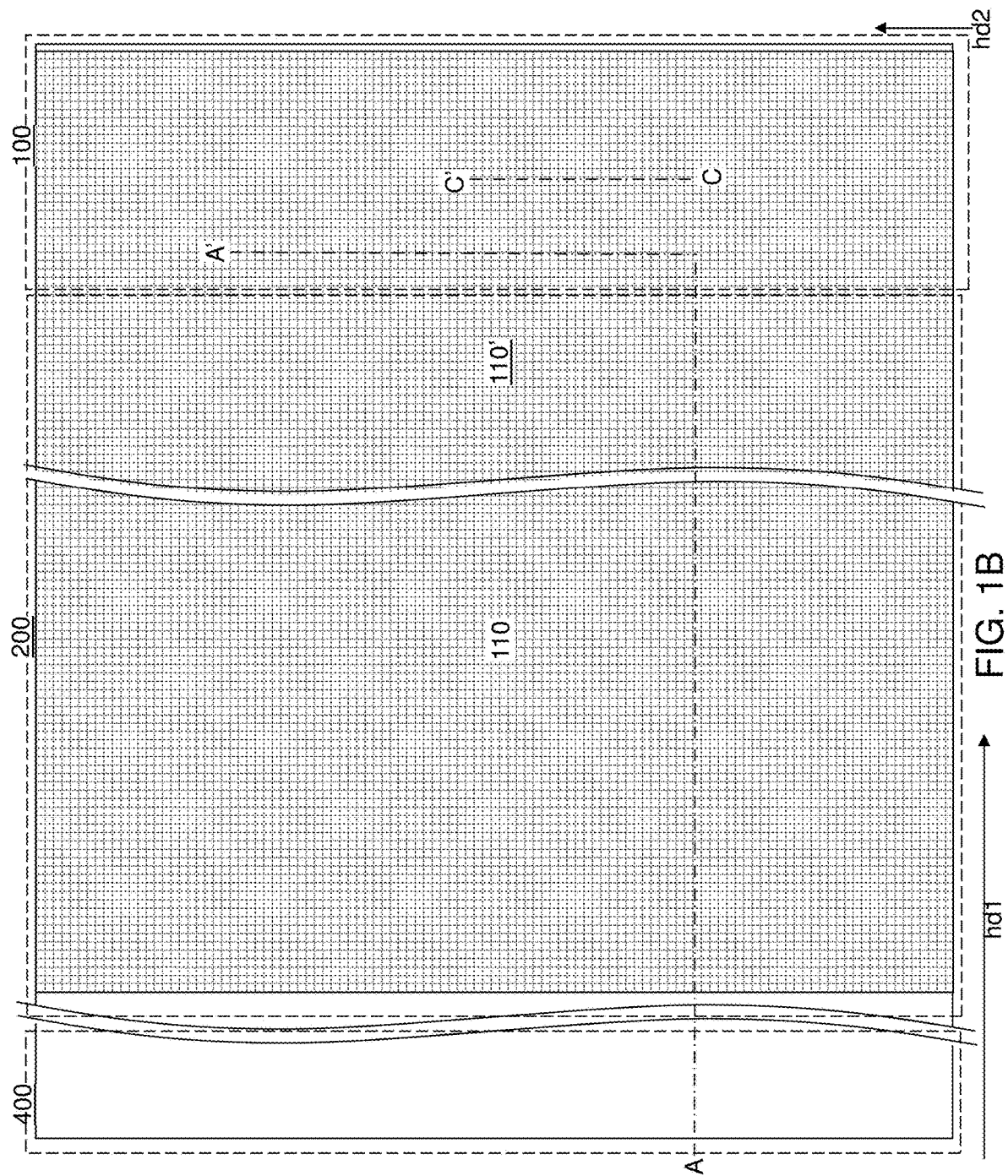
FIG. 1B is a top-down view of the exemplary structure of FIG. 1A. The hinged vertical plane A-A' is the plane of the vertical cross-sectional view of FIG. 1A.

Referring to FIGS. 1A-1C, an exemplary structure according to an embodiment of the present disclosure is illustrated. FIG. 1C is a magnified view of an in-process source-level material layers 110' illustrated in FIGS. 1A and 1B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, and an upper source-level semiconductor layer 116.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 60 nm, such as from 10 nm to 40 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
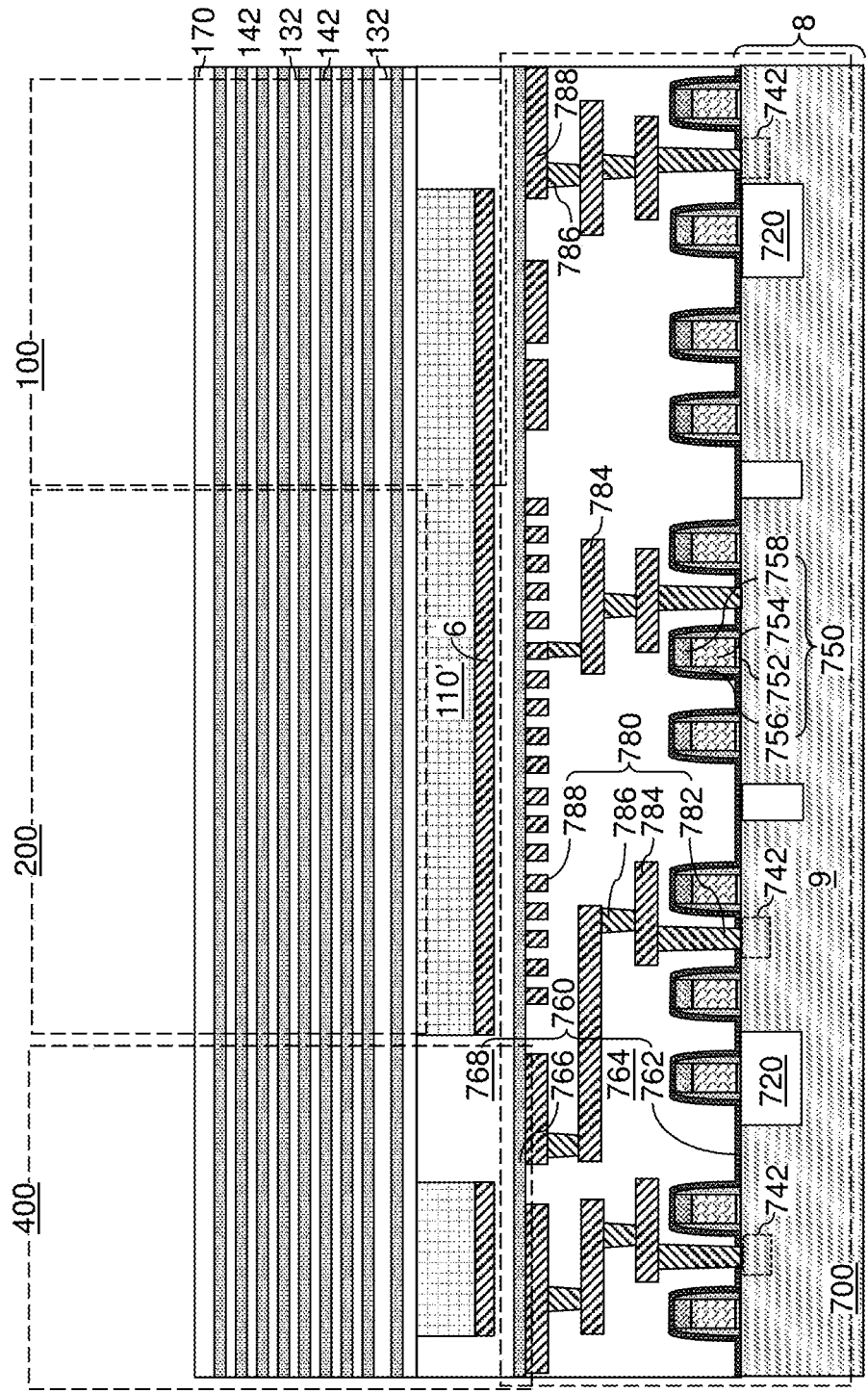
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
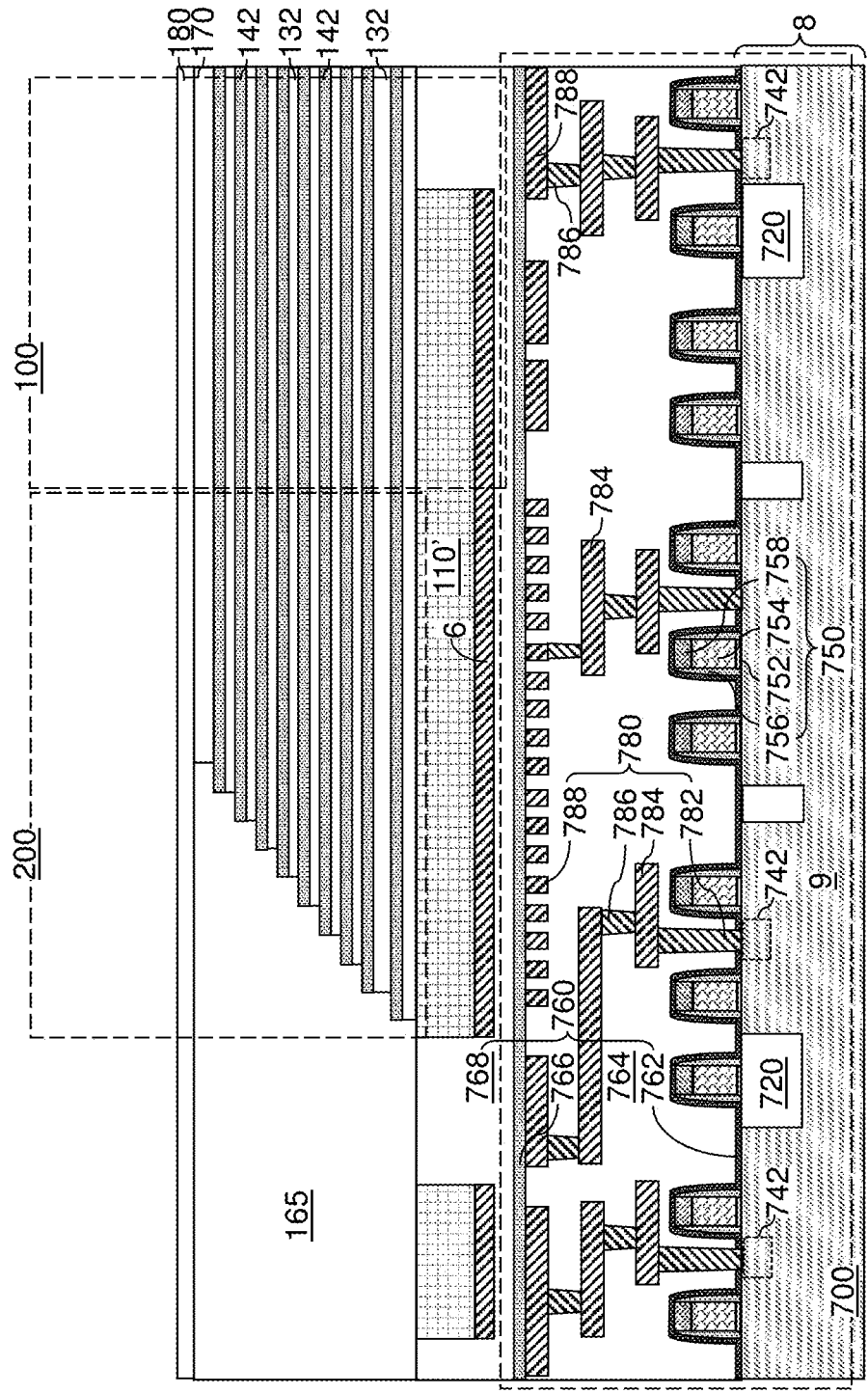
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
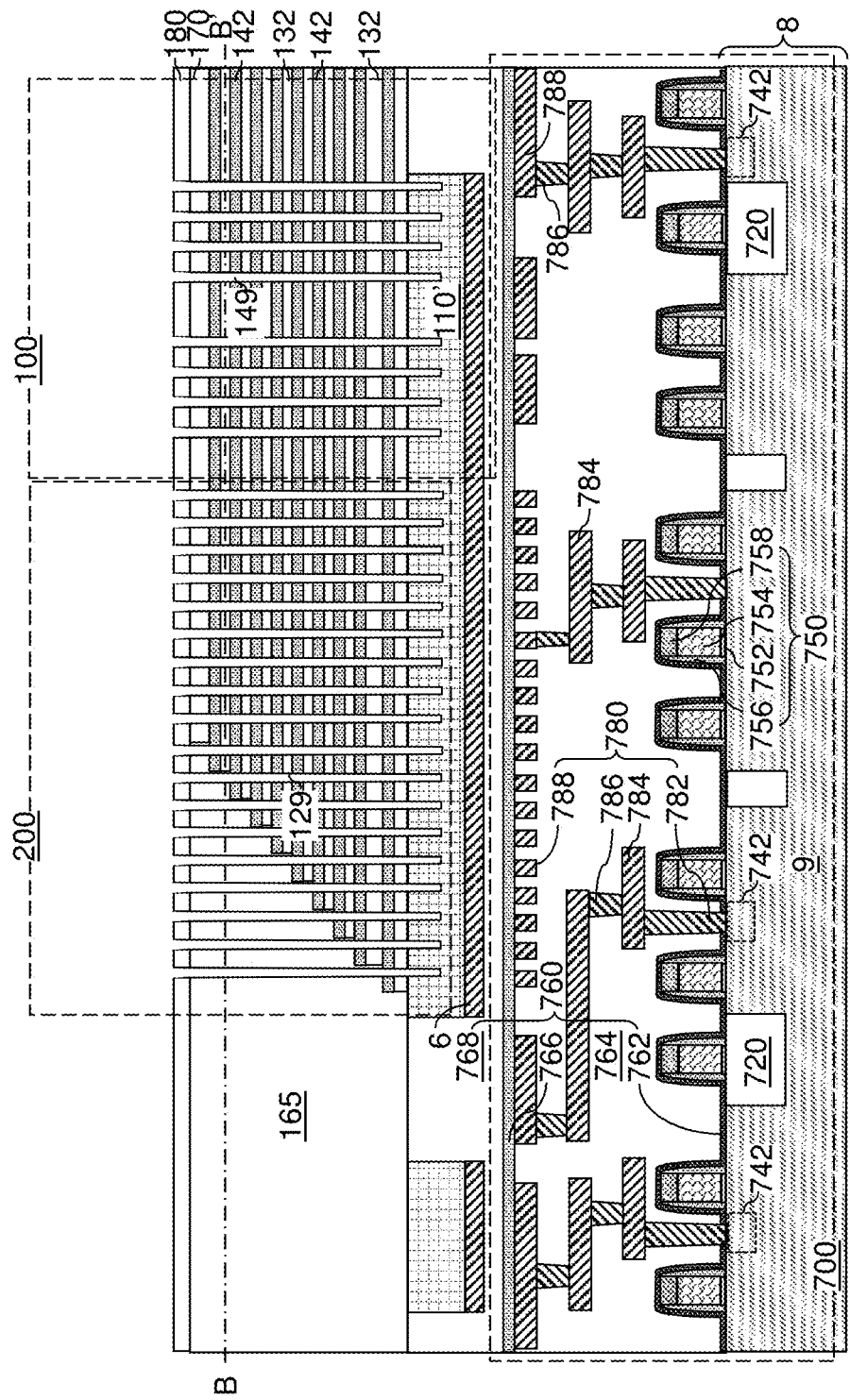
FIG. 4A is a vertical cross-sectional view of the exemplary structure after formation of first-tier memory openings and first-tier support openings according to an embodiment of the present disclosure.
Figure 4B:
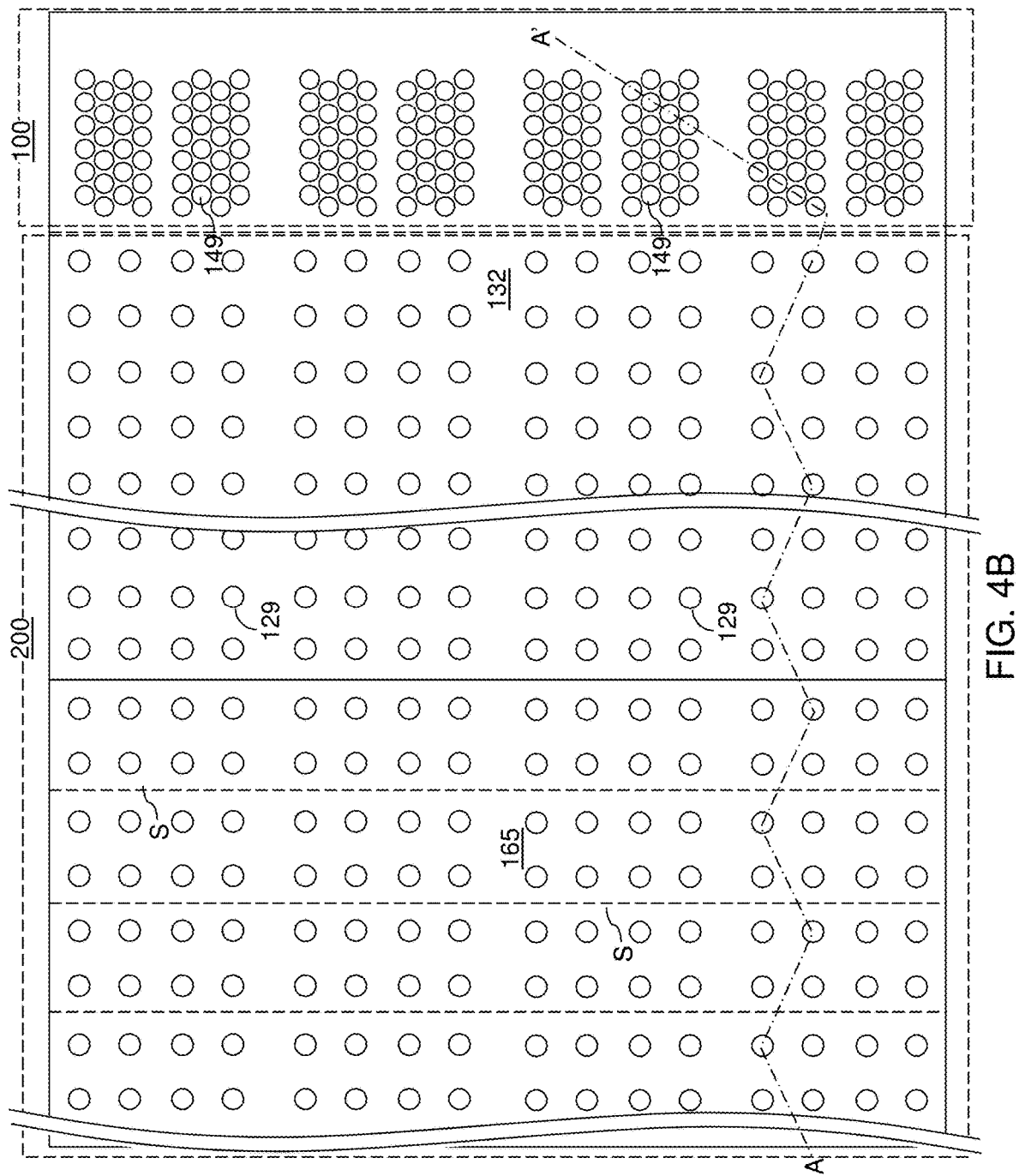
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129.

Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
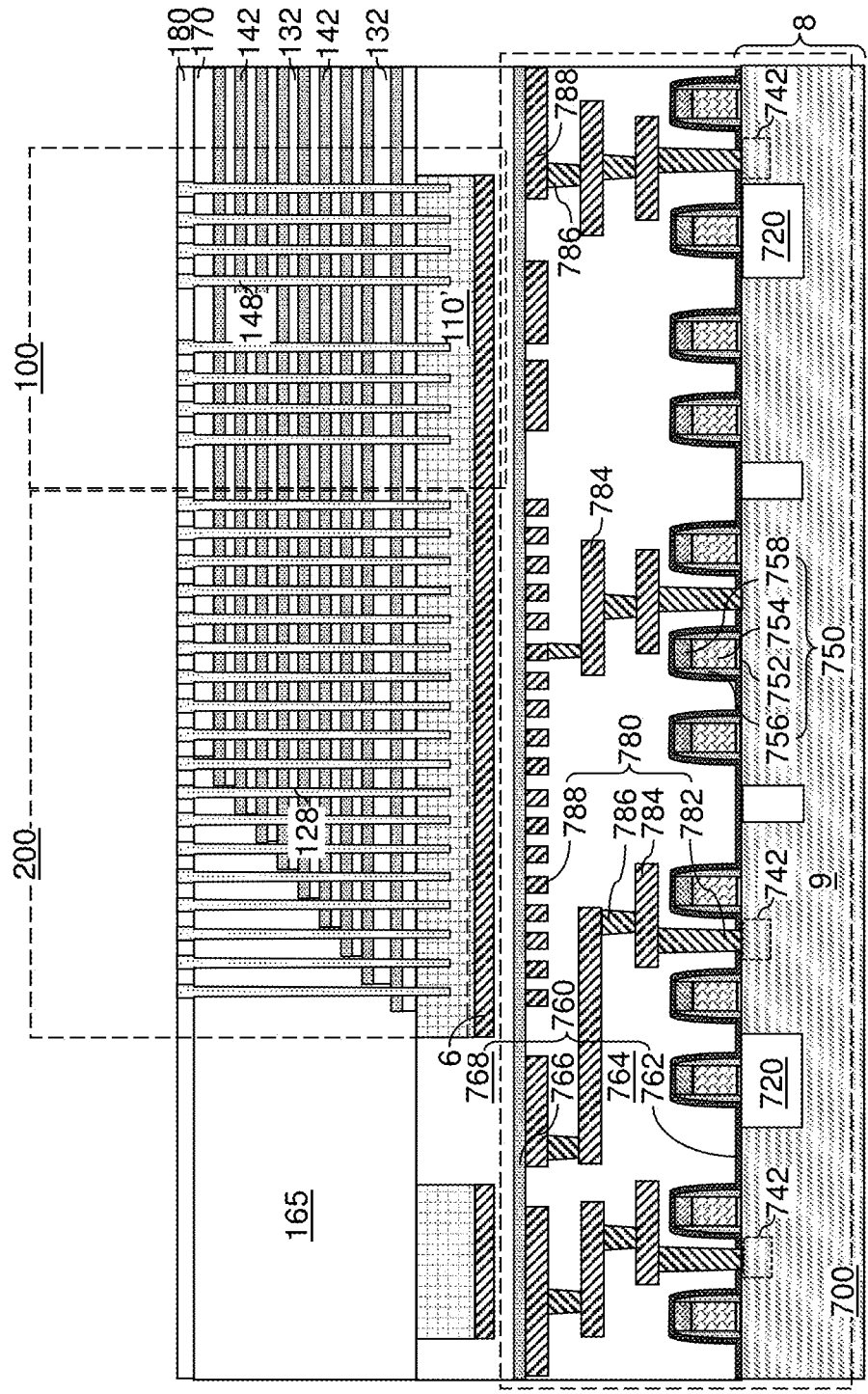
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128.

The various sacrificial first-tier opening fill portions (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
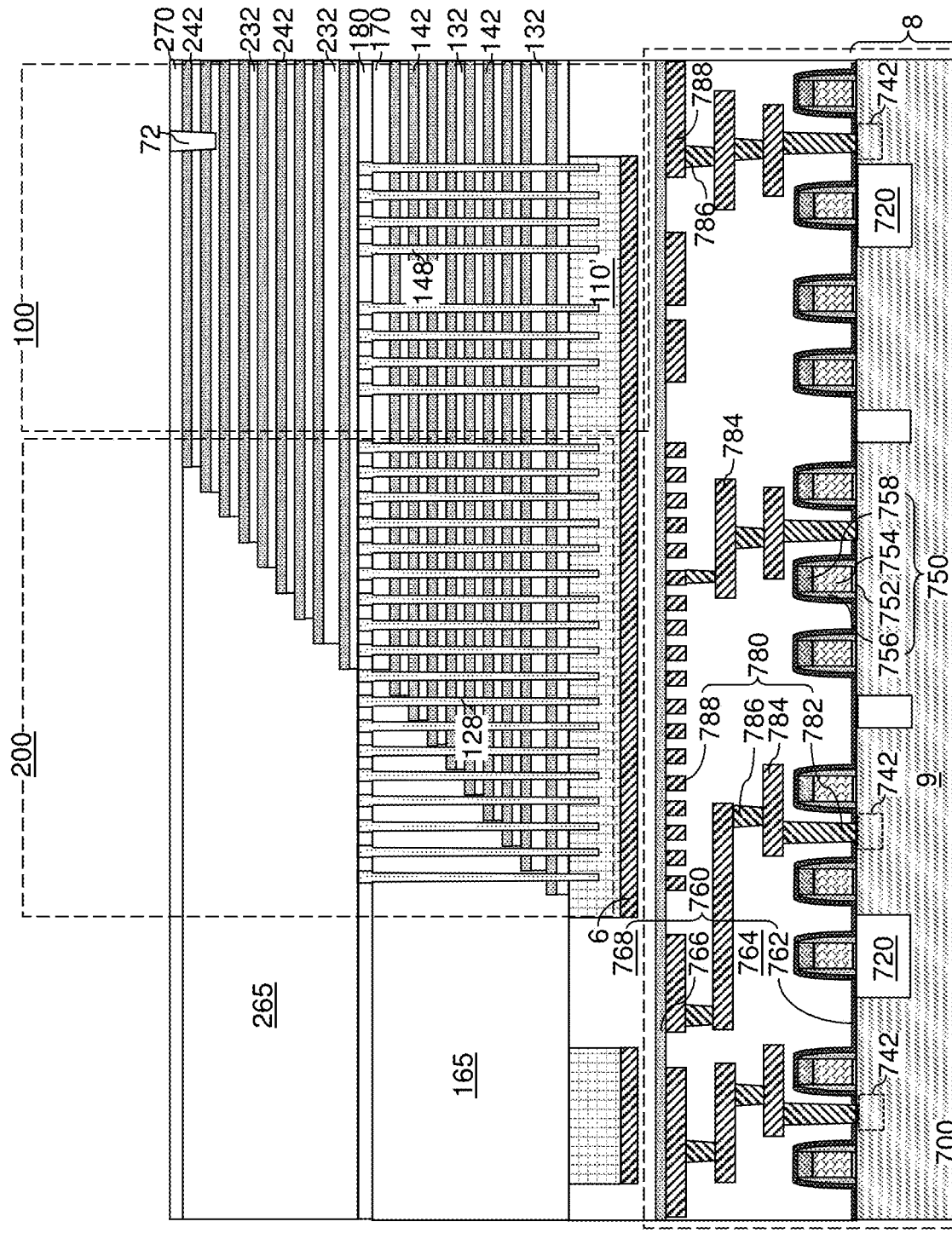
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
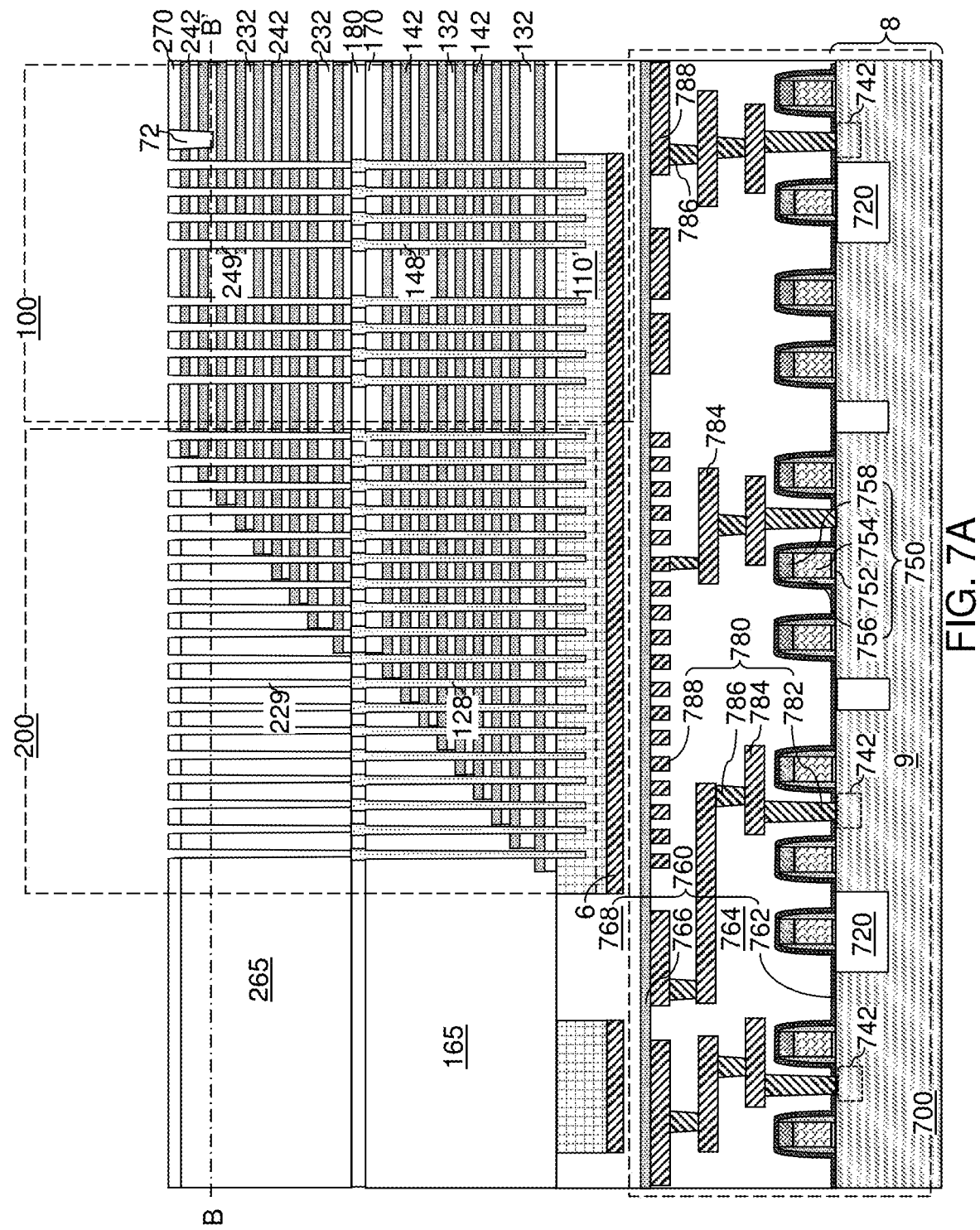
FIG. 7A is a vertical cross-sectional view of the exemplary structure after formation of second-tier memory openings and second-tier support openings according to an embodiment of the present disclosure.
Figure 7B:
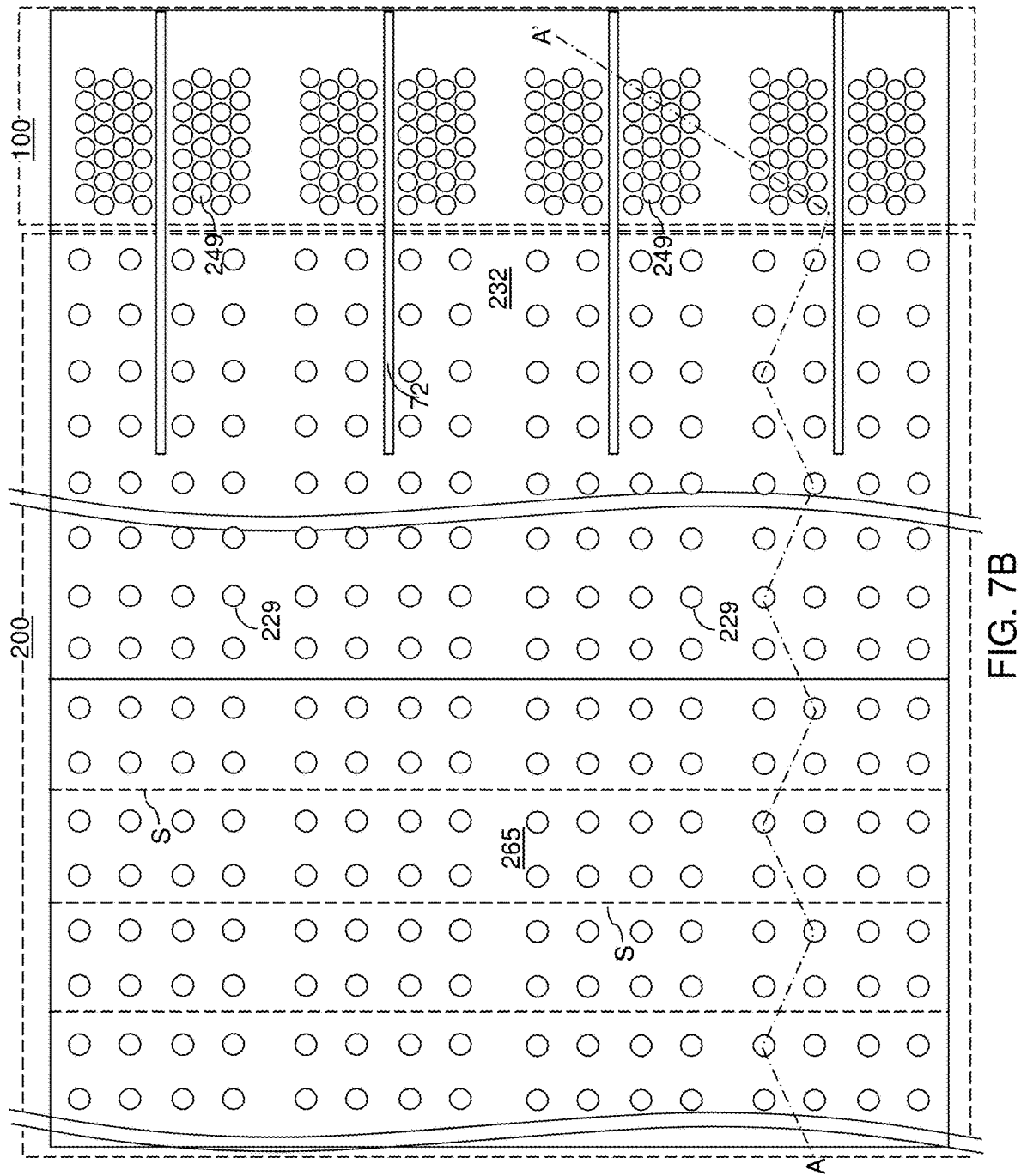
FIG. 7B is a horizontal cross-sectional view of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
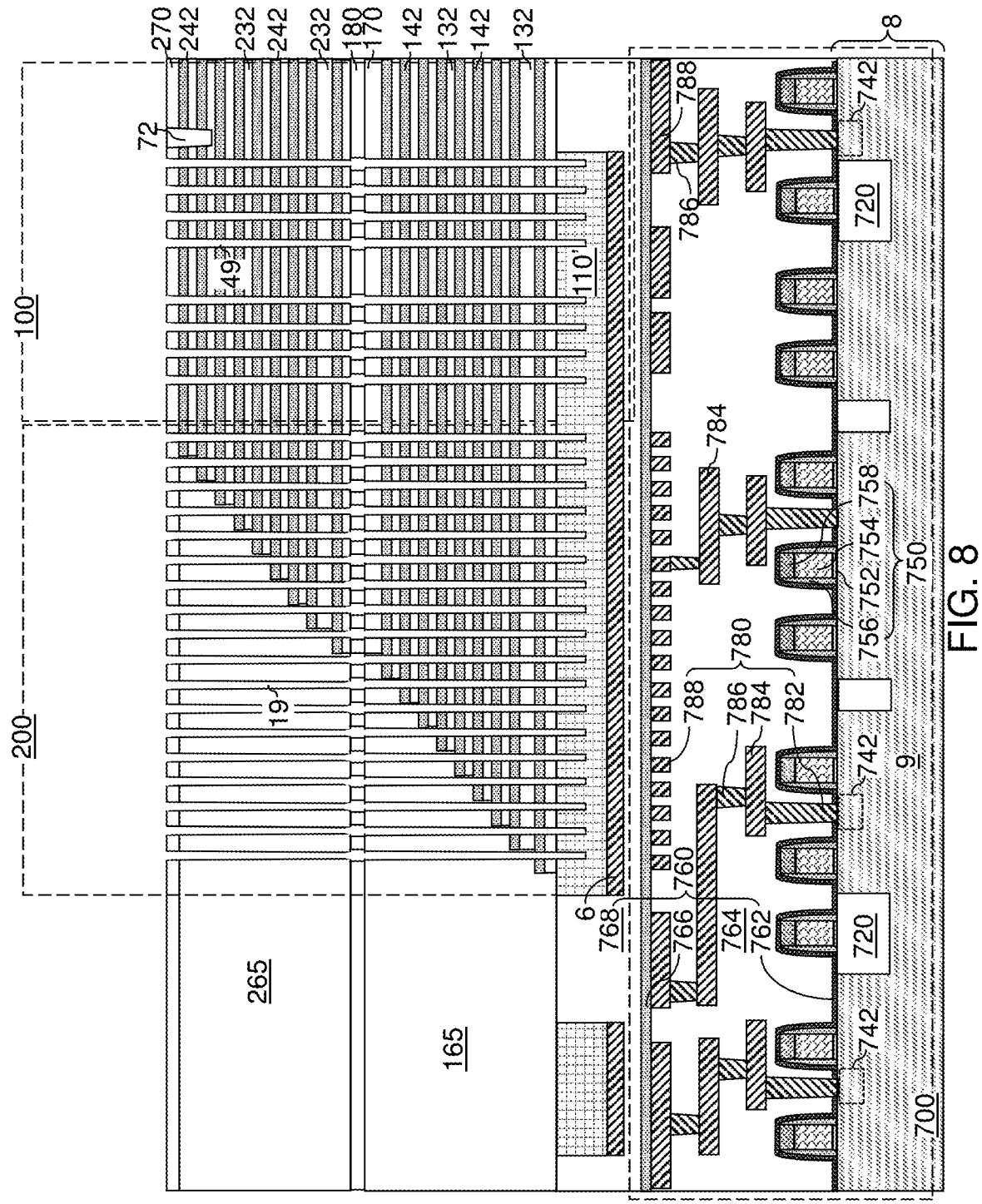
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a memory opening 49 in the first exemplary device structure of FIG. 8 is illustrated. The memory opening 49 extends through the first-tier structure and the second-tier structure.

Referring to FIG. 9B, at least one blocking dielectric layer (51, 52), a charge storage layer 54, and a tunneling dielectric layer 56 can be sequentially formed in each of the memory openings 49 and the support openings 19. In one embodiment, the at least one blocking dielectric layer (51, 52) may comprise a layer stack of an outer blocking dielectric layer 51 and an inner blocking dielectric layer 52. The outer blocking dielectric layer 51 can be formed directly on physically exposed surfaces of the insulating layers (132, 232) and sacrificial material layers (142, 242). The inner blocking dielectric layer 52 can have a different material composition than the outer blocking dielectric layer 51, and can be formed on the outer blocking dielectric layer 51.

In one embodiment, the outer blocking dielectric layer 51 may comprise a nitrogen containing silicon oxide layer or a silicon oxynitride layer. The outer blocking dielectric layer 51 may be formed by forming a silicon nitride layer in the memory opening followed by oxidizing the silicon nitride layer in an oxygen containing ambient by thermal or plasma oxidation. The thickness of the outer blocking dielectric layer 51 may be in a range from 1 nm to 20 nm, such as from 2 nm to 10 nm, although lesser and greater thicknesses may also be employed.

In one embodiment, the inner blocking dielectric layer 52 can be formed to provide an additional blocking dielectric material after formation of the outer blocking dielectric layer 51. In one embodiment, the inner blocking dielectric layer 52 can be formed by a conformal deposition process such as a chemical deposition process or an atomic layer deposition process. For example, the inner blocking dielectric layer 52 may be formed by atomic layer deposition. As such, the inner blocking dielectric layer 52 may comprise a lower nitrogen concentration than the outer blocking dielectric layer 51. The etch rate of the inner blocking dielectric layer 52 in buffered hydrofluoric acid, such as 100:1 dilute hydrofluoric acid, may be in a range from 1.5 times to 10 times higher than the etch rate of the outer blocking dielectric layer 51. The thickness of the inner blocking dielectric layer 52 may be in a range from 1 nm to 20 nm, such as from 2 nm to 10 nm, although lesser and greater thicknesses may also be employed.

The charge storage layer 54 may be formed on the at least one blocking dielectric layer (51, 52). In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the at least one blocking dielectric layer (51, 52), the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1 \times 10^{12}/cm^3$ to $1 \times 10^{18}/cm^3$, such as from $1 \times 10^{14}/cm^3$ to $1 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1 \times 10^{12}/cm^3$ to $1 \times 10^{18}/cm^3$, such as from $1 \times 10^{14}/cm^3$ to $1 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is present within each memory opening 49.

Figure 9D:
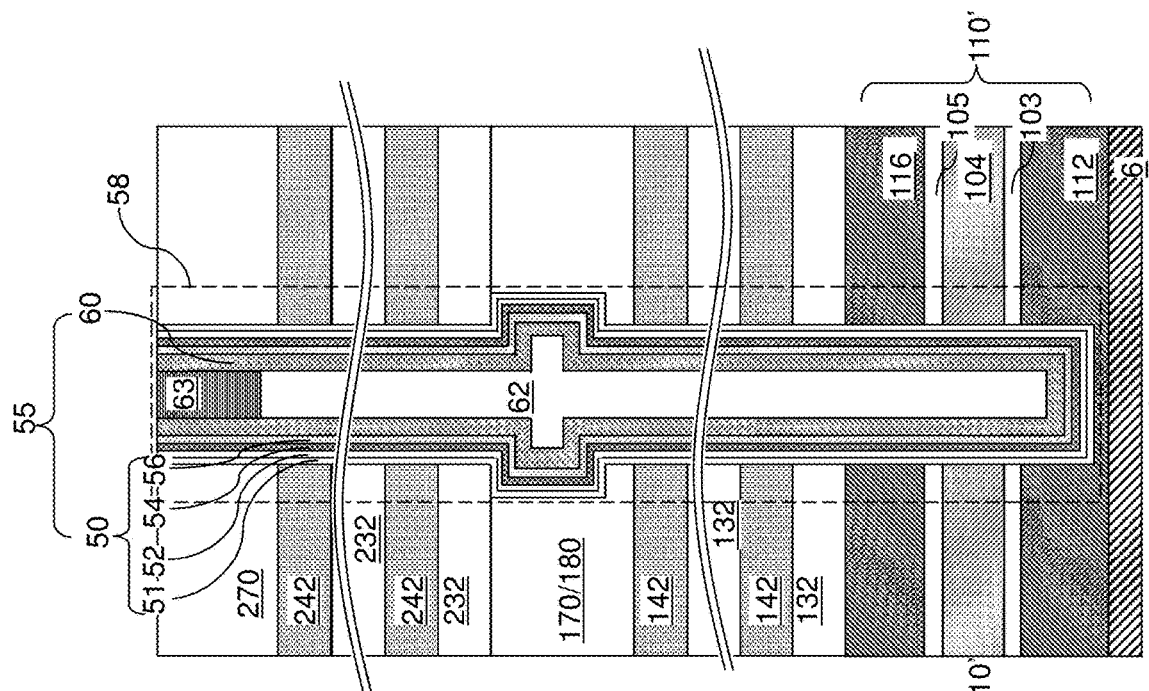
Figure 9C:
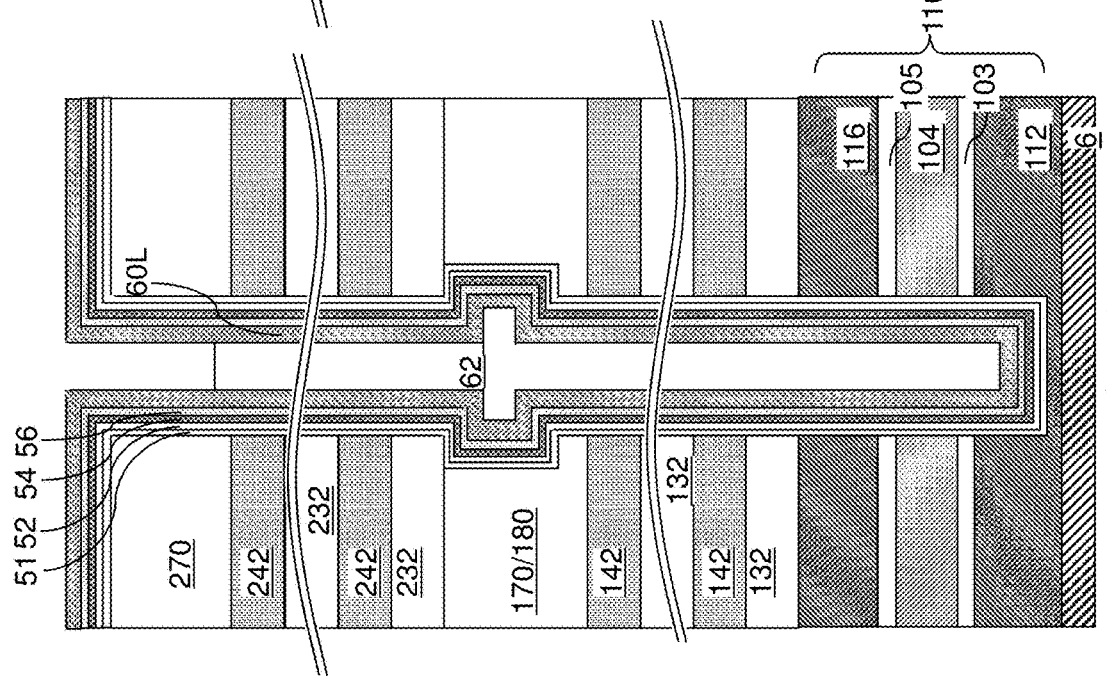

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the at least one blocking dielectric layer (51, 52) that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, the memory opening fill structures 58, and support pillar structures that are formed in the support openings 19 collectively constitute a memory-level assembly.

In one embodiment, the inner blocking dielectric layer 52 laterally surrounds the charge storage layer 54. The outer blocking dielectric layer 51 laterally surrounds the inner blocking dielectric layer 52.

Figure 10:
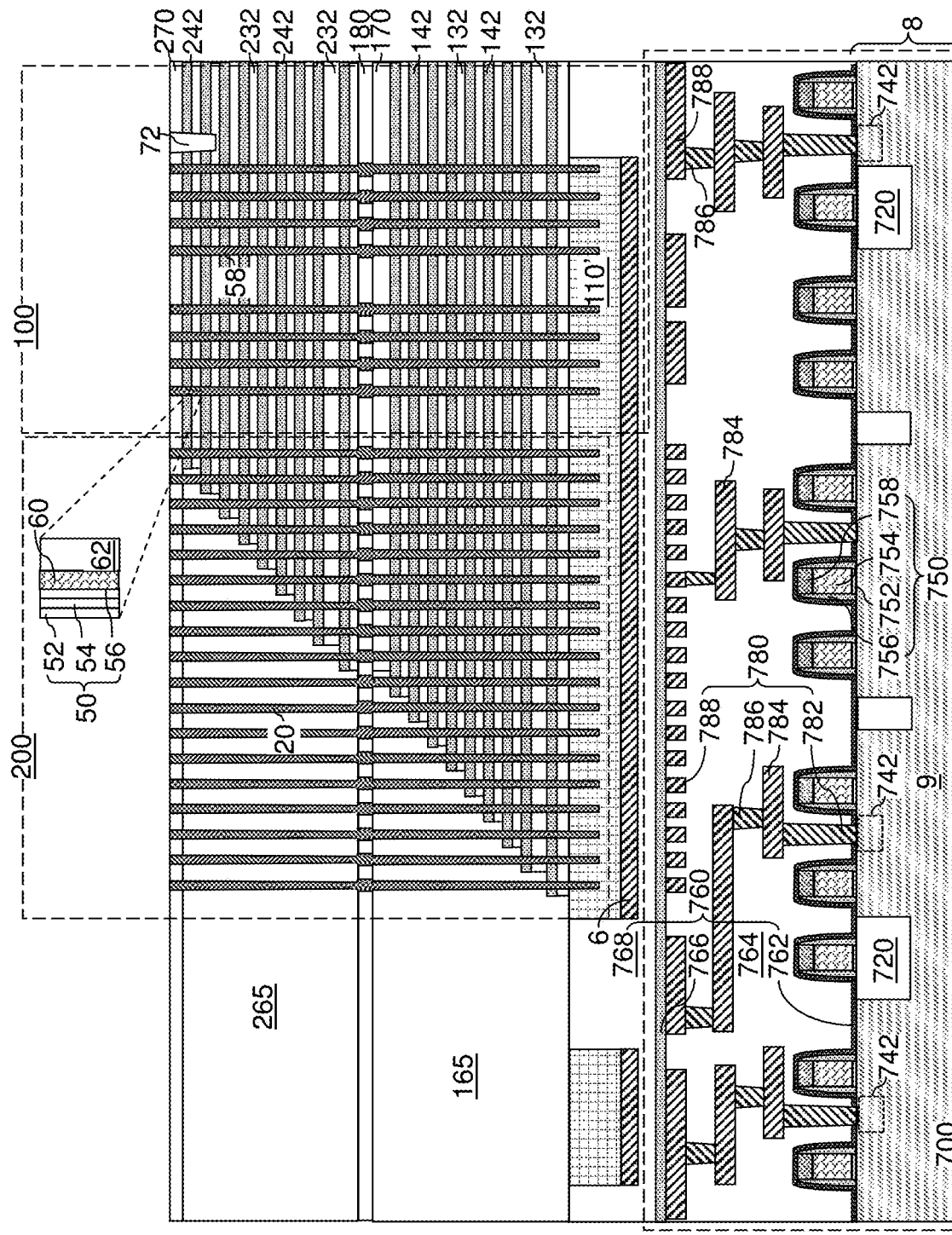
FIG. 10 is a vertical cross-sectional view of the exemplary structure after formation of memory opening fill structures and support pillar structures according to an embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
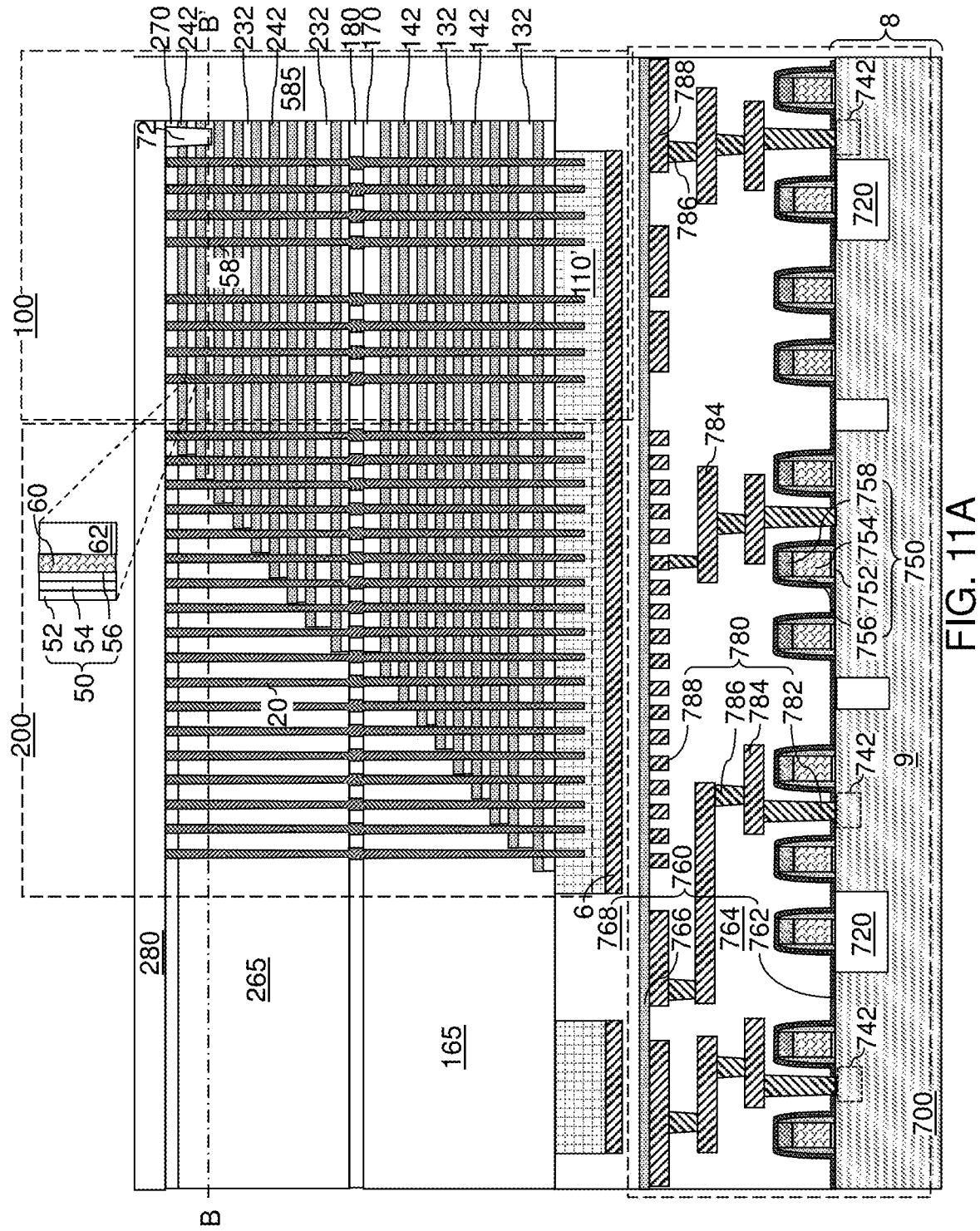
FIG. 11A is a vertical cross-sectional view of the exemplary structure after formation of pillar cavities according to an embodiment of the present disclosure.
Figure 11B:
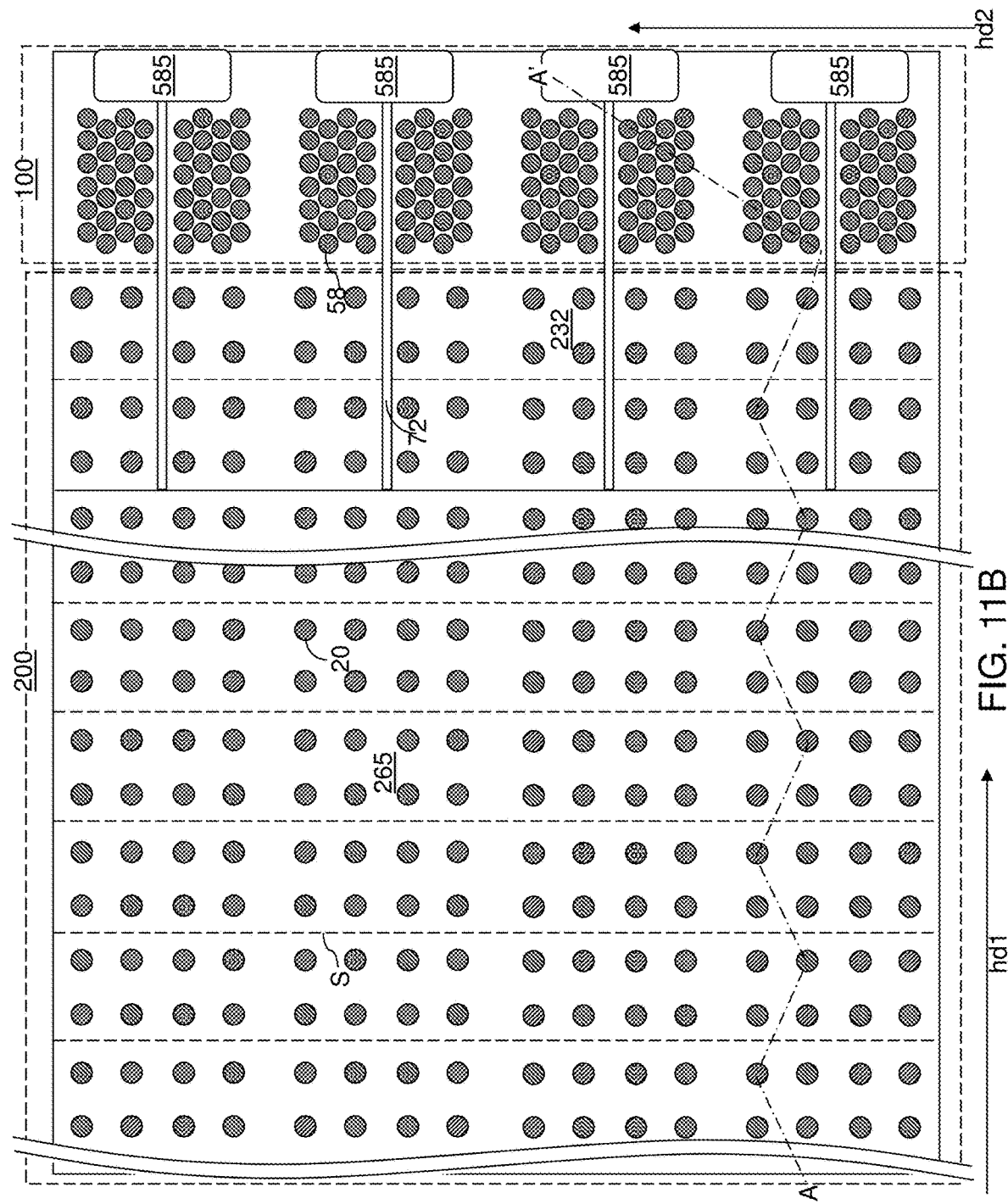
FIG. 11B is a horizontal cross-sectional view of the exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 12:
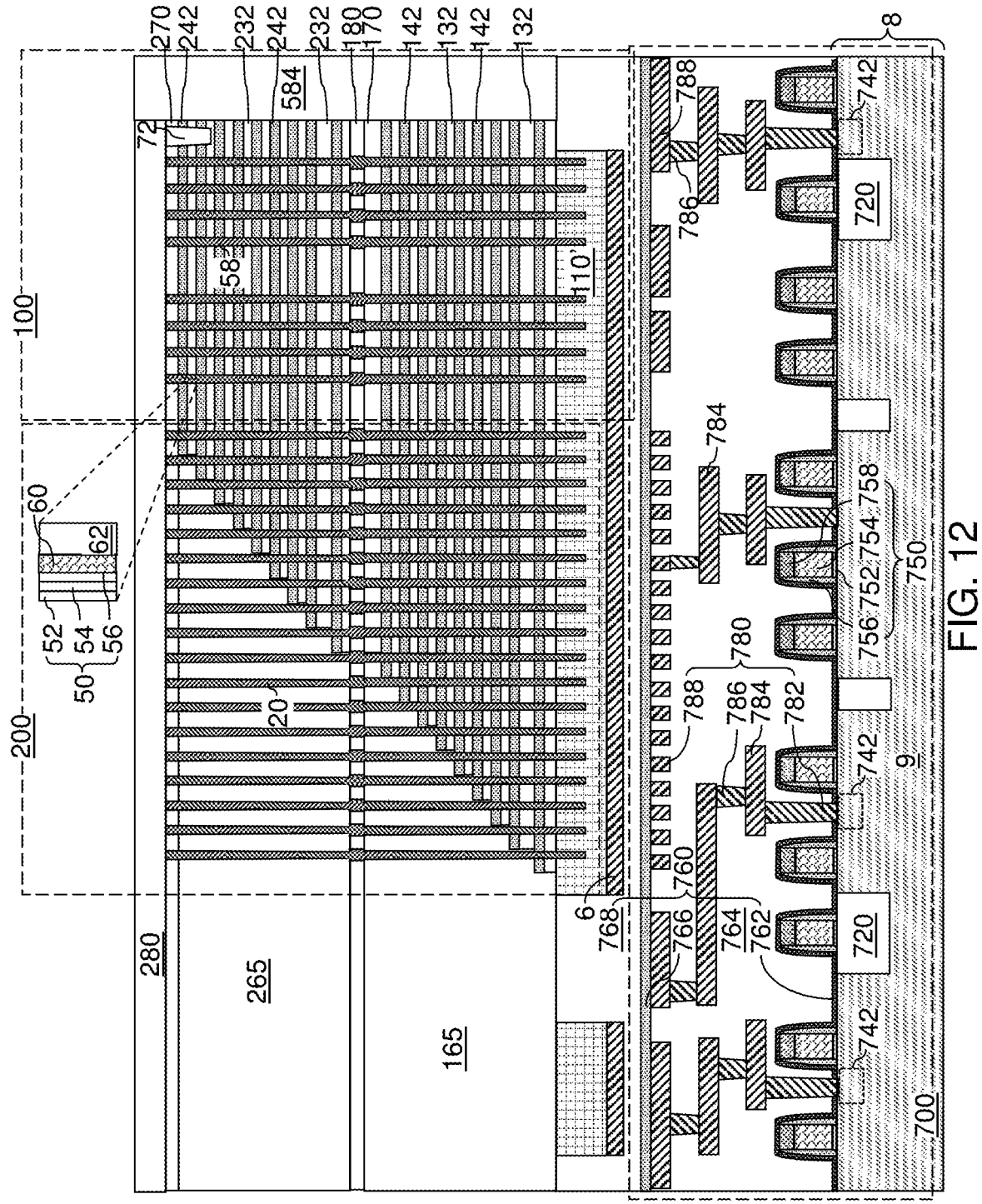
FIG. 12 is a vertical cross-sectional view of the exemplary structure after formation of dielectric pillar structures according to an embodiment of the present disclosure.

Referring to FIG. 12, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 13A:
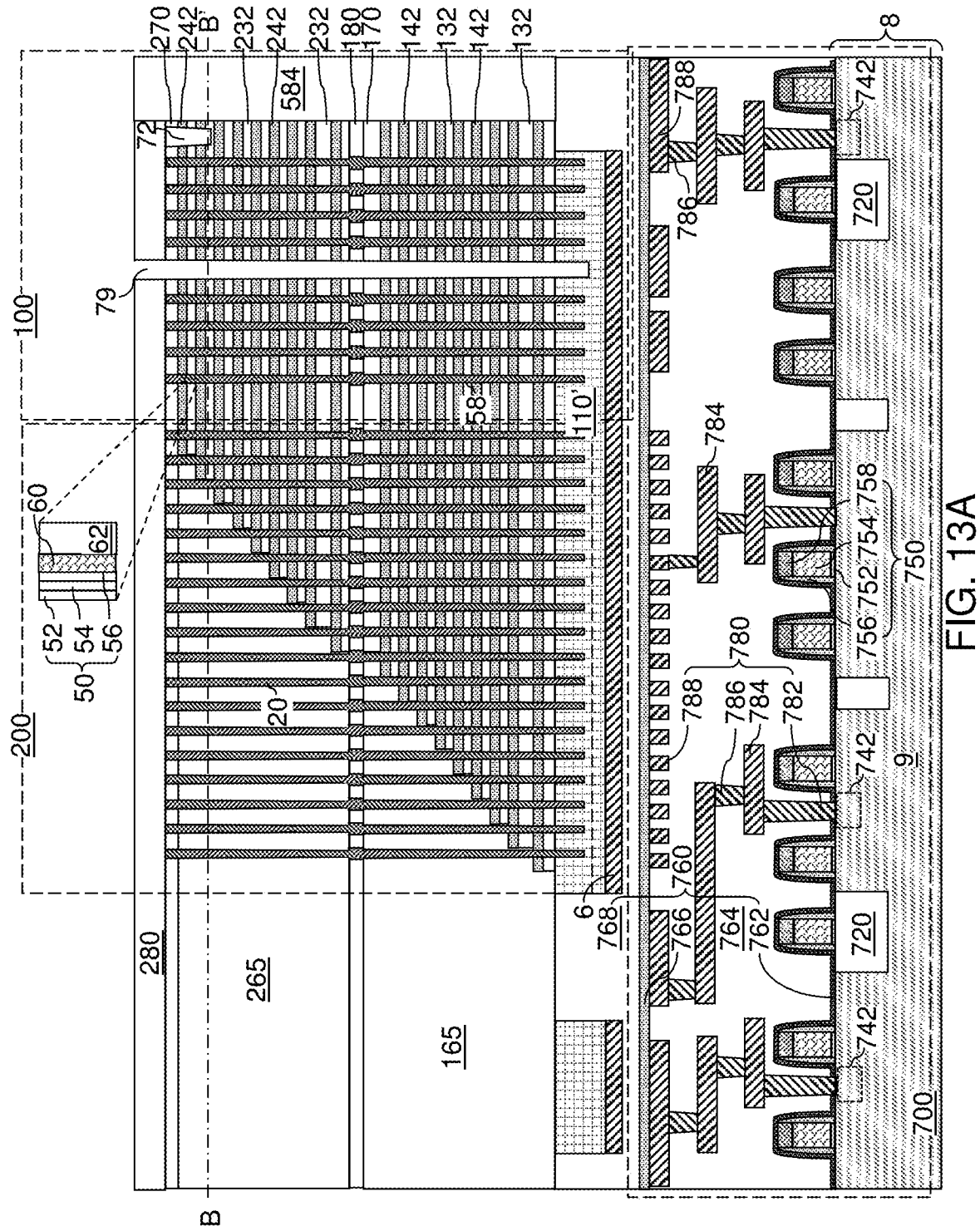
FIG. 13A is a vertical cross-sectional view of the exemplary structure after formation of a first contact-level dielectric layer and backside trenches according to an embodiment of the present disclosure.
Figure 13B:
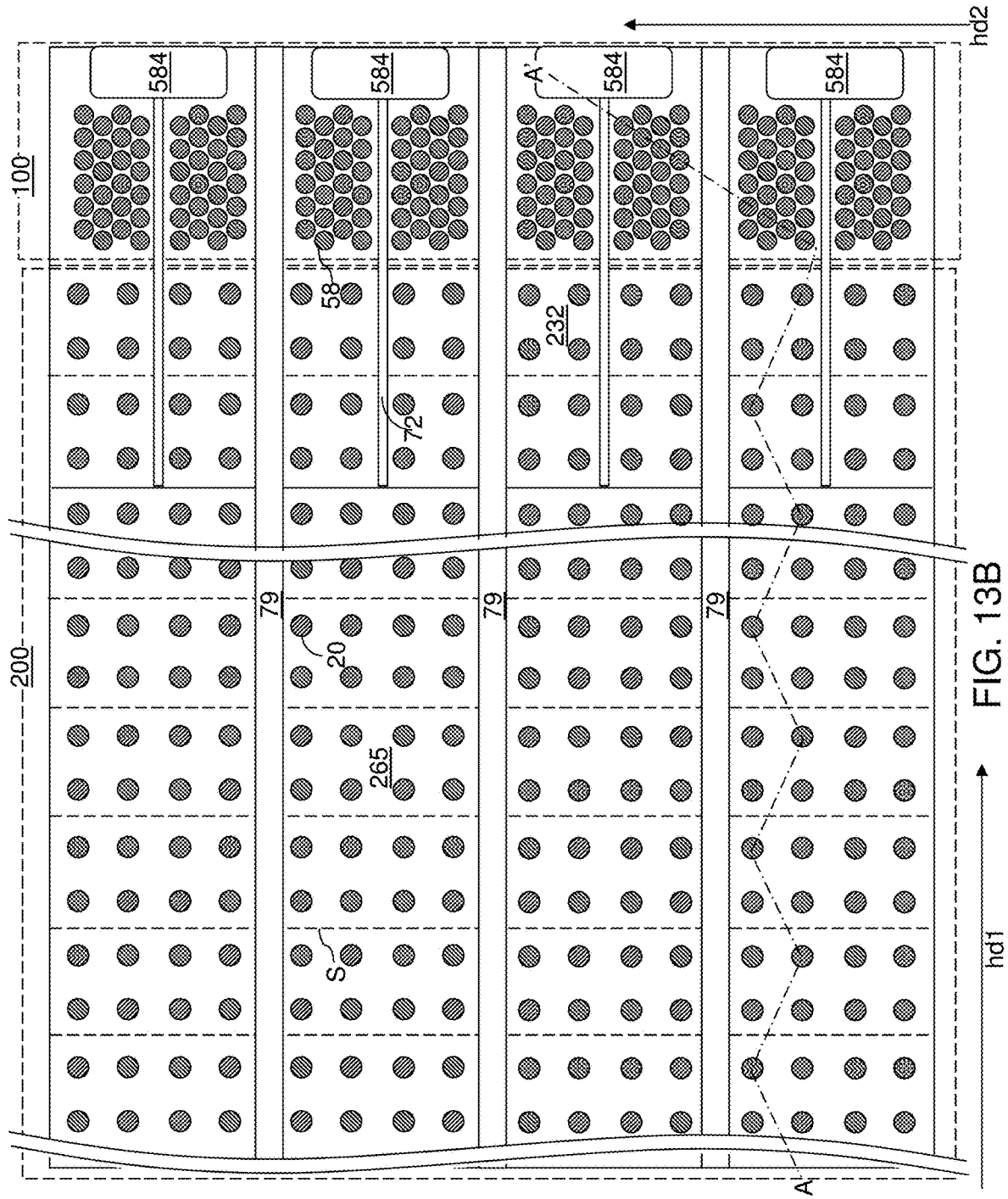
FIG. 13B is a horizontal cross-sectional view of the exemplary structure along the horizontal plane B-B' of FIG. 13A. The hinged vertical plane A-A' corresponds to the plane of the vertical cross-sectional view of FIG. 13A.
Figure 14A:
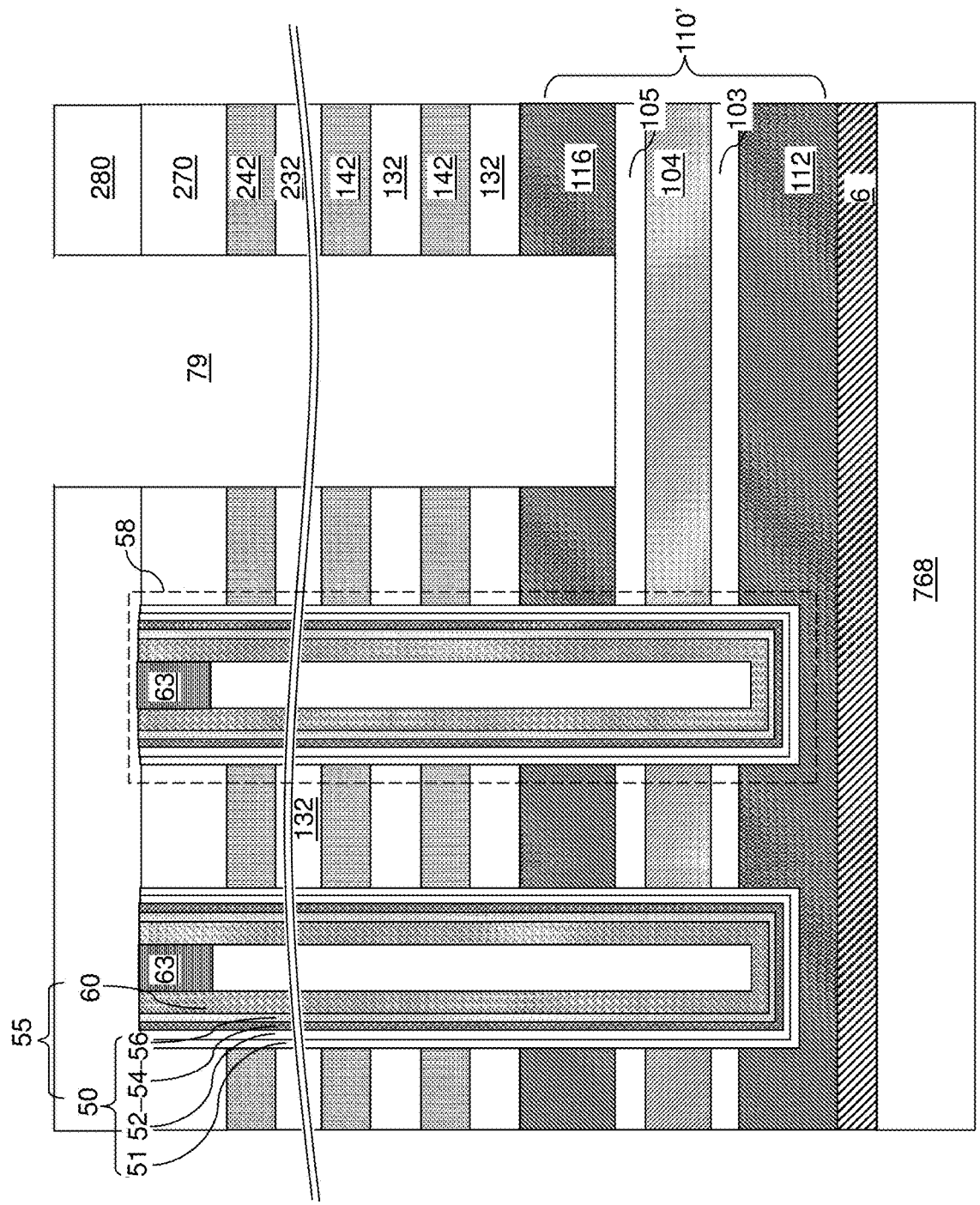
FIGS. 14A-14C illustrate sequential vertical cross-sectional views of memory opening fill structures and a backside trench during formation of backside trench spacers in the exemplary structure according to an embodiment of the present disclosure.

Referring to FIGS. 13A, 13B, and 14A, a photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level material layers 110' employing an anisotropic etch process. In one embodiment, the upper sacrificial liner 105 may be employed as an etch stop layer in a terminal portion of the anisotropic etch process. Portions of the first contact-level dielectric layer 280, the second-tier structure (232, 242, 270, 265, 72), the first-tier structure (132, 142, 170, 165), and the upper source-level semiconductor layer 116 that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 14B:
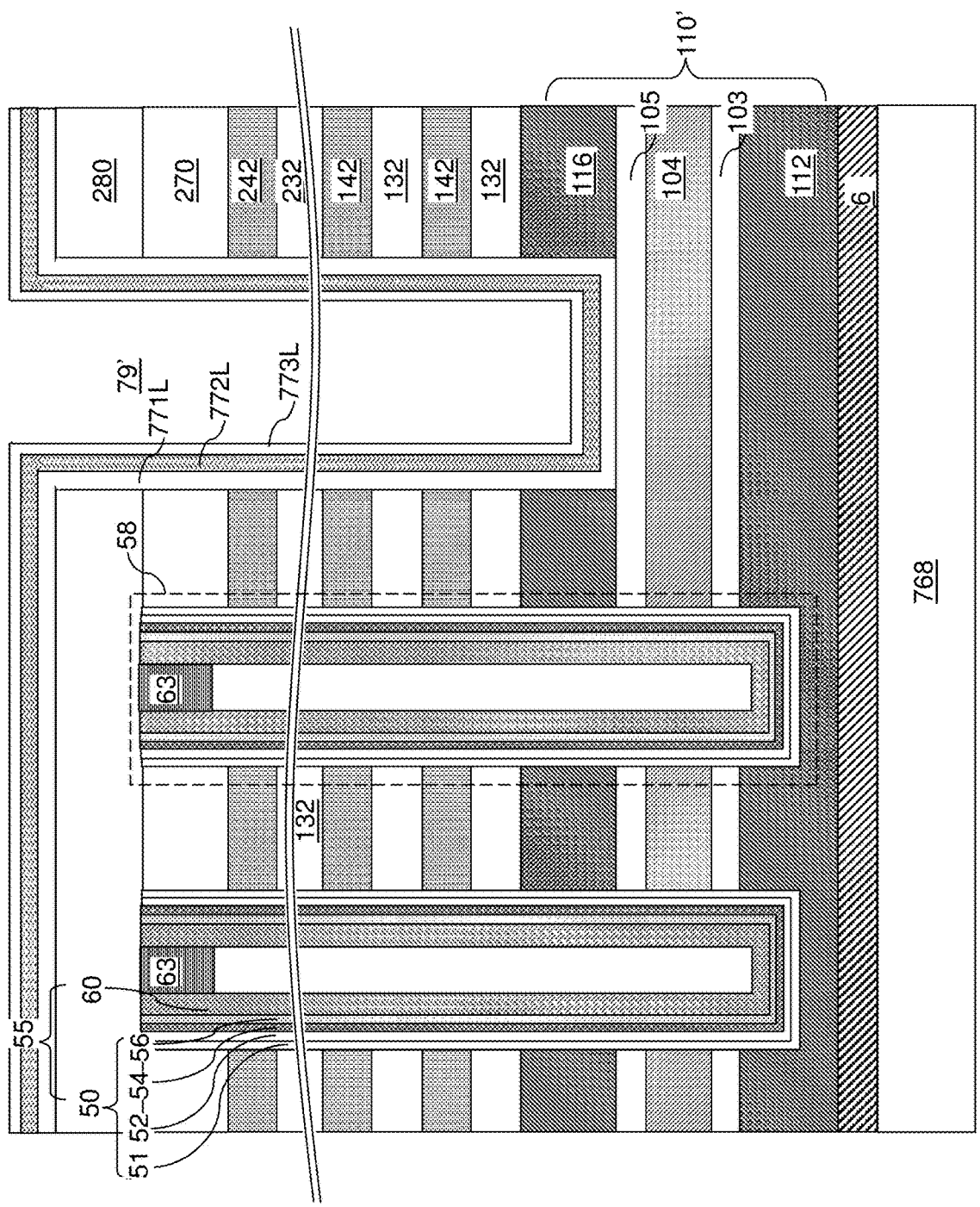

Referring to FIG. 14B, at least one spacer material layer (771L, 772L, 773L) may be deposited by a respective conformal deposition on physically exposed surfaces around each backside trench 79 and above the first contact-level dielectric layer 280. In an illustrative example, the at least one spacer material layer (771L, 772L, 773L) may comprise a first spacer material layer 771L including a first silicon dioxide material, a second spacer material layer 772L including an undoped (i.e., intrinsic) or low doped semiconductor material, such as intrinsic or low doped amorphous silicon, and a third spacer material layer 773L including a second silicon dioxide material. The undoped or low doped amorphous silicon of the second spacer material layer 772L may have a concentration of p-type or n-type dopants (e.g., boron, phosphorus and/or arsenic) of $1\times10^{17}/cm^3$ or less. In one embodiment, the first silicon dioxide material and the second silicon dioxide material may be silicon dioxide materials formed by thermal decomposition of tetraethylorthosilicate. The thickness of the first spacer material layer 771L may be in a range from 5 nm to 100 nm, such as from 10 nm to 50 nm, although lesser and greater thicknesses may also be employed. The thickness of the second spacer material layer 772L may be in a range from 5 nm to 100 nm, such as from 10 nm to 50 nm, although lesser and greater thicknesses may also be employed. The thickness of the third spacer material layer 773L may be in a range from 5 nm to 100 nm, such as from 10 nm to 50 nm, although lesser and greater thicknesses may also be employed. A backside cavity 79' including an unfilled void is present within each backside trench 79.

Figure 14C:
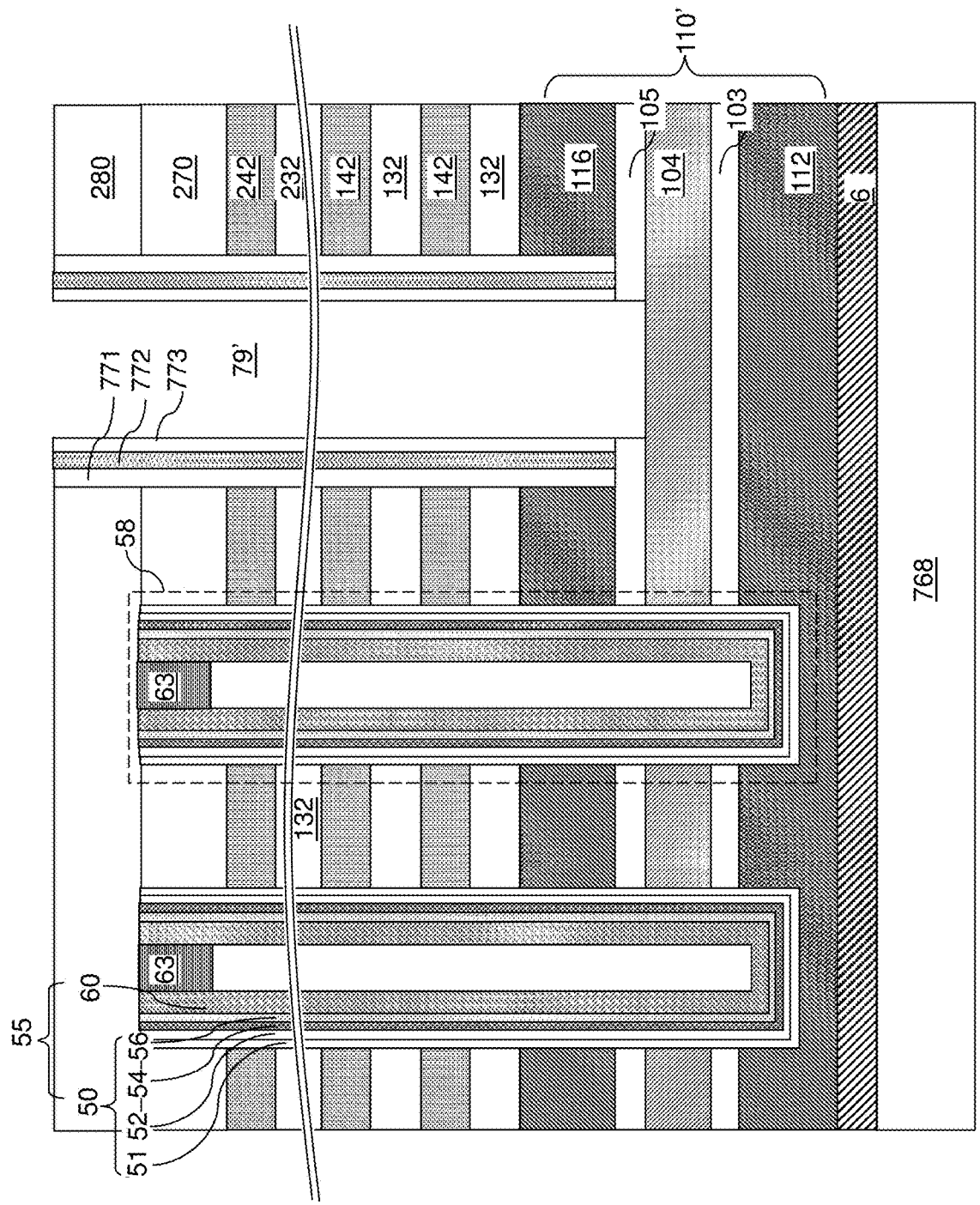

Referring to FIG. 14C, an anisotropic etch process can be performed to remove horizontally-extending portions of the at least one spacer material layer (771L, 772L, 773L) from above the first contact-level dielectric layer 280 and at the bottom of each backside trench 79. The anisotropic etch process may include multiple etch steps for sequentially etching the various layers within the at least one spacer material layer (771L, 772L, 773L). A terminal step of the anisotropic etch process may include an etch step for etching the material of the upper sacrificial liner 105. Alternatively, the portion of the upper sacrificial liner 105 at the bottom of each backside cavity 79' is etched together with the first spacer material layer 771L. A surface of the source-level sacrificial layer 104 may be physically exposed at the bottom of each backside cavity 79'.

Each remaining portion of the at least one spacer material layer (771L, 772L, 773L) may be located within a respective backside trench 79, and may have a respective tubular configuration. For example, each remaining portion of the first spacer material layer 771L located within a respective backside trench 79 constitutes a first backside trench spacer 771. Each remaining portion of the second spacer material layer 772L located within a respective backside trench 79 constitutes a second backside trench spacer 772. Each remaining portion of the third spacer material layer 773L located within a respective backside trench 79 constitutes a third backside trench spacer 773. The first backside trench spacers 771, the second backside trench spacers 772, and the third backside trench spacers 773 are collectively referred to as backside trench spacers (771, 772, 773). A set of backside trench spacers (771, 772, 773) may be formed at the periphery of each backside trench 79.

FIGS. 15A-15H illustrate sequential vertical cross-sectional views of memory opening fill structures 58 and a backside trench 79 during formation of source-level material layers 110 in the exemplary structure according to an embodiment of the present disclosure.

Figure 15A:
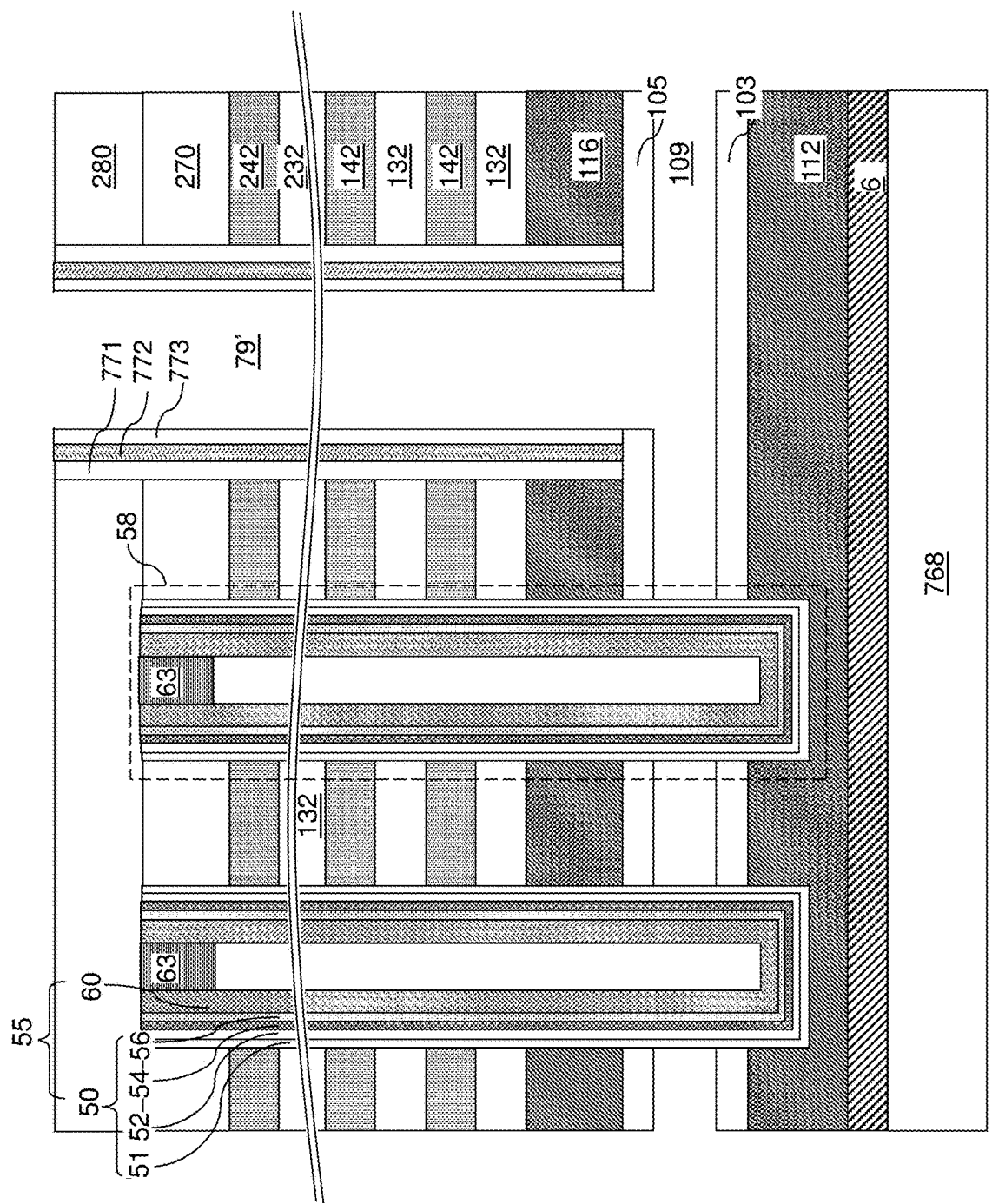
FIGS. 15A-15H illustrate sequential vertical cross-sectional views of memory opening fill structures and a backside trench during formation of source-level material layers in the exemplary structure according to an embodiment of the present disclosure.

Referring to FIG. 15A, a first isotropic etchant that etches the material of the source-level sacrificial layer 104 selective to the materials of the first-tier alternating stack (132, 142), the second-tier alternating stack (232, 242), the first and second insulating cap layers (170, 270), the first contact-level dielectric layer 280, the upper sacrificial liner 105, the lower sacrificial liner 103, and the blocking dielectric layers (51, 52) of the memory opening fill structures 58 may be introduced into the backside cavities 79' in an isotropic etch process. For example, if the source-level sacrificial layer 104 includes undoped amorphous silicon or an undoped amorphous silicon-germanium alloy, the third backside trench spacers 773, the upper and lower sacrificial liners (105, 103), and the blocking dielectric layers (51, 52) include silicon oxide, a wet etch process using hot trimethyl-2 hydroxyethyl ammonium hydroxide ("hot TMY") or tetramethyl ammonium hydroxide (TMAH) may be used as the first isotropic etchant to remove the source-level sacrificial layer 104 selective to the third backside trench spacers 773, the upper and lower sacrificial liners (105, 103), and the blocking dielectric layers (51, 52). A source cavity 109 is formed in the volume from which the source-level sacrificial layer 104 is removed. Generally, the source cavity 109 may be formed by removing the source-level sacrificial layer 104 selective to (i.e., without removing) the memory films 50, the lower source-level semiconductor layer 112, and the upper source-level semiconductor layer 116.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals, such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers (771, 772, 773) due to misalignment and/or misprocessing, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 15B:
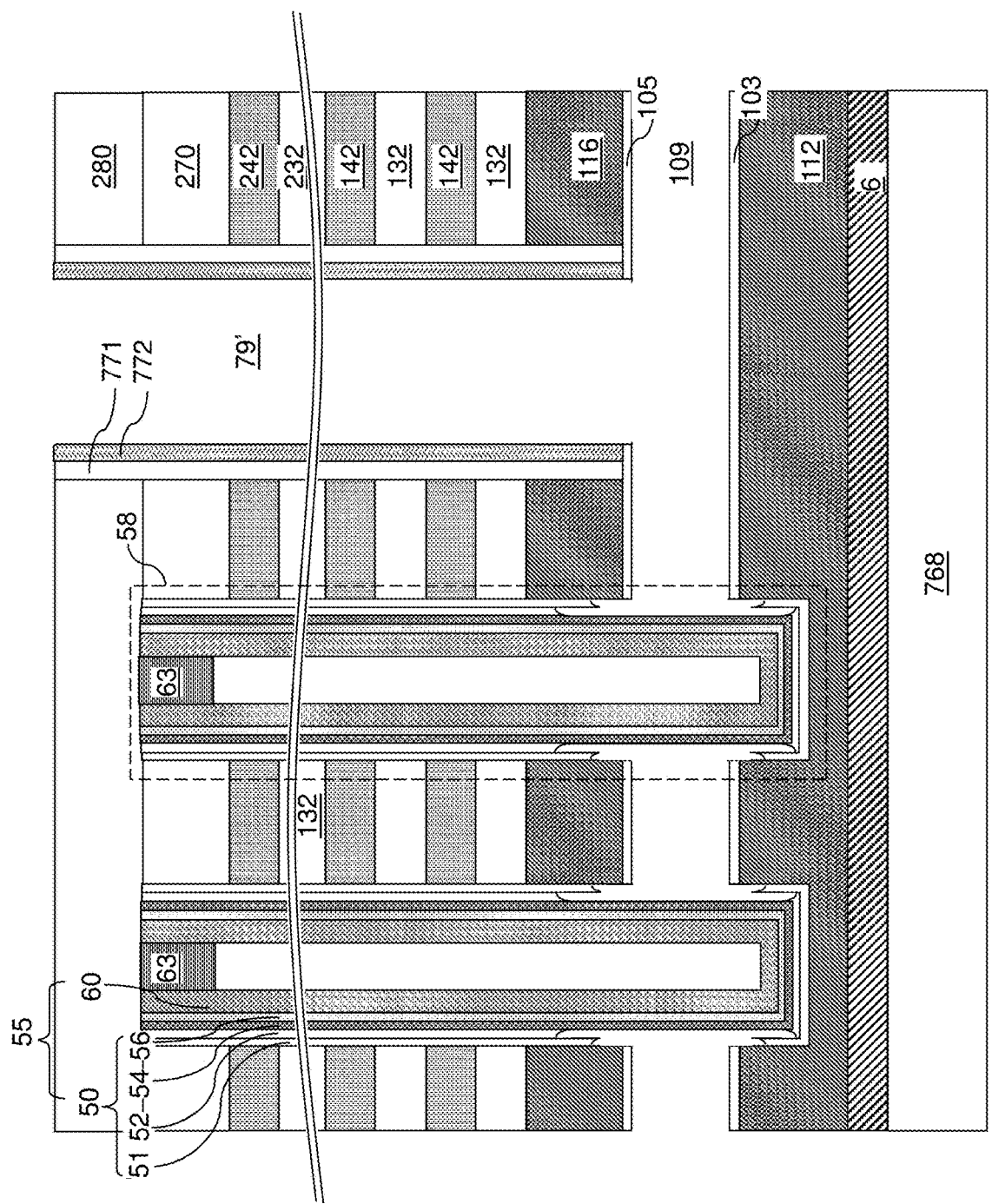

Referring to FIG. 15B, a first isotropic etch process can be performed to etch the at least one blocking dielectric layer (51, 52) selective to the charge storage layer 54. For example, the at least one blocking dielectric layer (51, 52) can comprise silicon oxide and/or oxynitride materials, and the charge storage layer 54 can comprise a dielectric charge trapping material, such as silicon nitride. The first isotropic etch process may comprise a buffered hydrofluoric acid wet etch or a chemical dry etch. In one embodiment, the at least one blocking dielectric layer (51, 52) comprises an inner blocking dielectric layer 52 laterally surrounding and contacting the charge storage layer 54, and an outer blocking dielectric layer 51 laterally surrounding the inner blocking dielectric layer 52. In one embodiment, the inner blocking dielectric layer 52 has a higher etch rate in dilute hydrofluoric acid or in chemical dry etch than the outer blocking dielectric layer 51. In one embodiment, the outer blocking dielectric layer 51 comprises a first silicon oxide or oxynitride material having a higher nitrogen concentration than the inner blocking dielectric layer 52 which comprises a second silicon oxide material.

The first isotropic etch process isotropically etches and recesses portions of each memory film 50 that are proximal to the source cavity 109. The duration of the first isotropic etch process can be selected such that the at least one blocking dielectric layer (51, 52) is etched through, and a cylindrical surface segment of the outer sidewall of each charge storage layer 54 is a physically exposed. Due to isotropic etching of the materials of the outer blocking dielectric layer 51 and the inner blocking dielectric layer 52, cylindrical openings therethrough the outer blocking dielectric layer 51 and the inner blocking dielectric layer 52 may have vertical extents that are greater than the vertical extent of the source cavity 109 between the upper and lower sacrificial liners (105, 103) (if present). The source cavity 109 extends in volume around each of the memory opening fill structures 58. Remaining portions of the outer blocking dielectric layer 51 and the inner blocking dielectric layer 52 may have a respective concave tapered annular surface that is exposed to the source cavity 109.

In one embodiment, the duration of the first isotropic etch process can be selected such that the third backside trench spacer 773 is removed from within each backside trench 79, while the upper and lower sacrificial liners (105, 103) are partially but not completely etched. In other words, remaining portions of the upper and lower sacrificial liners (105, 103) may cover the bottom surface of the upper source-level semiconductor layer 116 and the top surface of the lower source-level semiconductor layer 112. Alternatively, the upper and lower sacrificial liners (105, 103) may be completely removed together with the third backside trench spacer 773.

In one embodiment, the etch rate of the material of the inner blocking dielectric layer 52 is greater than the etch rate of the material of the outer blocking dielectric layer 51, and the vertical extent of a cylindrical opening through the inner blocking dielectric layer 52 is greater than the vertical extent of a cylindrical opening through the outer blocking dielectric layer 51 within each memory opening fill structure 58. Excessive etching of the material of the inner blocking dielectric layers 52 increases the area of the physically exposed surface segments of the charge storage layers 54, and may lead to undesirable electrical interference (e.g., leakage current and/or breakdown of the exposed portion of the outer blocking dielectric layer 51) between a source contact layer to be subsequently formed in the source cavity 109 and a bottommost electrically conductive layer to be subsequently formed within a volume of a bottommost first sacrificial material layer 142.

Figure 15C:
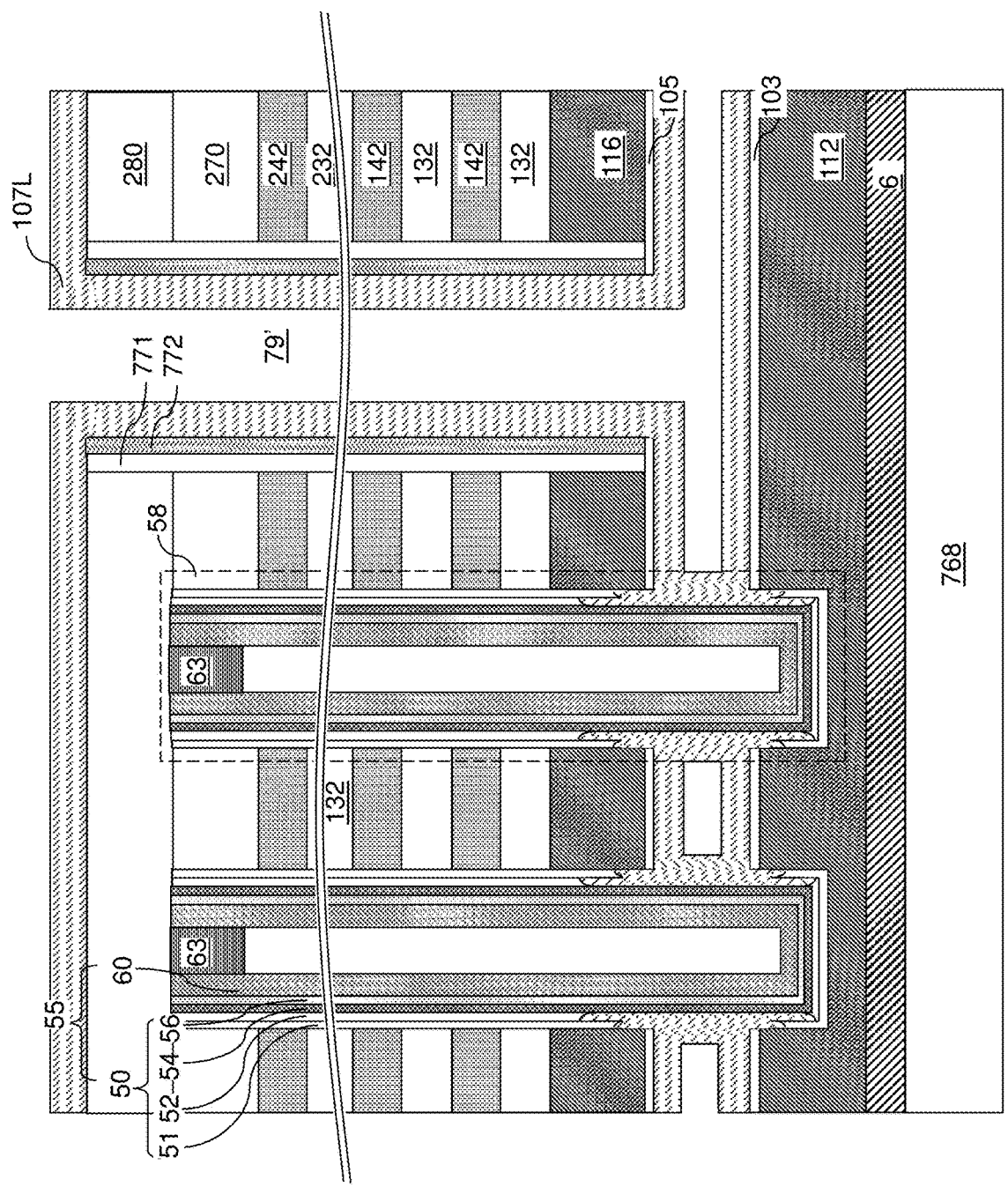

Referring to FIG. 15C, a semiconductor fill material can be conformally deposited in peripheral portions of the source cavity 109, in peripheral portions of the backside trenches 79, and over the first contact-level dielectric layer 280 to form a semiconductor fill material layer 107L. The semiconductor fill material may comprise an amorphous semiconductor fill material such as amorphous silicon. The amorphous silicon may be undoped or low doped (e.g., having a concentration of p-type or n-type dopants less than $1 \times 10^{17}/cm^3$). The semiconductor fill material is deposited directly on recessed surfaces of the at least one blocking dielectric layer (51, 52) and directly on a cylindrical surface segment of the charge storage layer 54 in each memory opening fill structure 58.

In one embodiment, the thickness of the semiconductor fill material layer 107L is less than one half of the height of the source cavity 109, and is less than one half of the minimum width of each backside cavity 79' as provided at the processing steps of FIG. 15B. Further, the thickness of the semiconductor fill material layer 107L can be greater than one half of the thickness of the at least one blocking dielectric layer (51, 52), i.e., the sum of the thickness of the outer blocking dielectric layer 51 and the thickness of the inner blocking dielectric layer 52. In one embodiment, the thickness of the semiconductor fill material layer 107L may be in a range from 5 nm to 30 nm, such as from 10 nm to 20 nm, although lesser and greater thicknesses may also be employed. In one embodiment, a void is present within the source cavity 109, and a void (i.e., a backside cavity 79') is present within each backside trench 79. The entire volume of the portions of the at least one blocking dielectric layer (51, 52) removed by the first isotropic etch process at the processing steps of FIG. 15B is filled with the semiconductor fill material layer 107L.

Figure 15D:
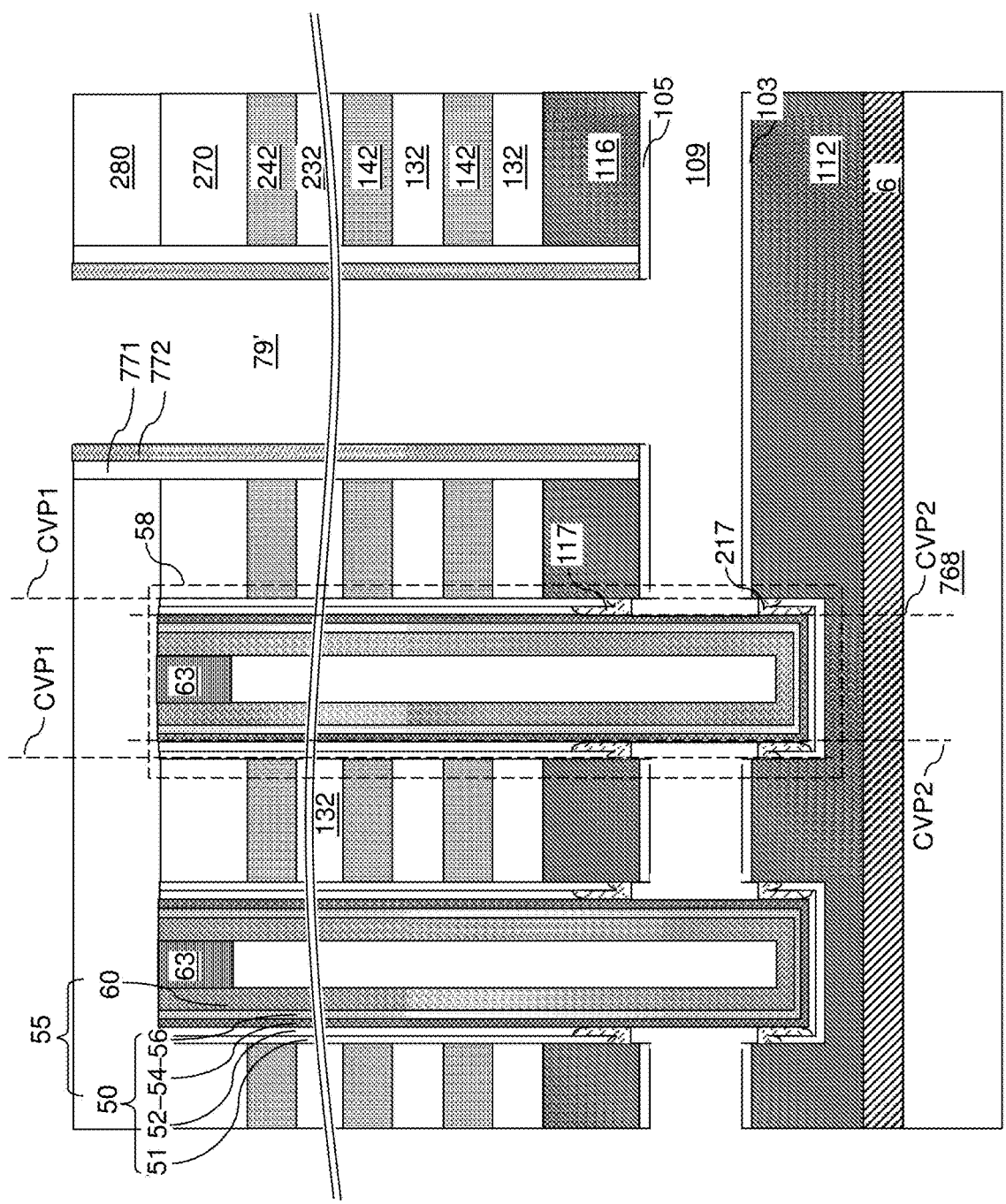

Referring to FIG. 15D, an isotropic etch back process can be performed to isotropically recess the semiconductor fill material layer 107L. The etch back may use TMY as the etchant. Portions of the semiconductor fill material layer 107L located above the first contact-level dielectric layer 280, located within the second backside trench spacers 772, or located between the upper sacrificial liner 105 and the lower sacrificial liner 103 (if present, or between the upper and the lower source-level semiconductor layers (116, 112)) can be isotropically etched back by the isotropic etch back process. The duration of the isotropic etch process can be selected such that annular portions of the semiconductor fill material layer 107L that contact a respective charge storage layer 54, and are located above the horizontal plane including the top surface of the upper sacrificial liner 105 or below the horizontal plane including the bottom surface of the lower sacrificial liner 103 (if present or between the planes of layers 112 and 116) are not removed. If the sacrificial liners 103, 105 are not present at this step, then the isotropic etch may be a selective etch which selectively etches the undoped or low doped amorphous silicon material of layer 107L selective to the doped polysilicon material of layers 112 and 116. Each annular portion of the semiconductor fill material layer 107L that contacts a respective charge storage layer 54 and is a located above the horizontal plane including the top surface of the upper sacrificial liner 105 (if present, or bottom surface of layer 116) constitutes a first annular semiconductor cap 117. Each annular portion of the semiconductor fill material layer 107L that contacts a respective charge storage layer 54 and is a located below the horizontal plane including the bottom surface of the lower sacrificial liner 103 (if present, or top surface of layer 112) constitutes a second annular semiconductor cap 217. The second backside trench spacers 772 may optionally be removed during the isotropic etch back process or portions thereof may remain.

Generally, a remaining portion of the semiconductor fill material around a memory opening fill structure 58 comprises a first annular semiconductor cap 117 contacting a cylindrical surface segment of the upper source-level semiconductor layer 116 and laterally surrounding and contacting the memory film 50. Another remaining portion of the semiconductor fill material around the memory opening fill structure 58 comprises a second annular semiconductor cap 217 contacting a cylindrical surface segment of the lower source-level semiconductor layer 112 and laterally surrounding and contacting the memory film 50. The first annular semiconductor caps 117 and the second annular semiconductor caps 217 have a respective tubular configuration, and comprise a respective inner cylindrical sidewall and a respective outer cylindrical sidewall. The inner cylindrical sidewall of each of the first and second annular semiconductor caps (117, 217) contacts a respective outer cylindrical surface segment of a charge storage layer 54. The outer cylindrical sidewall of each of the first annular semiconductor caps 117 contacts a respective cylindrical surface segment of the upper source-level semiconductor layer 116. The outer cylindrical sidewall of each of the second annular semiconductor caps 217 contacts a respective cylindrical surface segment of the lower source-level semiconductor layer 112. A cylindrical surface segment of an outer sidewall of each charge storage layer 54 can be physically exposed to the source cavity 109.

The first and second annular semiconductor caps (117, 217) are self-aligned to the memory film 50. Specifically, the first and second annular semiconductor caps (117, 217) are located entirely within between a first cylindrical vertical plane CVP1 including the outer sidewall of the outer blocking dielectric layer 51 and a second cylindrical vertical plane CVP2 including the inner sidewall of the inner blocking dielectric layer 52. The first and second annular semiconductor caps (117, 217) may comprise undoped or low doped amorphous silicon.

Figure 15E:
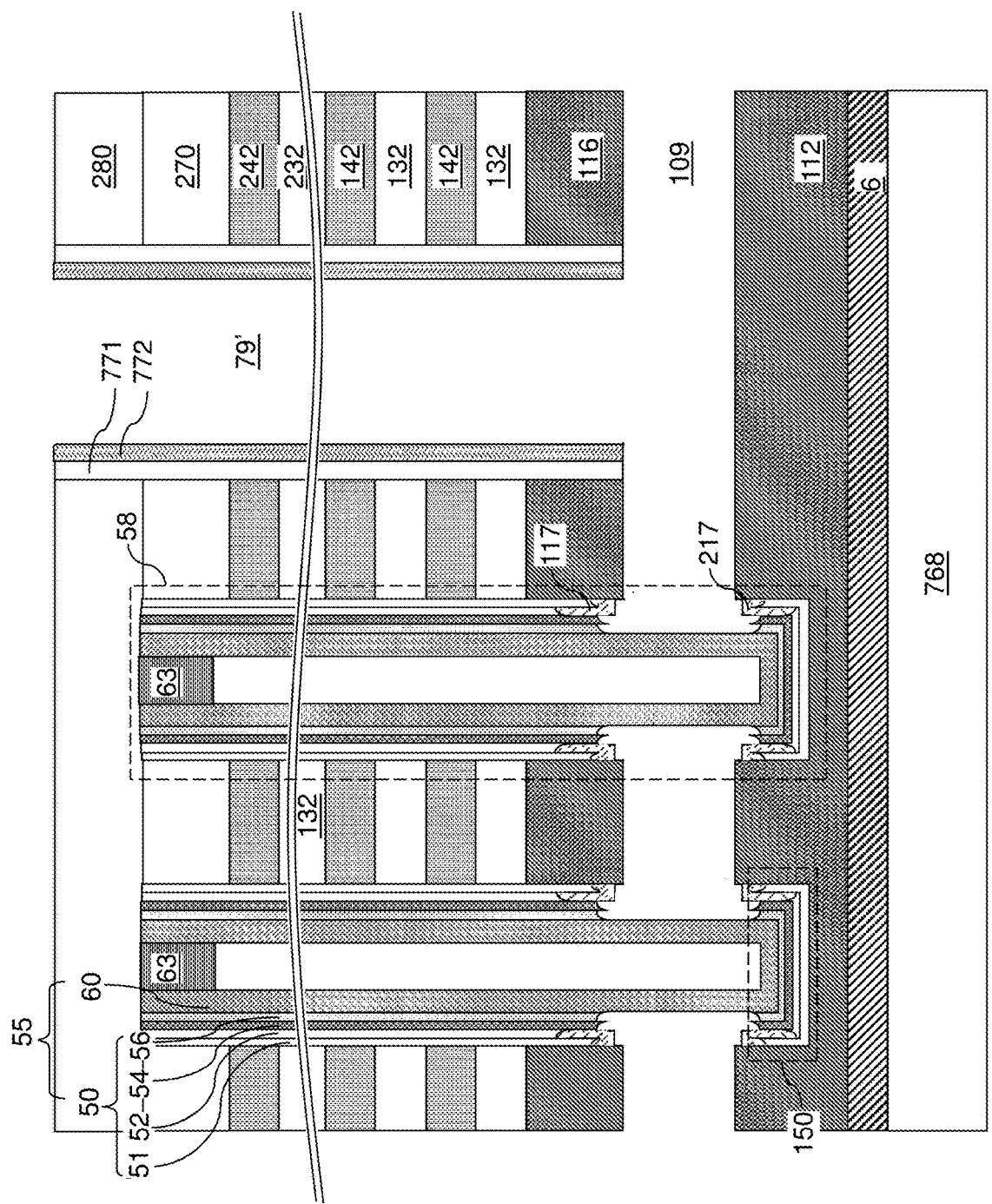

Referring to FIG. 15E, additional portions of each memory film 50 can be isotropically etched to physically expose a cylindrical surface segment of the outer sidewall of each tunneling dielectric layer 56. Specifically, a second isotropic etch process can be performed to isotropically etch a tubular segment of each charge storage layer 54. For example, if the charge storage layers 54 comprise a silicon nitride material, a wet etch process employing hot phosphoric acid may be performed to isotropically etch the silicon nitride material of the charge storage layers 54 selective to the material of the tunneling dielectric layers 56 and selective to the material of the first and second annular semiconductor caps (117, 217). A cylindrical surface segment of the outer sidewall of each tunneling dielectric layer 56 can be physically exposed to the source cavity 109 after the second isotropic etch process. According to an aspect of the present disclosure, the first and second annular semiconductor caps (117, 217) function as ring-shaped etch stop structures during the second isotropic etch process. Thus, the first and second annular semiconductor caps (117, 217) are self-aligned etch stop rings that function as etch stop structures during the second isotropic etch process and a subsequent third isotropic etch process to be subsequently performed, and prevent vertical over etching of the inner blocking dielectric layer 52.

A third isotropic etch process can be performed to isotropically etch a tubular segment of each tunneling dielectric layer 56. Any remaining portions of the upper and lower sacrificial liners (105, 103) can be collaterally removed by the third isotropic etch process, and a bottom surface of the upper source-level semiconductor layer 116 and a top surface of the lower source-level semiconductor layer 112 can be physically exposed. For example, if the tunneling dielectric layers 56 comprise a silicon oxide material, a wet etch process employing dilute (e.g., buffered) hydrofluoric acid or chemical dry etching may be performed to isotropically etch the silicon oxide material of the tunneling dielectric layers 56 selective to the material of the vertical semiconductor channels 60 and selective to the material of the first and second annular semiconductor caps (117, 217). According to an aspect of the present disclosure, the first and second annular semiconductor caps (117, 217) function as ring-shaped etch stop structures during the third isotropic etch process. A cylindrical surface segment of the outer sidewall of each vertical semiconductor channel 60 can be physically exposed to the source cavity 109 after the third isotropic etch process.

Each memory film 50 as provided at the processing steps of FIG. 15A can be divided into a remaining upper portion of the memory film 50 located above the source cavity 109 and a lower dielectric cap structure 150 embedded within the lower source-level semiconductor layer 112. Each memory film 50 after the processing steps of FIG. 15E may comprise at least one blocking dielectric layer (51, 52), a charge storage layer 54, and a tunneling dielectric layer 56. Each dielectric cap structure 150 comprises a layer stack including a same set of materials as the memory film 50. For example, each dielectric cap structure 150 may comprise a first dielectric cap layer having a same material composition and a same thickness as an outer blocking dielectric layer 51, a second dielectric cap layer having a same material composition and a same thickness as an inner blocking dielectric layer 52, a third dielectric cap layer having a same material composition and a same thickness as a charge storage layer 54, a fourth dielectric cap layer having a same material composition and a same thickness as a tunneling dielectric layer 56.

Figure 15F:
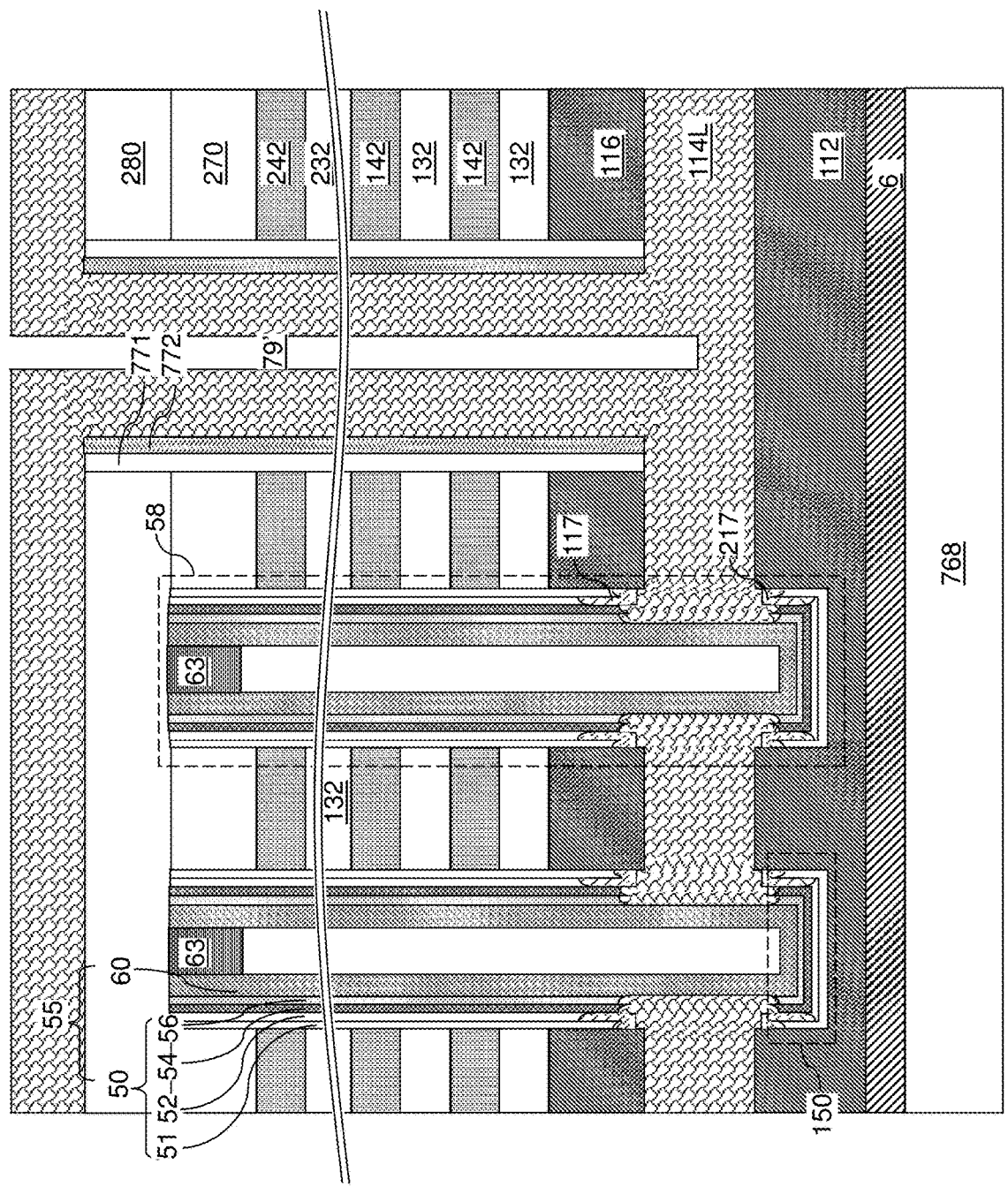

Referring to FIG. 15F, a semiconductor material having a doping of the second conductivity type may be deposited on the physically exposed semiconductor surfaces around the source cavity 109, the physically exposed surfaces around each backside cavity 79', and above the first contact-level dielectric layer 280. The physically exposed semiconductor surfaces around the source cavity 109 include cylindrical surface segments of the outer sidewall of each vertical semiconductor channel 60, tapered concave annular surfaces of the charge storage layers 54, surfaces of the first and second annular semiconductor caps (117, 217), and the bottom surface of the upper source-level semiconductor layer 116 and the top surface of the lower source-level semiconductor layer 112.

In one embodiment, the doped semiconductor material of the second conductivity type may comprise polysilicon having a doping of the second conductivity type or amorphous silicon having a doping of the second conductivity type, which can be converted into polysilicon having a doping of the second conductivity type in a subsequent anneal process. In one embodiment, the doped semiconductor material of the second conductivity type may be deposited by a conformal semiconductor deposition process such as a chemical vapor deposition process or an atomic layer deposition process. Electrical dopants of the second conductivity can be incorporated into the deposited semiconductor material by in-situ doping. The deposited doped semiconductor material forms a source contact material layer 114L, which comprises a horizontally-extending portion filling the source cavity 109, vertically-extending tubular portions located at peripheral regions of the backside trenches 79, and an additional horizontally-extending portion located above the first contact-level dielectric layer 280. The atomic concentration of the dopants of the second conductivity type in the deposited semiconductor material may be greater than $1 \times 10^{18}/cm^3$, such as in a range from $1 \times 10^{19}/cm^3$ to $2 \times 10^{21}/cm^3$, such as from $2 \times 10^{19}/cm^3$ to $8 \times 10^{20}/cm^3$. The source contact material layer 114L may consist essentially of semiconductor atoms and dopant atoms of the second conductivity type. A backside cavity 79' can be present within each backside trench 79.

Figure 15G:
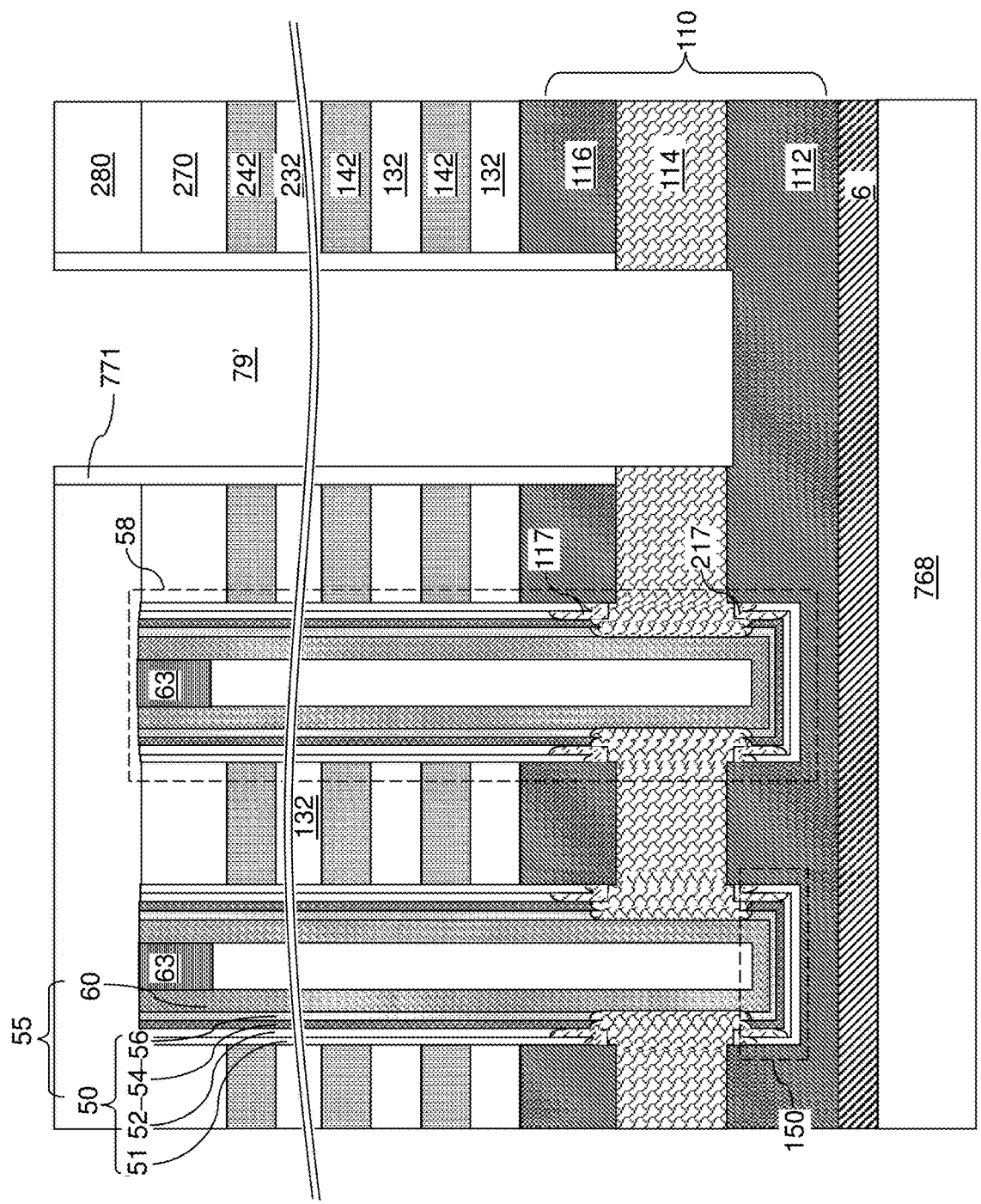

Referring to FIG. 15G, an etch back process can be performed to remove portions of the source semiconductor material layer 114L that are located above the first contact-level dielectric layer 280 or within the backside trenches 79. If any portions of the second spacer material layers 772 remain in the backside trenches 79, then the second spacer material layers 772 are removed by the etch back process. The duration of the etch back process can be selected such that the material of the source semiconductor material layer 114L and the second spacer material spacers 772 are removed from inside each backside trench 79 and from above the first contact-level dielectric layer 280, while the portion of the source semiconductor material layer 114L located within the source cavity 109 remains as a source contact layer 114.

Optionally, one or more additional cycles of a conformal doped semiconductor deposition process and semiconductor etch back processes may be employed to conformally deposit an additional doped semiconductor material having a doping of the second conductivity type and to isotropically recess the previously deposited doped semiconductor material within each cycle. The source contact layer 114 may be formed as a seamless and/or voidless structure by employing such additional cycle(s) of a respective conformal doped semiconductor deposition process and a respective semiconductor etch back processes.

The layer stack including the lower source-level semiconductor layer 112, the source contact layer 114, and the upper source-level semiconductor layer 116 constitutes a buried source layer (112, 114, 116), which constitutes source-level material layers 110 that replace the in-process source-level material layers 110' as formed at the processing steps of FIGS. 1A-1C.

Figure 15H:
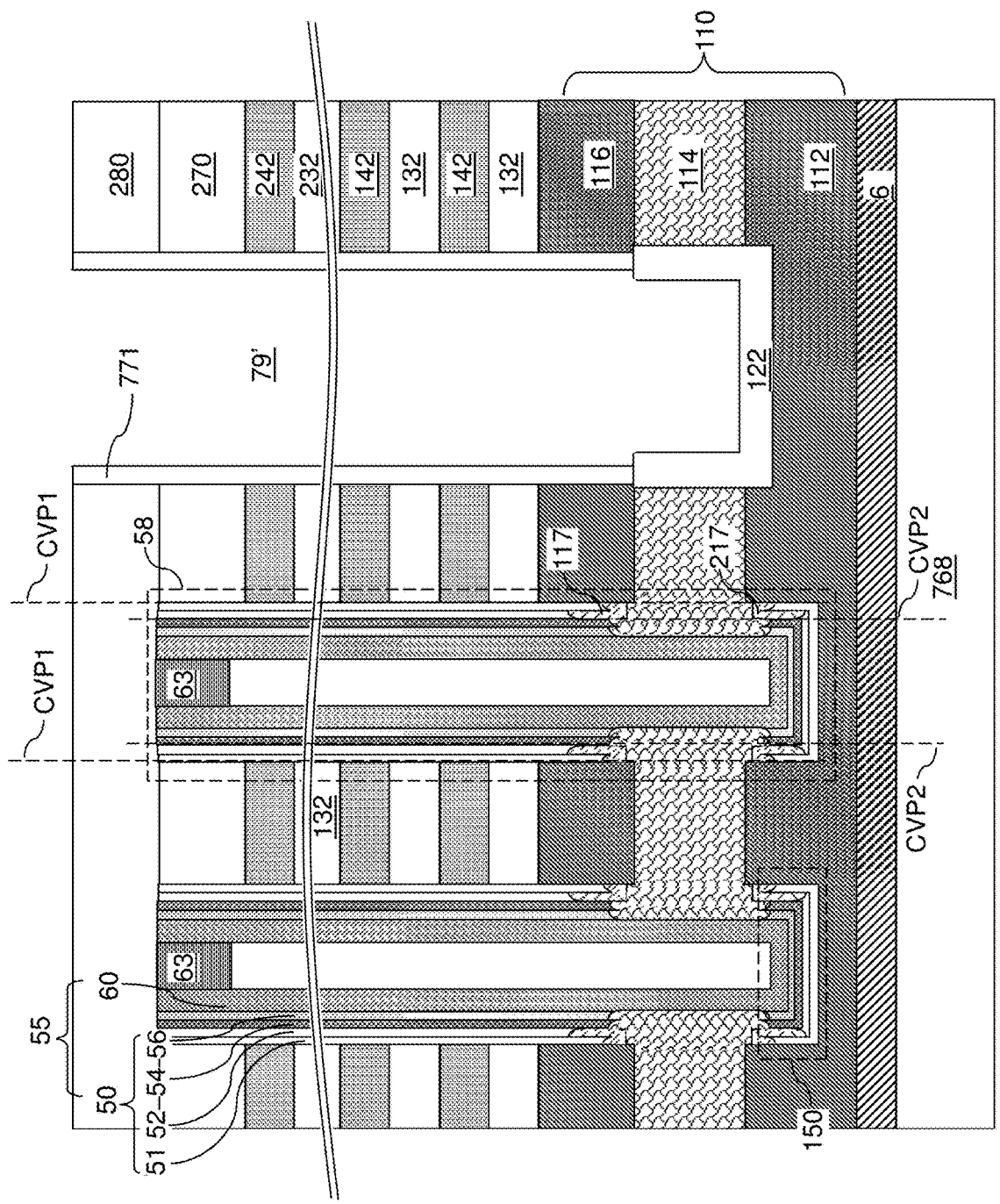

Referring to FIG. 15H, an oxidation process may be performed to convert physically exposed surface portions of semiconductor materials into dielectric semiconductor oxide portions. For example, surfaces portions of the source contact layer 114 and the lower source-level semiconductor layer 112 may be converted into dielectric semiconductor oxide plates 122 that includes a dielectric semiconductor oxide material such as a silicon oxide material.

Within each memory opening fill structure 58, a vertical semiconductor channel 60 vertically extends through the alternating stack {(132, 232), (142, 242)} and into the upper portion of the lower source-level semiconductor layer 112. A memory film laterally surrounds the vertical semiconductor channel 60 and vertically extends through the alternating stack {(132, 232), (142, 242)} and into an upper portion of the upper source-level semiconductor layer 116. A first annular semiconductor cap 117 contacts a bottom surface of the memory film 50, and contacts a top surface segment of the source contact layer 114.

In one embodiment, the top surface segment of the source contact layer 114 is located within a volume laterally bounded by a first cylindrical vertical plane CVP1 including an interface between the memory film 50 and the insulating layers (132, 232) of the alternating stack {(132, 232), (142, 242)}. In one embodiment, the first annular semiconductor cap 117 and the source contact layer 114 have different material compositions (e.g., different p-type or n-type doping concentrations). In one embodiment, the first annular semiconductor cap 117 has an outer cylindrical surface contacting a sidewall of the upper source-level semiconductor layer 116.

In one embodiment, the memory film 50 comprises a charge storage layer 54 that vertically extends through each sacrificial material layer (142, 242) within the alternating stack {(132, 232), (142, 242)}, a tunneling dielectric layer 56 that is laterally surrounded by the charge storage layer 54, and at least one blocking dielectric layer (51, 52) that laterally surrounds the charge storage layer 54. The first annular semiconductor cap 117 contacts a cylindrical segment of an outer sidewall of the charge storage layer 54. A second annular semiconductor cap 217 contacts a bottom surface segment of the source contact layer 114. The second annular semiconductor cap 217 comprises a same material as the first annular semiconductor cap 117, and is located within a first cylindrical vertical plane CVP1 containing an outer sidewall of the memory film 50.

As discussed above, the inner blocking dielectric layer 52 can be vertically recessed more than the outer blocking dielectric layer 51 at the processing steps of FIG. 15B. In one embodiment, an interface between the inner blocking dielectric layer 52 and the first annular semiconductor cap 117 is located above a horizontal plane including a highest point within an interface between the outer blocking dielectric layer 51 and the first annular semiconductor cap 117. In one embodiment, the source contact layer 114 can be formed in the source cavity 109 directly on the physically exposed cylindrical surface segment of each vertical semiconductor channel 60, directly on the first annular semiconductor caps 117, and directly on the second annular semiconductor caps 217. In one embodiment, the source contact layer 114 contacts a concave annular bottom surface of the charge storage layer 54.

Figure 16:
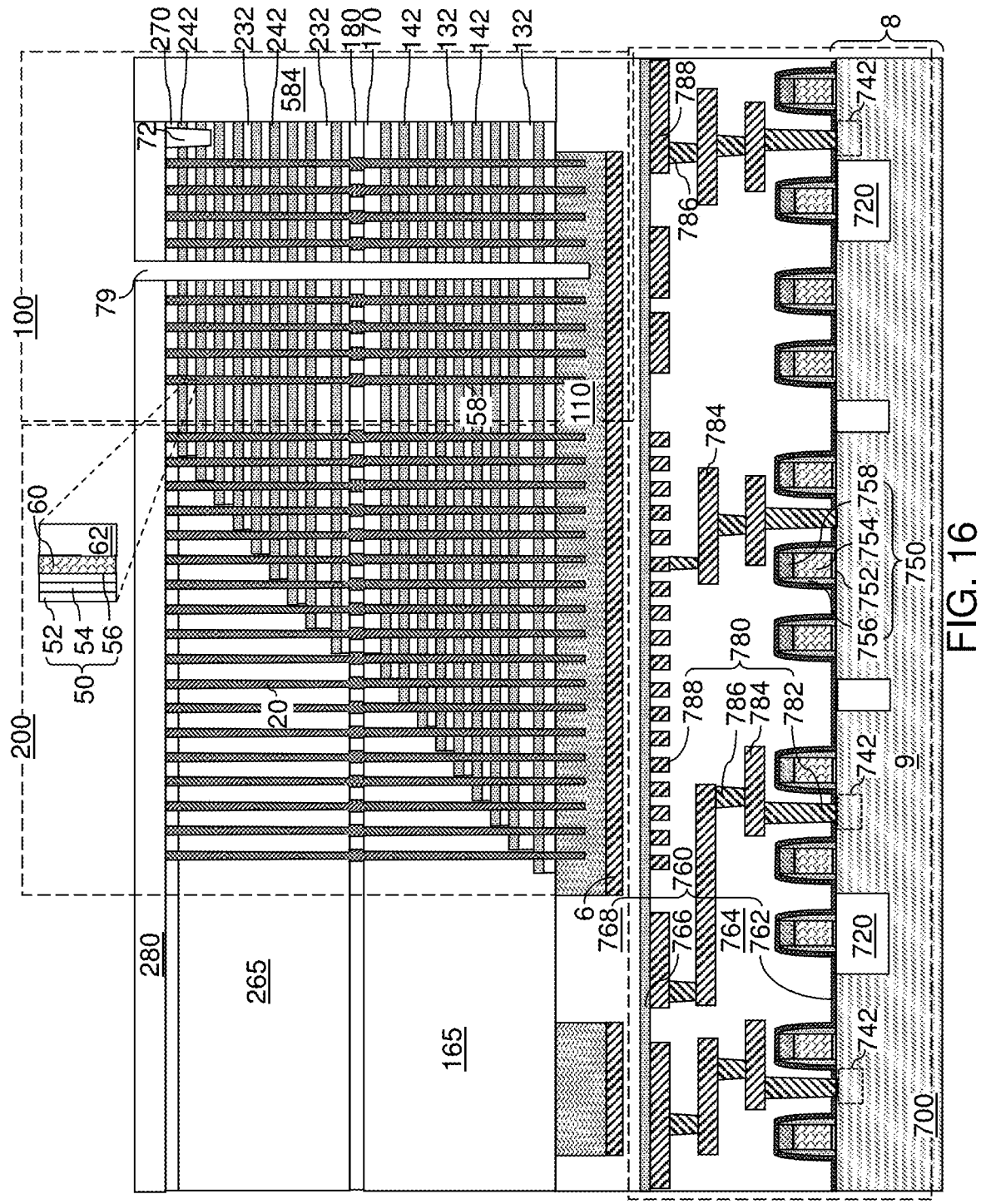
FIG. 16 is a vertical cross-sectional view of the exemplary structure after formation of source-level material layers according to an embodiment of the present disclosure.

Referring to FIG. 16, the first backside trench spacers 771 may be removed using an isotropic etch process. For example, if the first backside trench spacers 771 include silicon oxide, a wet etch process using dilute hydrofluoric acid may be performed to remove first backside trench spacers 771.

Figure 17:
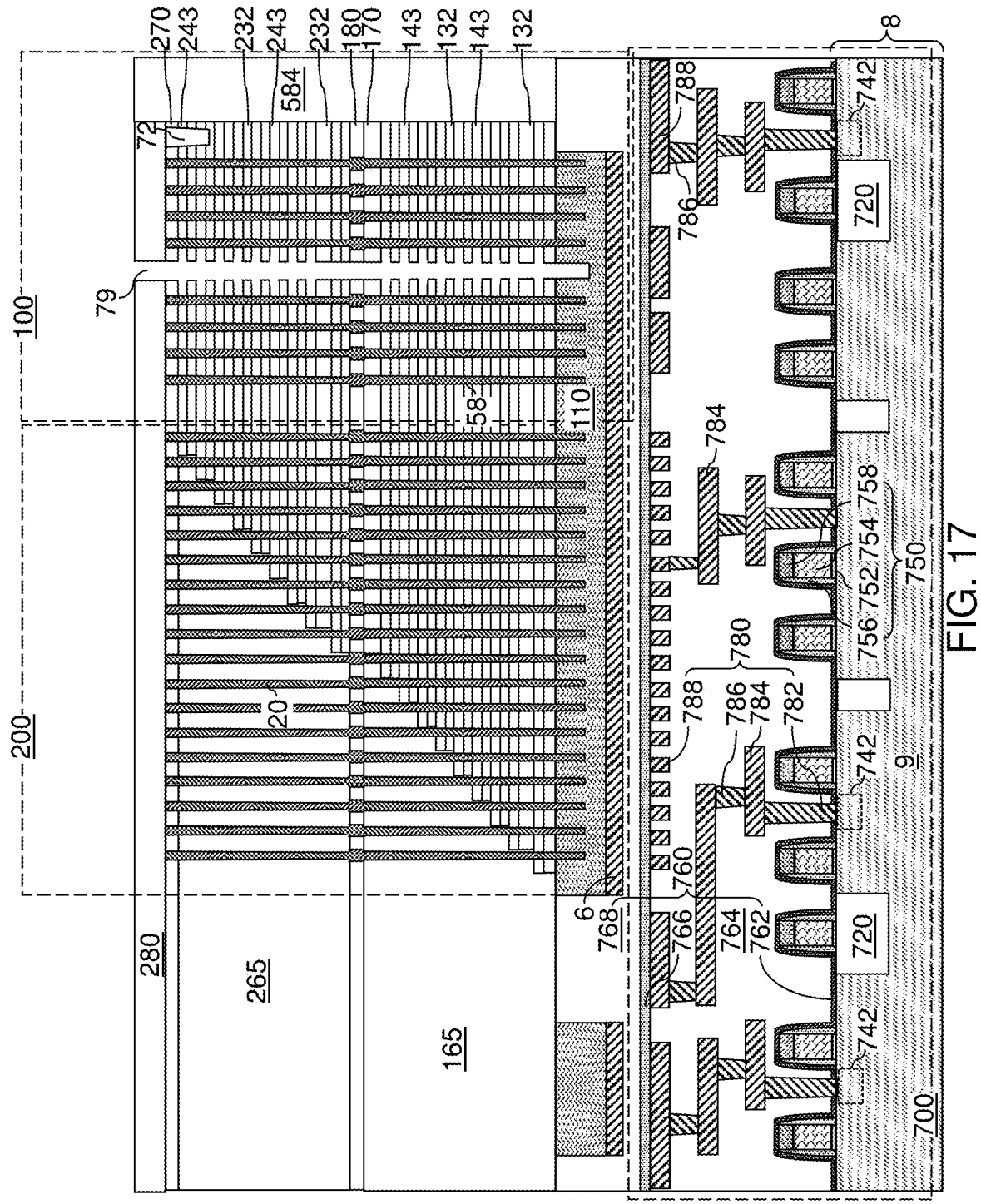
FIG. 17 is a vertical cross-sectional view of the exemplary structure after formation of backside recesses according to an embodiment of the present disclosure.

Referring to FIG. 17, the sacrificial material layers (142, 242) are removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. In one embodiment, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 18A:
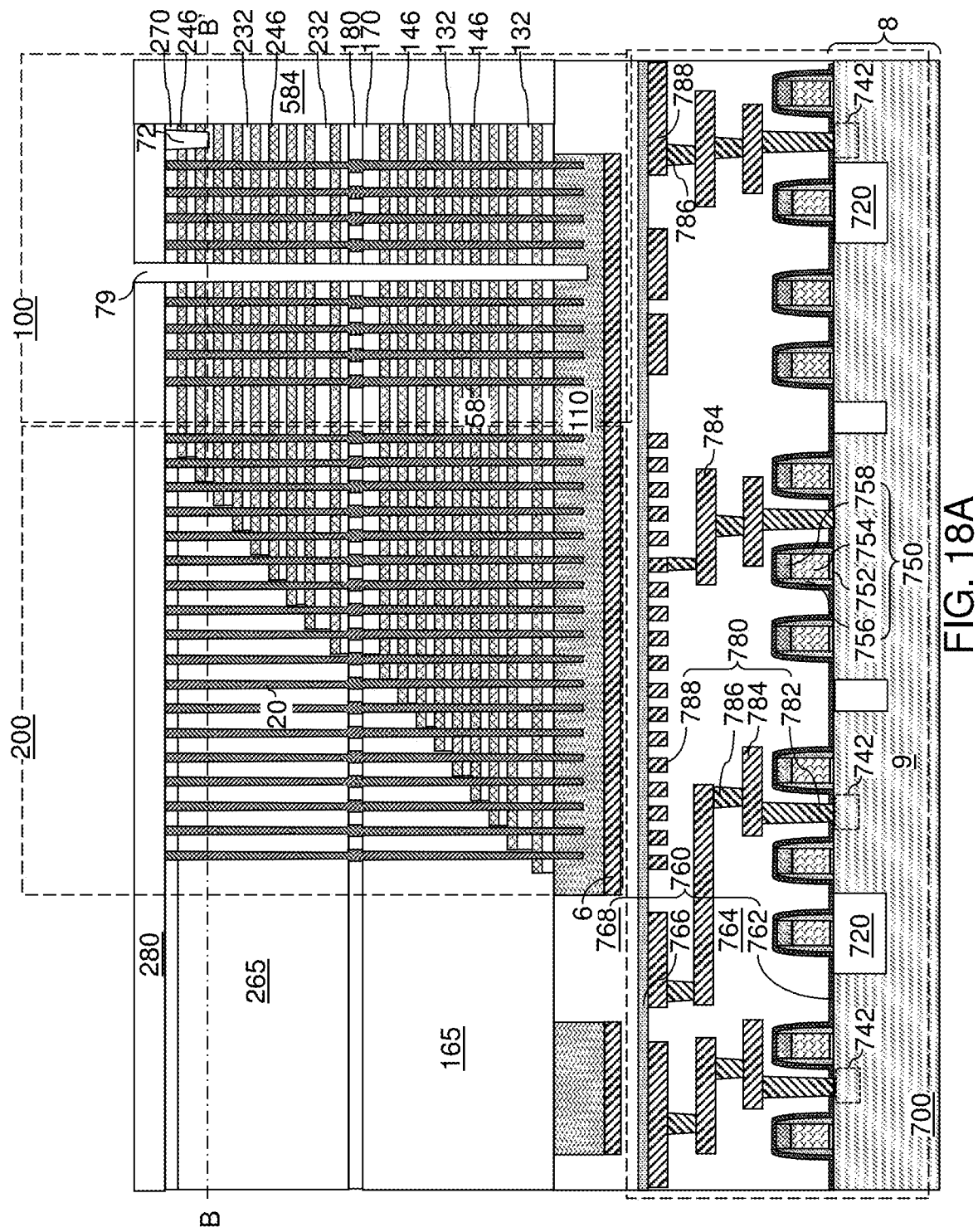
FIG. 18A is a vertical cross-sectional view of the exemplary structure after formation of electrically conductive layers according to an embodiment of the present disclosure.
Figure 18B:
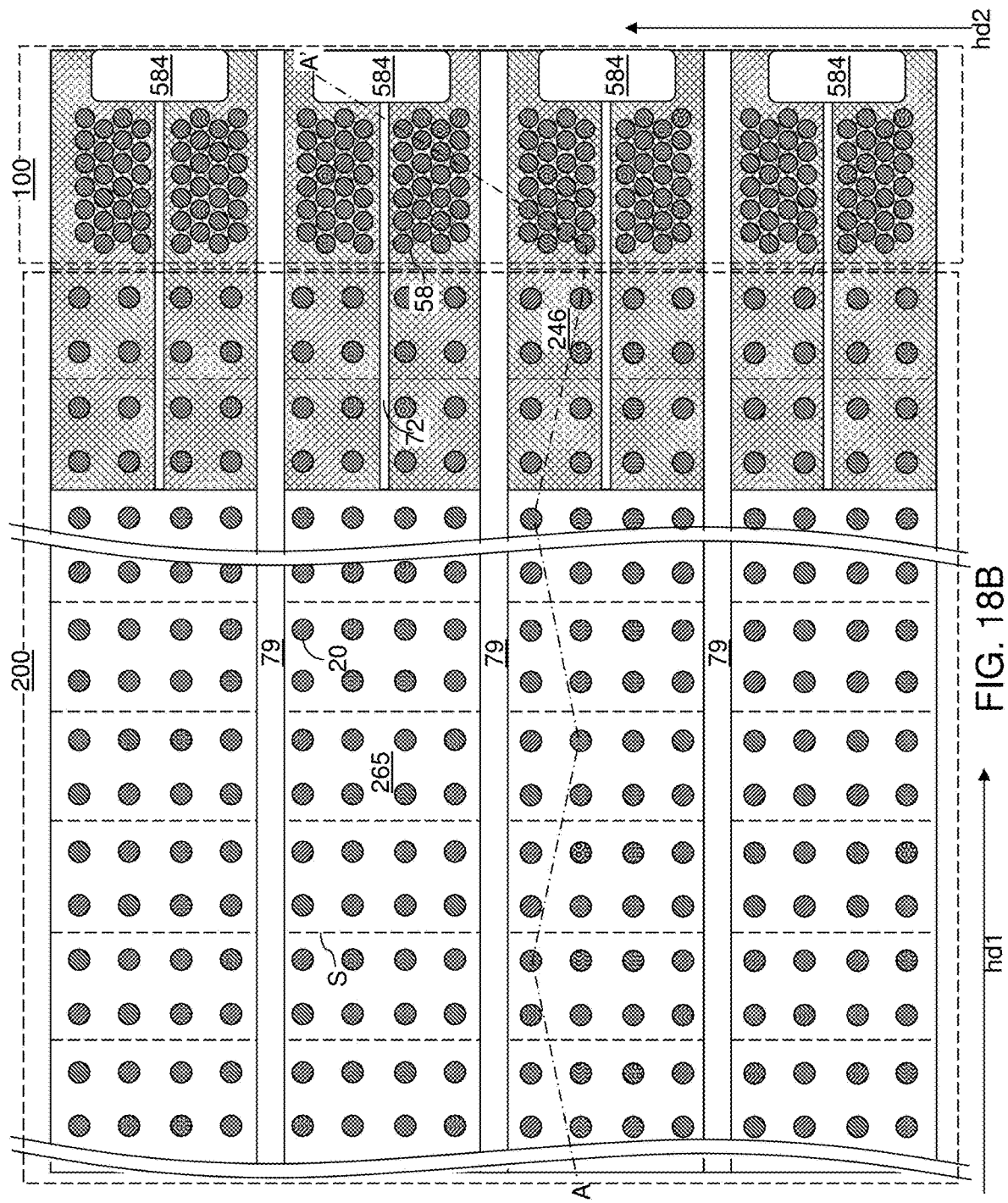
FIG. 18B is a horizontal cross-sectional view of the exemplary structure along the horizontal plane B-B' of FIG. 18A. The hinged vertical plane A-A' corresponds to the plane of the vertical cross-sectional view of FIG. 18A.

Referring to FIGS. 18A and 18B, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 19A:
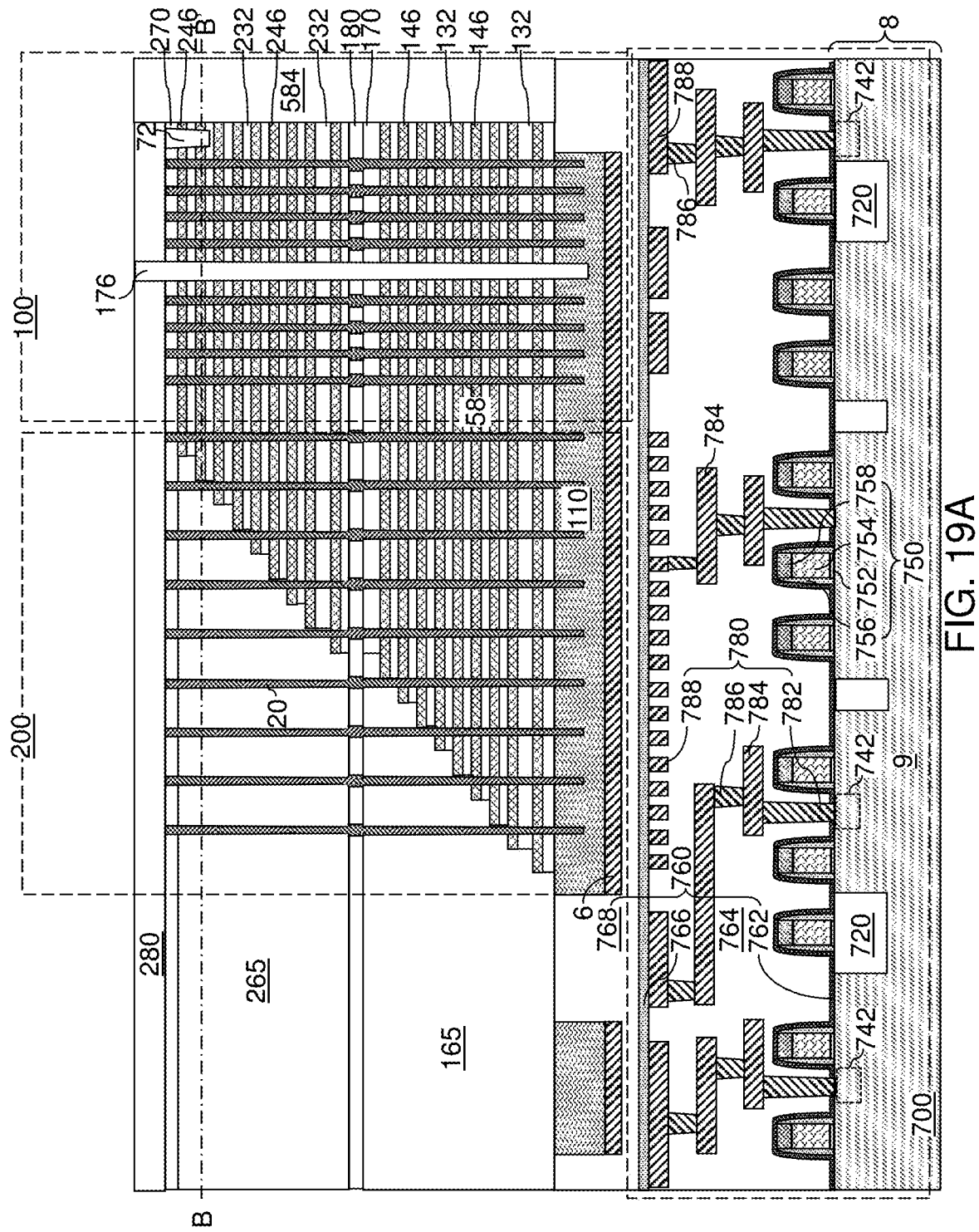
FIG. 19A is a vertical cross-sectional view of the exemplary structure after formation of backside trench fill structures in the backside trenches according to an embodiment of the present disclosure.
Figure 19B:
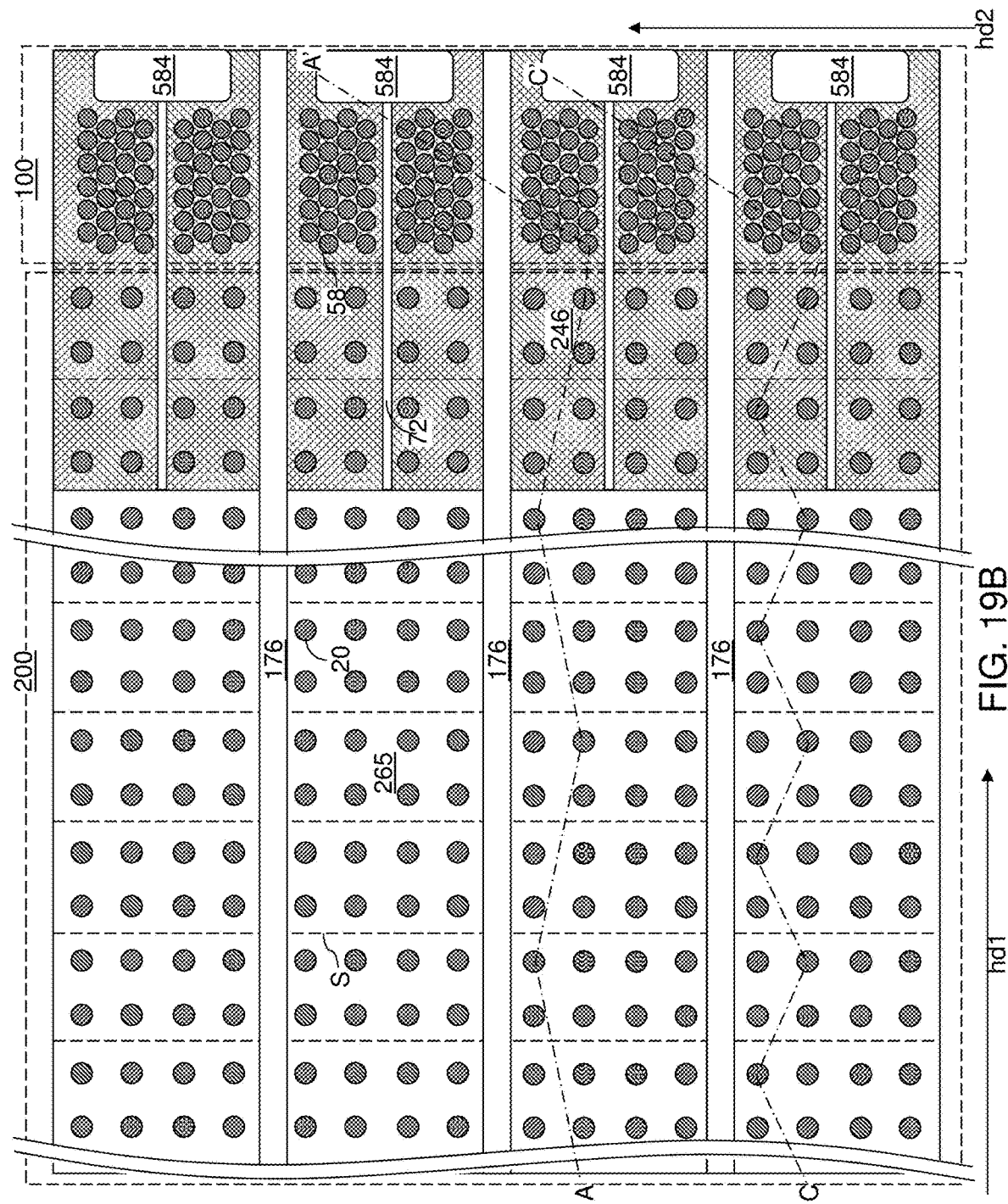
FIG. 19B is a horizontal cross-sectional view of the exemplary structure along the horizontal plane B-B' of FIG. 19A. The hinged vertical plane A-A' corresponds to the plane of the vertical cross-sectional view of FIG. 19A.
Figure 19C:
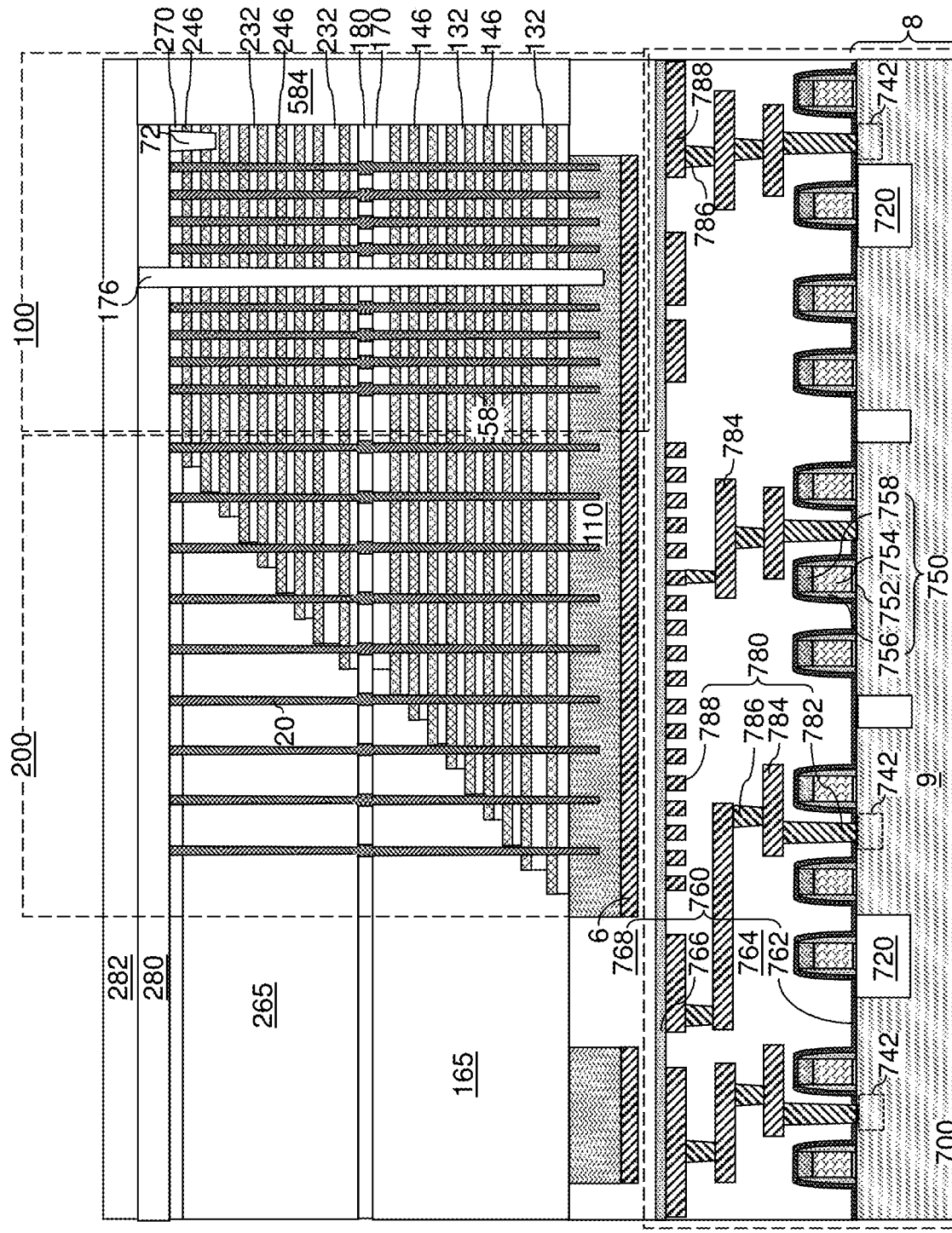
FIG. 19C is a vertical cross-sectional view of the exemplary structure along the vertical plane C-C' of FIG. 19B.

Referring to FIGS. 19A-19C, a dielectric fill material may be conformally deposited in the backside trenches 79 and over the first contact-level dielectric layer 280 by a conformal deposition process. The dielectric material layer may include, for example, silicon oxide. Each portion of the dielectric fill material that fills a backside trench constitutes a dielectric backside trench fill structure 176, which may be a dielectric wall structure laterally extending along the first horizontal direction. A horizontally-extending portion of the dielectric fill material that overlies the first contact-level dielectric layer 280 constitutes a second contact-level dielectric layer 282. The second contact-level dielectric layer 282 may have a thickness in a range from 100 nm to 600 nm, although lesser and greater thicknesses may also be used.

Figure 20A:
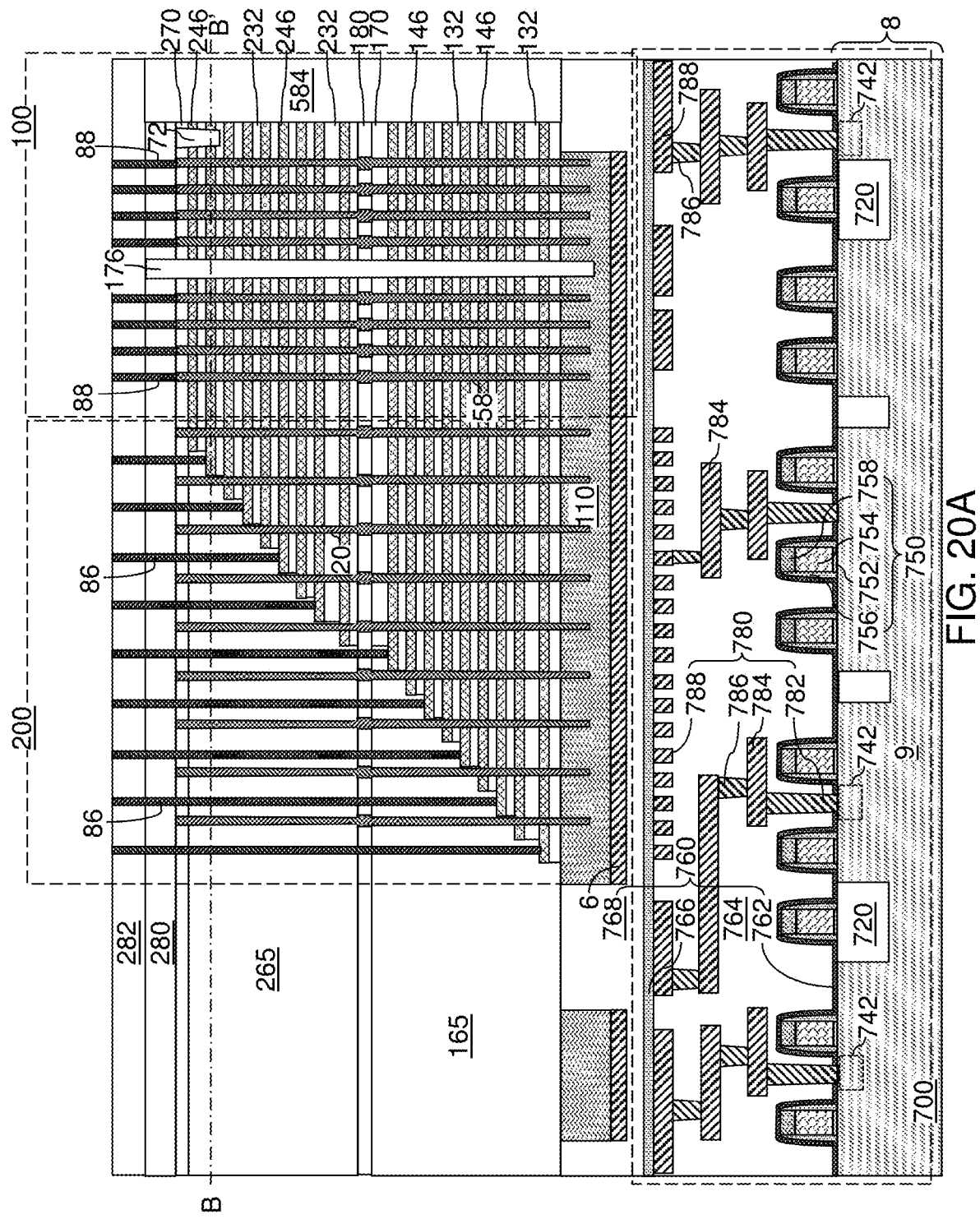
FIG. 20A is a vertical cross-sectional view of the exemplary structure after formation of a second contact-level dielectric layer and various contact via structures according to an embodiment of the present disclosure.
Figure 20B:
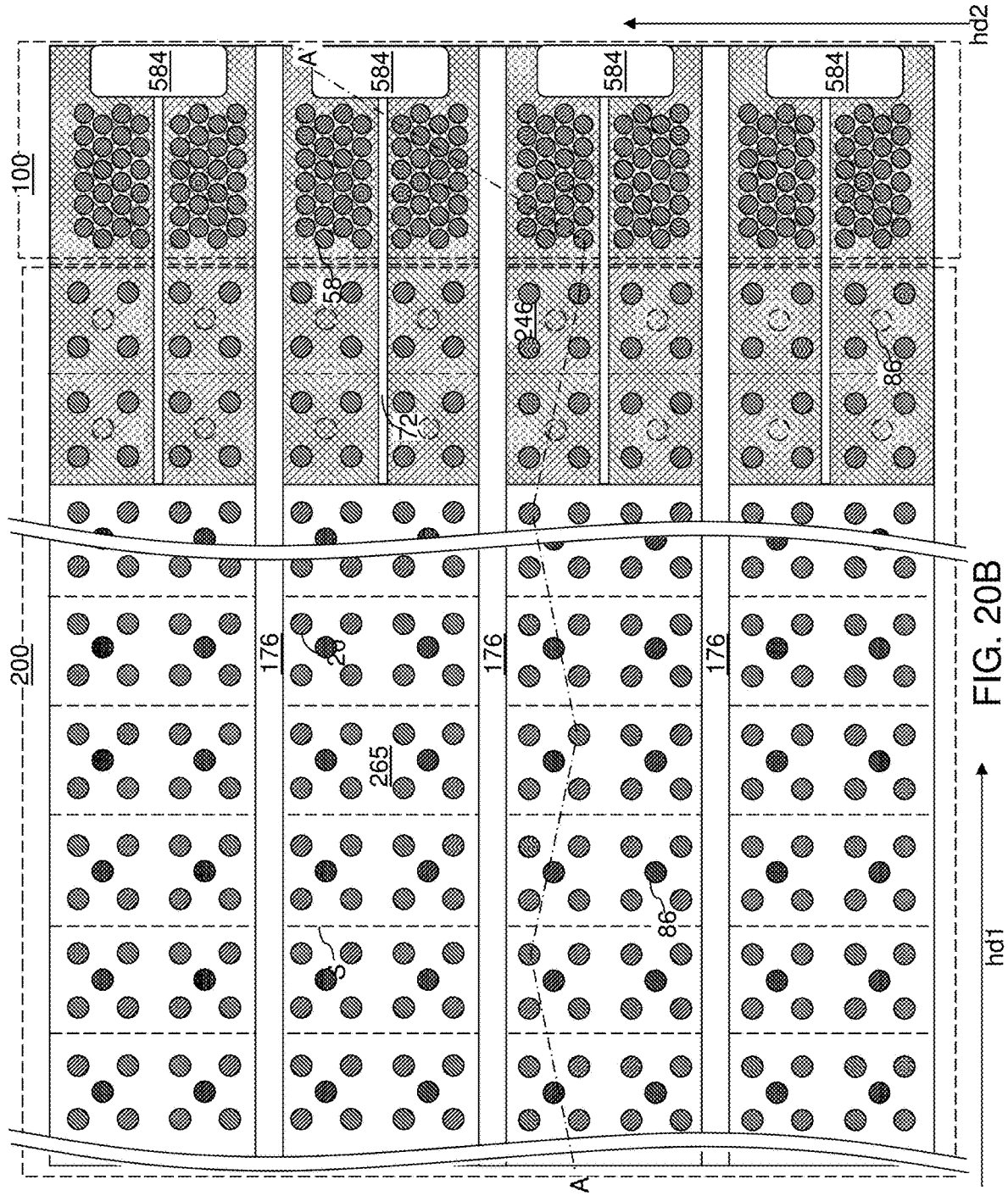
FIG. 20B is a horizontal cross-sectional view of the exemplary structure along the vertical plane B-B' of FIG. 26A. The hinged vertical plane A-A' corresponds to the plane of the vertical cross-sectional view of FIG. 26A.

Referring to FIGS. 20A and 20B, a photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 21:
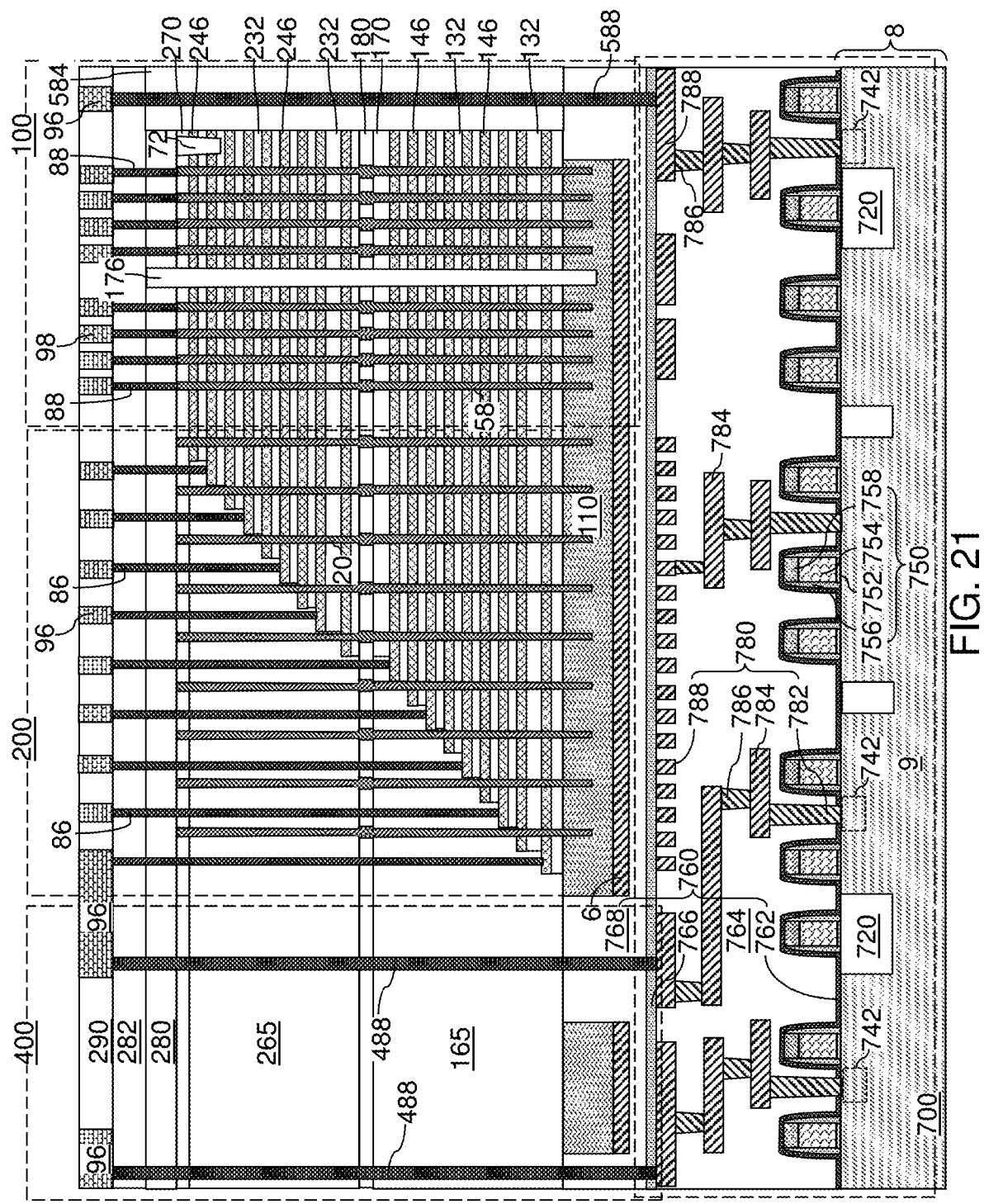
FIG. 21 is a vertical cross-sectional view of the exemplary structure after formation of through-memory-level via structures and upper metal line structures according to an embodiment of the present disclosure.

Referring to FIG. 21, peripheral-region via cavities may be formed through the second and first contact-level dielectric layers (282, 280), the second and first retro-stepped dielectric material portions (265, 165), and the at least one second dielectric layer 768 to top surfaces of a first subset of the lower-level metal interconnect structure 780 in the peripheral device region 400. Through-memory-region via cavities may be formed through the interconnection region dielectric fill material portions 584 and the at least one second dielectric layer 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

FIGS. 22A-22G illustrate sequential vertical cross-sectional views of memory opening fill structures and a backside trench during formation of source-level material layers in an alternative embodiment of the exemplary structure according to an embodiment of the present disclosure.

Figure 22A:
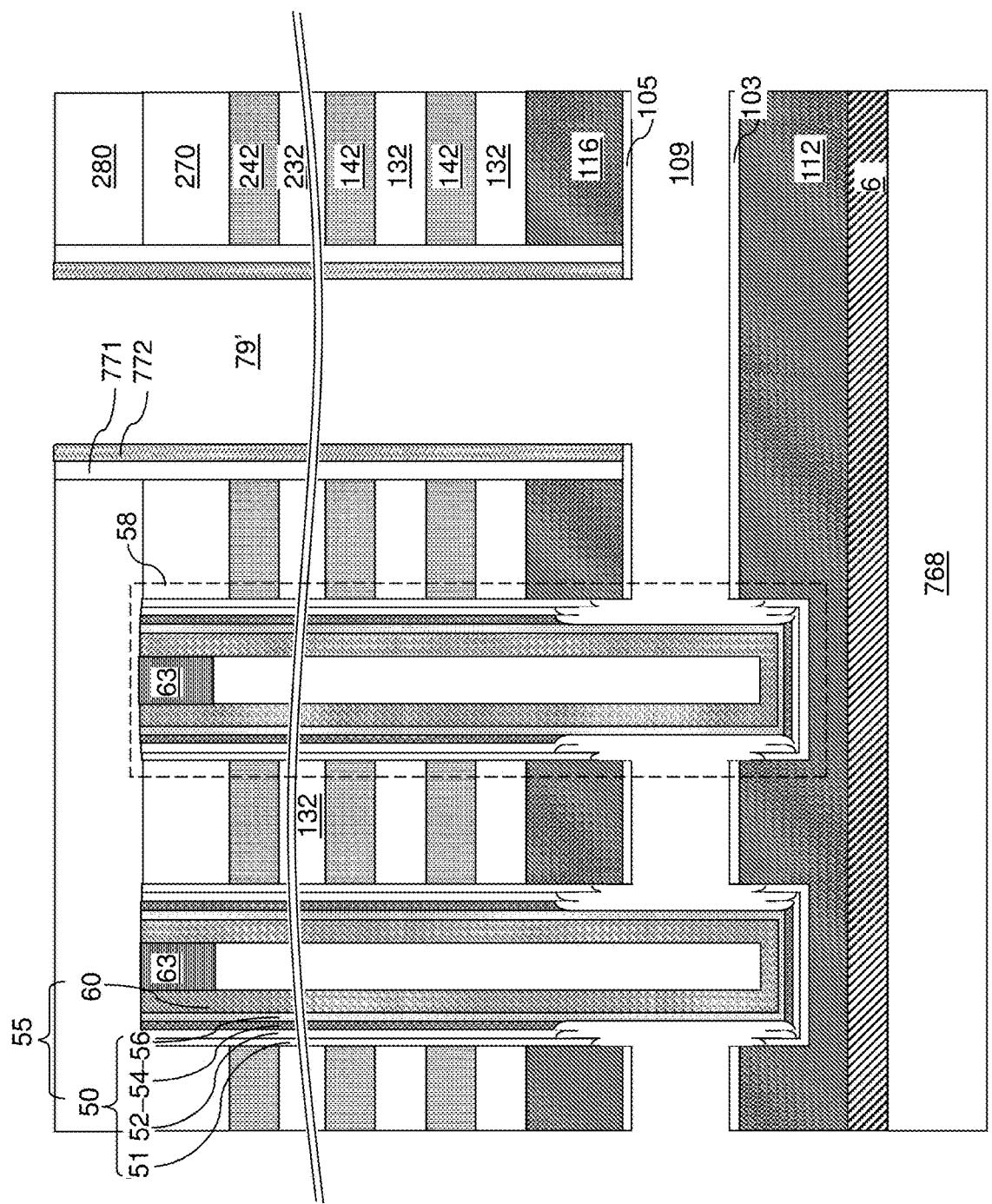
FIGS. 22A-22G illustrate sequential vertical cross-sectional views of memory opening fill structures and a backside trench during formation of source-level material layers in an alternative embodiment of the exemplary structure according to an embodiment of the present disclosure.

Referring to FIG. 22A, an alternative embodiment of the exemplary structure may be derived from the exemplary structure illustrated in FIG. 15B by performing the second isotropic etch process described with reference to FIG. 15E prior to depositing the semiconductor fill material layer 107L. The second isotropic etch process isotropically etches a tubular segment of each charge storage layer 54. For example, if the charge storage layers 54 comprise a silicon nitride material, a wet etch process employing hot phosphoric acid may be performed to isotropically etch the silicon nitride material of the charge storage layers 54 selective to the material of the tunneling dielectric layers 56. A cylindrical surface segment of the outer sidewall of each tunneling dielectric layer 56 can be physically exposed to the source cavity 109 after the second isotropic etch process.

Figure 22B:
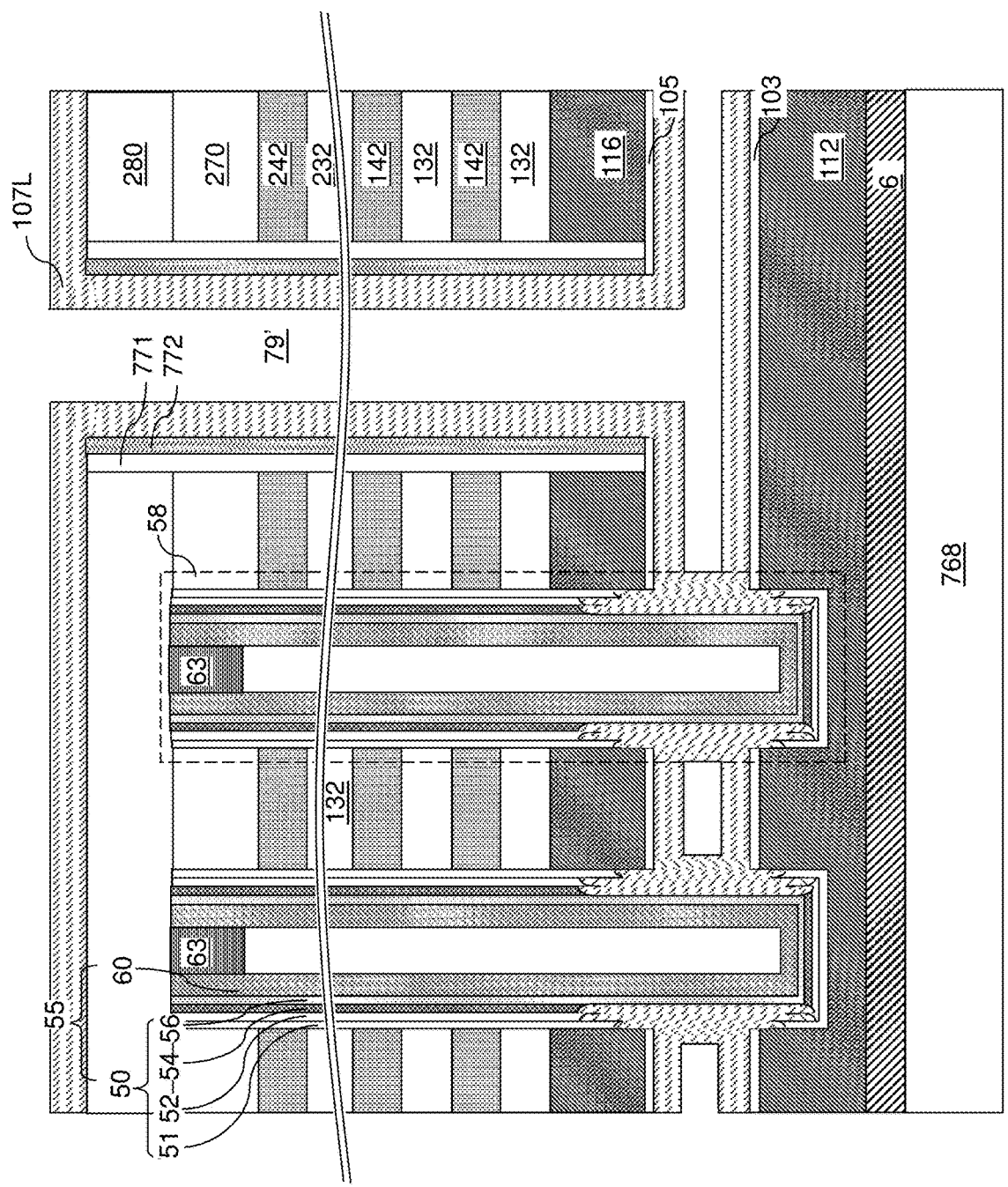

Referring to FIG. 22B, the semiconductor fill material can be conformally deposited in peripheral portions of the source cavity 109, in peripheral portions of the backside trenches 79, and over the first contact-level dielectric layer 280 to form the above described semiconductor fill material layer 107L. The semiconductor fill material is deposited directly on recessed surfaces of the at least one blocking dielectric layer (51, 52), directly on recessed surfaces of the charge storage layer 54, and directly on a cylindrical surface segment of the tunneling dielectric layer 56 in each memory opening fill structure 58.

The thickness of the semiconductor fill material layer 107L is less than one half of the height of the source cavity 109, and is less than one half of the minimum width of each backside cavity 79' as provided at the processing steps of FIG. 15B. Further, the thickness of the semiconductor fill material layer 107L can be greater than one half of the sum of the thickness of the outer blocking dielectric layer 51, the thickness of the inner blocking dielectric layer 52, and the thickness of the charge storage layer 54. In one embodiment, the thickness of the semiconductor fill material layer 107L may be in a range from 5 nm to 30 nm, such as from 10 nm to 20 nm, although lesser and greater thicknesses may also be employed. A void is present within the source cavity 109, and a void (i.e., a backside cavity 79') is present within each backside trench 79. The entire volume of the portions of the at least one blocking dielectric layer (51, 52) removed by the first isotropic etch process at the processing steps of FIG. 15B is filled with the semiconductor fill material layer 107L.

Figure 22C:
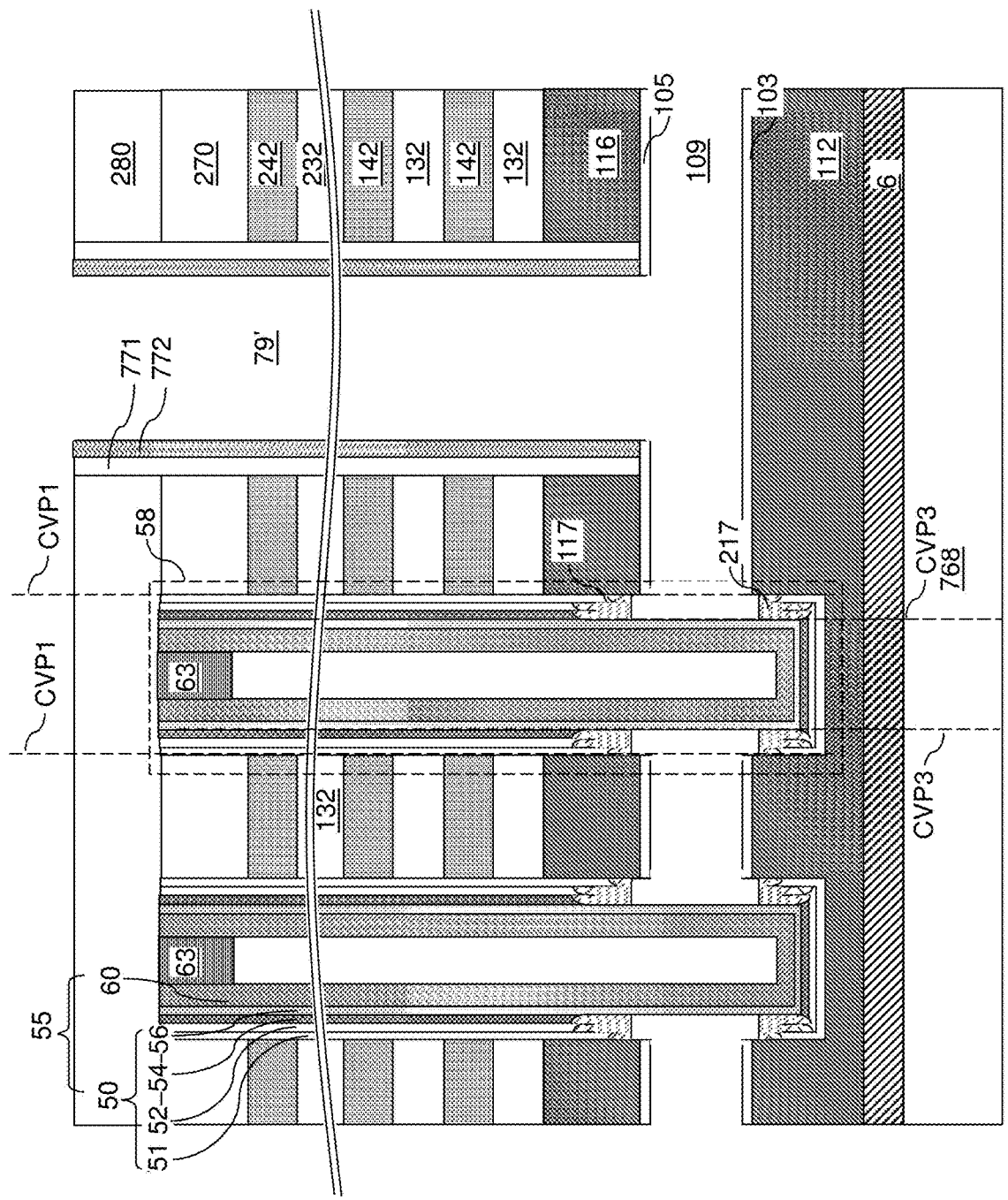

Referring to FIG. 22C, an isotropic etch back process can be performed to isotropically recess the semiconductor fill material layer 107L, as described above with respect to FIG. 15D. Portions of the semiconductor fill material layer 107L located above the first contact-level dielectric layer 280, located within the second backside trench spacers 772, or located between the upper sacrificial liner 105 and the lower sacrificial liner 103 (if present) can be isotropically etched back by the isotropic etch back process. The duration of the isotropic etch process can be selected such that annular portions of the semiconductor fill material layer 107L that contact a respective tunneling dielectric layer 56, and are located above the horizontal plane including the top surface of the upper sacrificial liner 105 or below the horizontal plane including the bottom surface of the lower sacrificial liner 103 (if present) are not removed. Each annular portion of the semiconductor fill material layer 107L that contacts a respective charge storage layer 54 and is a located above the horizontal plane including the top surface of the upper sacrificial liner 105 (if present) constitutes the first annular semiconductor cap 117. Each annular portion of the semiconductor fill material layer 107L that contacts a respective charge storage layer 54 and is a located below the horizontal plane including the bottom surface of the lower sacrificial liner 103 (if present) constitutes the second annular semiconductor cap 217. The second backside trench spacers 772 may or may not be removed during the isotropic etch back process.

The first annular semiconductor caps 117 and the second annular semiconductor caps 217 have a respective tubular configuration, and comprise a respective inner cylindrical sidewall and a respective outer cylindrical sidewall. The inner cylindrical sidewall of each of the first and second annular semiconductor caps (117, 217) contacts a respective cylindrical surface segment of a tunneling dielectric layer 56. The outer cylindrical sidewall of each of the first annular semiconductor caps 117 contacts a respective cylindrical surface segment of the upper source-level semiconductor layer 116. The outer cylindrical sidewall of each of the second annular semiconductor caps 217 contacts a respective cylindrical surface segment of the lower source-level semiconductor layer 112. A cylindrical surface segment of an outer sidewall of each tunneling dielectric layer 56 can be physically exposed to the source cavity 109.

The first and second annular semiconductor caps (117, 217) are self-aligned to the memory film 50. Specifically, the first and second annular semiconductor caps (117, 217) are located entirely within between first cylindrical vertical plane CVP1 including the outer sidewall of the outer blocking dielectric layer 51 and a third cylindrical vertical plane CVP3 including the inner sidewall of the inner blocking dielectric layer 52.

Figure 22D:
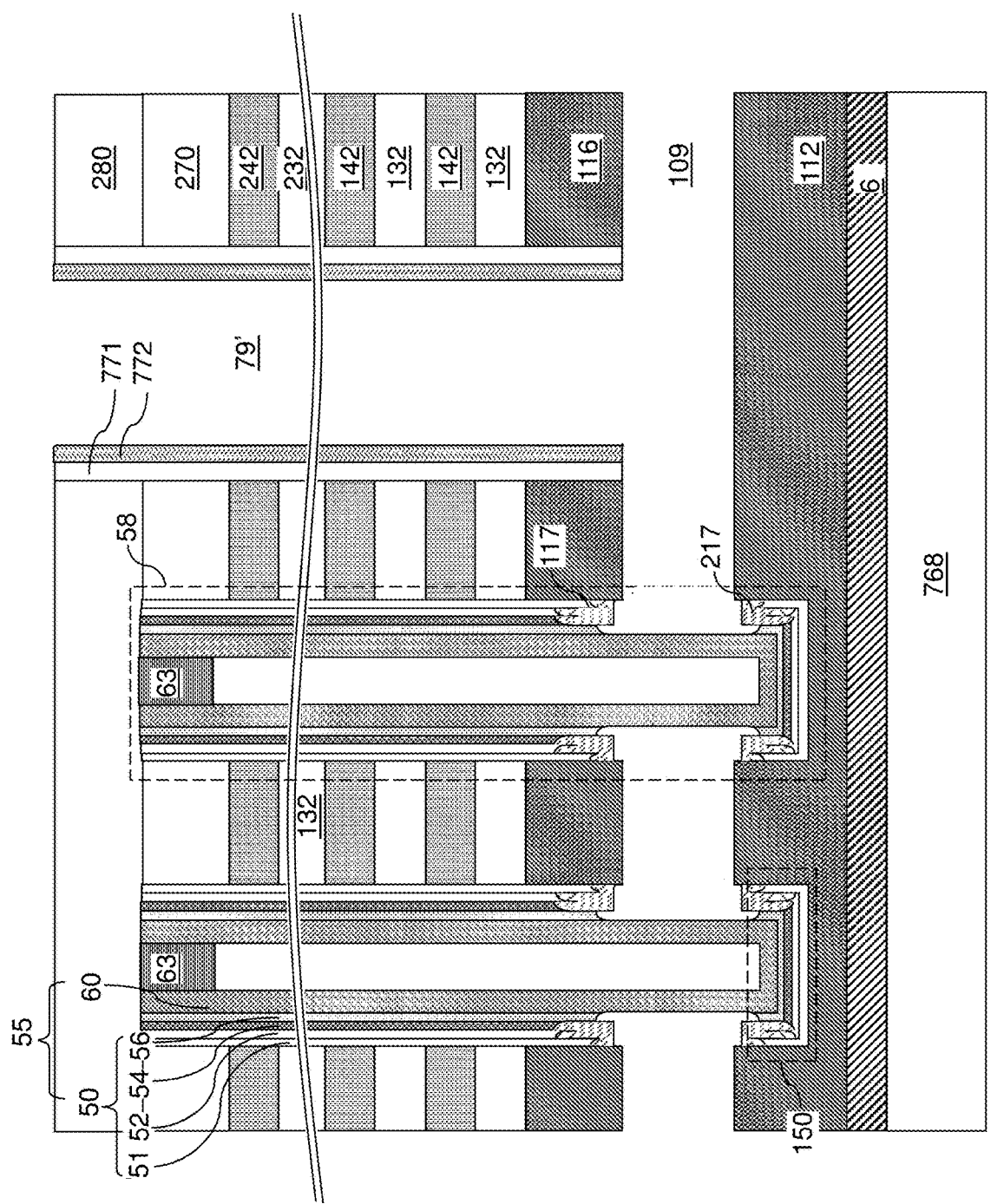

Referring to FIG. 22D, the third isotropic etch process can be performed to isotropically etch a tubular segment of each tunneling dielectric layer 56. Remaining portions of the upper and lower sacrificial liners (105, 103) can be collaterally removed by the third isotropic etch process, and a bottom surface of the upper source-level semiconductor layer 116 and a top surface of the lower source-level semiconductor layer 112 can be physically exposed. For example, if the tunneling dielectric layers 56 comprise a silicon oxide material, a wet etch process employing dilute hydrofluoric acid or a chemical dry etch may be performed to isotropically etch the silicon oxide material of the tunneling dielectric layers 56 selective to the material of the vertical semiconductor channels 60 and selective to the material of the first and second annular semiconductor caps (117, 217). According to an aspect of the present disclosure, the first and second annular semiconductor caps (117, 217) function as ring-shaped etch stop structures during the third isotropic etch process. A cylindrical surface segment of the outer sidewall of each vertical semiconductor channel 60 can be physically exposed to the source cavity 109 after the third isotropic etch process.

Each memory film 50 as provided at the processing steps of FIG. 15A can be divided into a remaining portion of the memory film 50 located above the source cavity 109 and a dielectric cap structure 150 embedded within the lower source-level semiconductor layer 112. Each memory film 50 after the processing steps of FIG. 22D may comprise at least one blocking dielectric layer (51, 52), a charge storage layer 54, and a tunneling dielectric layer 56. Each dielectric cap structure 150 comprises a layer stack including a same set of materials as the memory film 50. For example, each dielectric cap structure 150 may comprise a first dielectric cap layer having a same material composition and a same thickness as an outer blocking dielectric layer 51, a second dielectric cap layer having a same material composition and a same thickness as an inner blocking dielectric layer 52, a third dielectric cap layer having a same material composition and a same thickness as a charge storage layer 54, a fourth dielectric cap layer having a same material composition and a same thickness as a tunneling dielectric layer 56. Generally, additional portions of each memory film 50 can be isotropically etched after formation of the first and second annular semiconductor caps (117, 217) to physically expose a cylindrical surface segment of the outer sidewall of each vertical semiconductor channel 60.

Figure 22E:
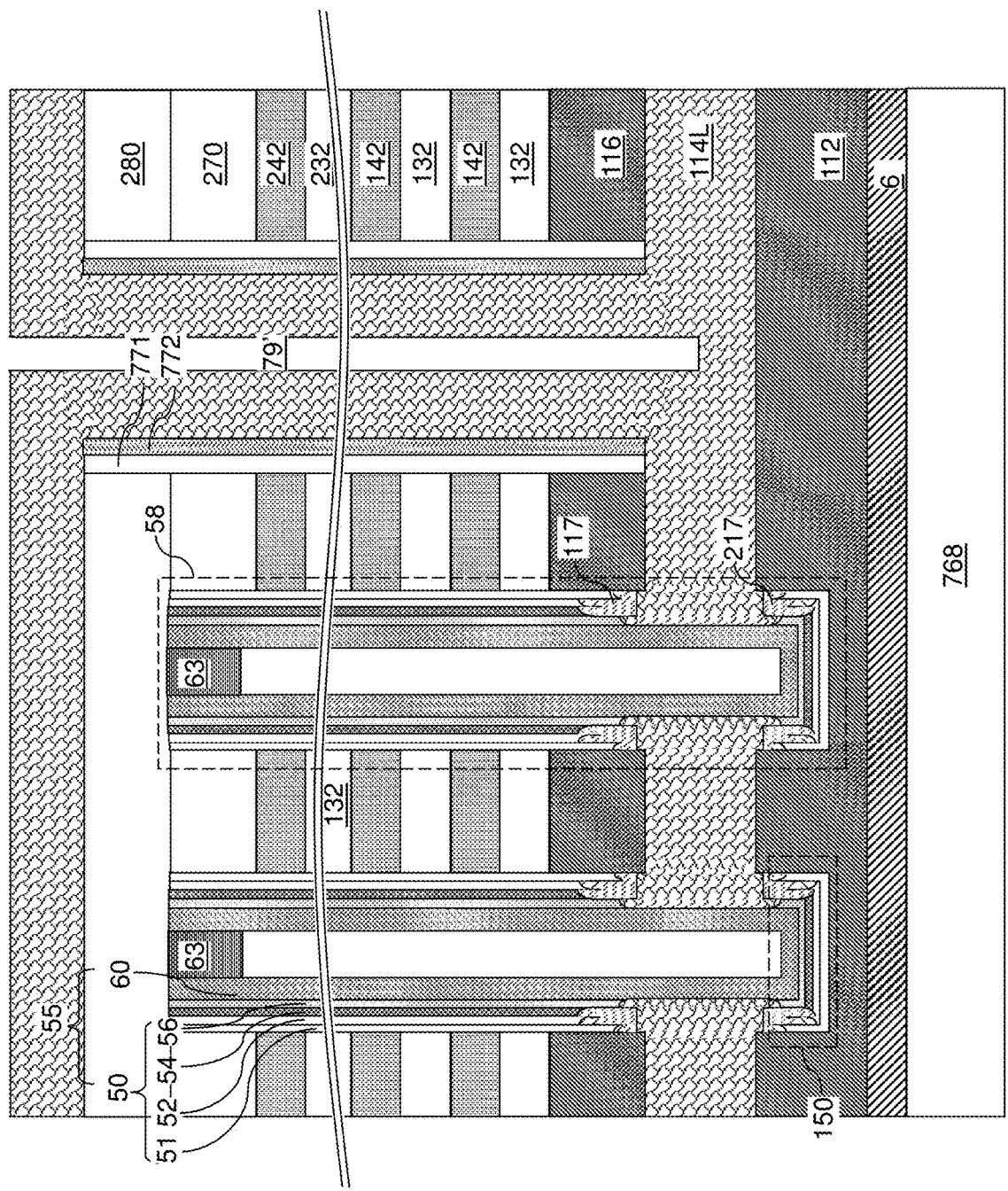

Referring to FIG. 22E, the source contact material layer 114L is formed on the physically exposed semiconductor surfaces around the source cavity 109, the physically exposed surfaces around each backside cavity 79', and above the first contact-level dielectric layer 280, as described above with respect to FIG. 15F.

Figure 22F:
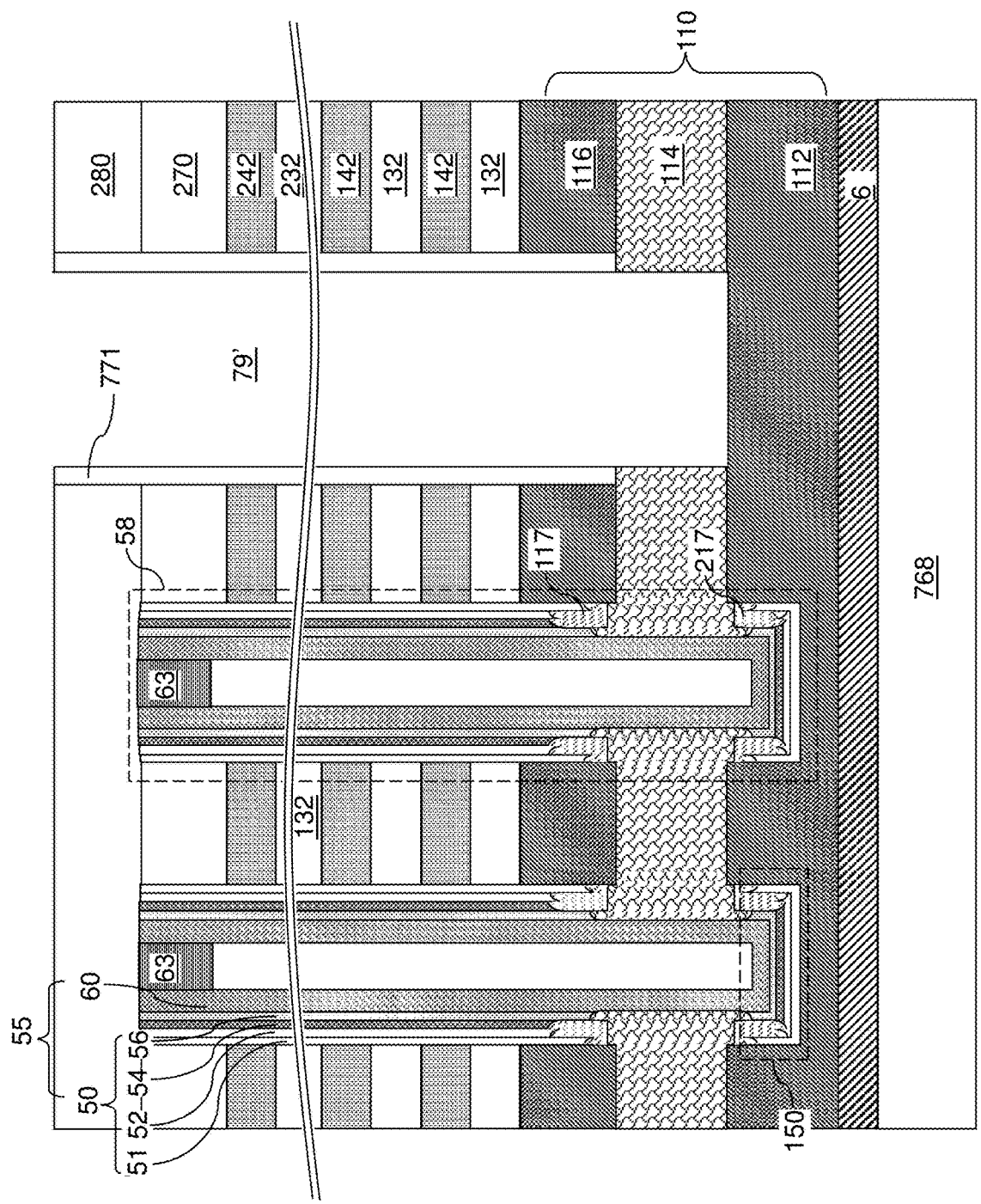

Referring to FIG. 22F, the etch back process can be performed to remove portions of the source semiconductor material layer 114L that are located above the first contact-level dielectric layer 280 or within the backside trenches 79 to form the source contact layer 114, as described above with respect to FIG. 15G.

Figure 22G:
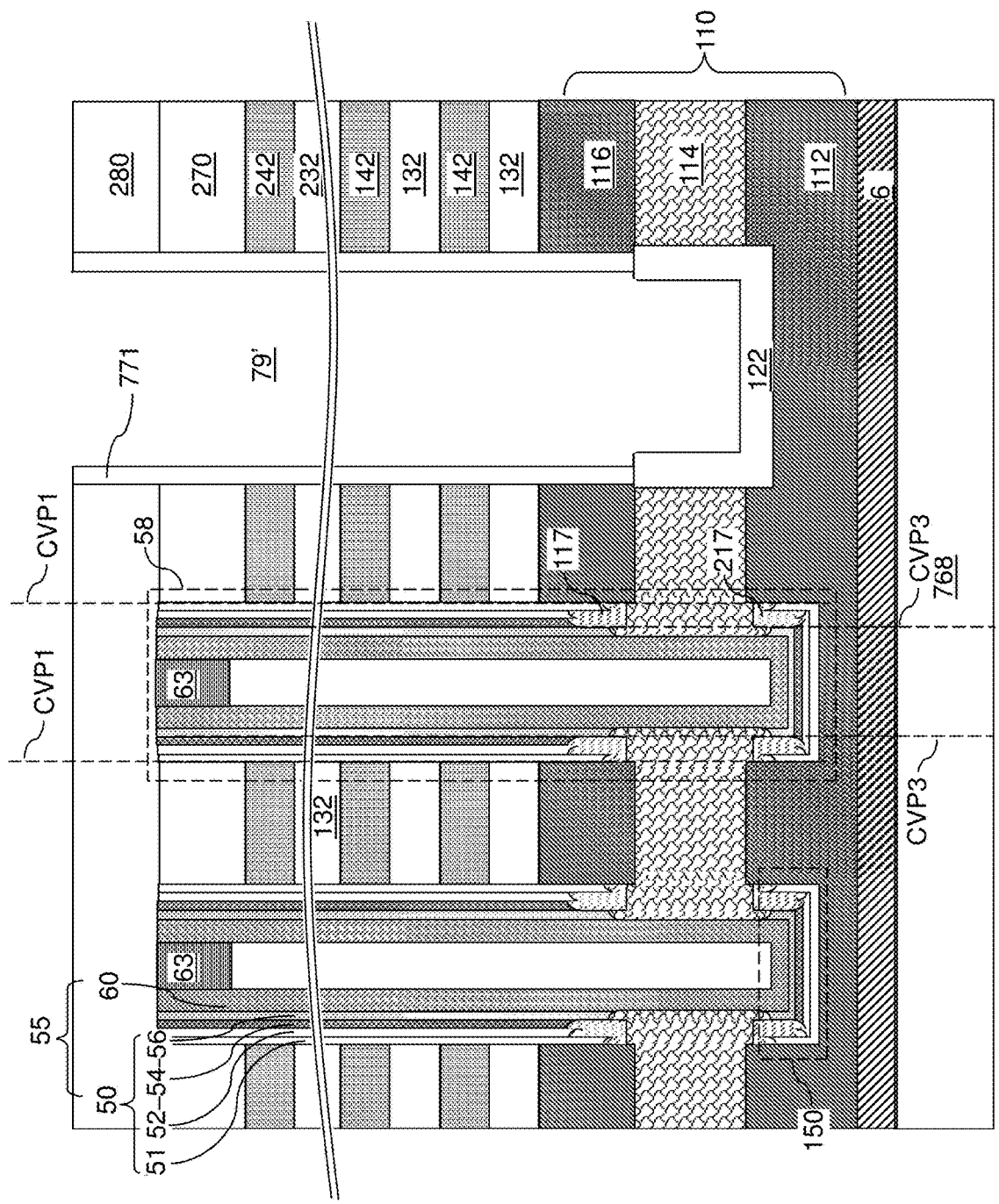

Referring to FIG. 22G, the oxidation process may be performed to convert physically exposed surface portions of semiconductor materials into dielectric semiconductor oxide portions. For example, surfaces portions of the source contact layer 114 and the lower source-level semiconductor layer 112 may be converted into dielectric semiconductor oxide plates 122 that includes a dielectric semiconductor oxide material such as a silicon oxide material, as described above with respect to FIG. 15H.

The first annular semiconductor cap 117 contacts a cylindrical segment of an outer sidewall of the tunneling dielectric layer 56. A second annular semiconductor cap 217 contacts a bottom surface segment of the source contact layer 114. In one embodiment, the source contact layer 114 contacts a concave annular bottom surface of the tunneling dielectric layer 56.

Subsequently, the processing steps of FIGS. 16, 17, 18A and 18B, 19A-19C, 20A and 20B, and 21 can be performed to form an alternative embodiment of the exemplary structure, which may differ from the exemplary structure illustrated in FIG. 21 by a vertical cross-sectional profile of the first annular semiconductor caps 117, the second annular semiconductor caps 217, and interfaces among the memory films 50 and the annular semiconductor caps (117, 217).

The exemplary structure and the alternative embodiment thereof may comprise a three-dimensional memory device. In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Referring collectively to all drawings and according to various embodiments of the present disclosure, a memory device is provided, which comprises: a layer stack including a lower source-level semiconductor layer 112, a source contact layer 114, and an upper source-level semiconductor layer 116; an alternating stack of insulating layers (132, 232) and electrically conductive layers (146, 246) located over the layer stack (112, 114, 116); and a memory opening fill structure 58 vertically extending through the alternating stack {(132, 232), (146, 246)}, the upper source-level semiconductor layer 116, the source contact layer 114, and an upper portion of the lower source-level semiconductor layer 112, wherein the memory opening fill structure 58 comprises: a vertical semiconductor channel 60 vertically extending through the alternating stack {(132, 232), (146, 246)} and into the upper portion of the lower source-level semiconductor layer 112; a memory film 50 laterally surrounding the vertical semiconductor channel 60 and vertically extending through the alternating stack {(132, 232), (146, 246)} and into an upper portion of the upper source-level semiconductor layer 116; and a first annular semiconductor cap 117 contacting a bottom surface of the memory film 50 and contacting a top surface segment of the source contact layer 114.

In one embodiment, the memory film 50 comprises: a charge storage layer 54 that vertically extends through each electrically conductive layer (146, 246) within the alternating stack {(132, 232), (146, 246)}; a tunneling dielectric layer 56 that is laterally surrounded by the charge storage layer 54; and at least one blocking dielectric layer (51, 52) that laterally surrounds the charge storage layer 54. In one embodiment, the first annular semiconductor cap and the source contact layer comprise silicon (e.g., polysilicon) having different dopant concentrations from each other.

Generally, the first and second annular semiconductor caps (117, 217) are self-aligned to the memory film 50. In one embodiment, the first and second annular semiconductor caps (117, 217) are located entirely within between a first cylindrical vertical plane CVP1 including the outer sidewall of the outer blocking dielectric layer 51 and a second cylindrical vertical plane CVP2 including the inner sidewall of the inner blocking dielectric layer 52. In another embodiment, the first and second annular semiconductor caps (117, 217) are located entirely within between a first cylindrical vertical plane CVP1 including the outer sidewall of the outer blocking dielectric layer 51 and a third cylindrical vertical plane CVP3 including the inner sidewall of the charge storage layer 54. The first and second annular semiconductor caps (117, 217) function as etch stop structures during an isotropic etch that etches a tubular portion of each tunneling dielectric layer 56 to physically expose surface segments of the sidewall of each vertical semiconductor channel 60. Particularly, the first annular semiconductor caps 117 reduce the vertical extent of the etched tubular portion of the inner blocking dielectric layer 52, and increase the vertical distance from the interface between the source layer 114 and the vertical semiconductor channels 60 to the bottommost electrically conductive layer 146 (e.g., the bottom source select gate electrode) within the alternating stack, thereby increasing electrical isolation of the bottom source select gate electrode 146 from the source layer 114.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
   a layer stack including a lower source-level semiconductor layer, a source contact layer, and an upper source-level semiconductor layer;
   an alternating stack of insulating layers and electrically conductive layers located over the layer stack; and
   a memory opening fill structure vertically extending through the alternating stack, the upper source-level semiconductor layer, the source contact layer, and an upper portion of the lower source-level semiconductor layer,
   wherein the memory opening fill structure comprises:
   a vertical semiconductor channel vertically extending through the alternating stack and into the upper portion of the lower source-level semiconductor layer;
   a memory film laterally surrounding the vertical semiconductor channel and vertically extending through the alternating stack and into an upper portion of the upper source-level semiconductor layer; and
   a first annular semiconductor cap contacting a bottom surface of the memory film and contacting a top surface segment of the source contact layer.

2. The memory device of claim 1, wherein the top surface segment of the source contact layer is located within a volume laterally bounded by a cylindrical vertical plane including an interface between the memory film and the insulating layers of the alternating stack.

3. The memory device of claim 1, wherein the first annular semiconductor cap and the source contact layer comprise silicon having different dopant concentrations from each other.

4. The memory device of claim 1, wherein the first annular semiconductor cap has an outer cylindrical surface contacting a sidewall of the upper source-level semiconductor layer.

5. The memory device of claim 1, wherein the memory film comprises:
   a charge storage layer that vertically extends through each electrically conductive layer within the alternating stack;
   a tunneling dielectric layer that is laterally surrounded by the charge storage layer; and
   at least one blocking dielectric layer that laterally surrounds the charge storage layer.

6. The memory device of claim 5, wherein the first annular semiconductor cap contacts a cylindrical segment of an outer sidewall of the charge storage layer.

7. The memory device of claim 6, wherein the source contact layer contacts a concave annular bottom surface of the charge storage layer.

8. The memory device of claim 5, wherein the first annular semiconductor cap contacts a cylindrical segment of an outer sidewall of the tunneling dielectric layer.

9. The memory device of claim 8, wherein the source contact layer contacts a concave annular bottom surface of the tunneling dielectric layer.

10. The memory device of claim 5, wherein the at least one blocking dielectric layer comprises:
    an inner blocking dielectric layer laterally surrounding the charge storage layer; and
    an outer blocking dielectric layer laterally surrounding the inner blocking dielectric layer, wherein the inner blocking dielectric layer has a higher etch rate in dilute hydrofluoric acid than the outer blocking dielectric layer.

11. The memory device of claim 10, wherein:
    the outer blocking dielectric layer comprises a first silicon oxide or oxynitride material; and
    the inner blocking dielectric layer comprises a second silicon oxide material including nitrogen atoms at an atomic concentration that is smaller than an atomic concentration of nitrogen atoms within the outer blocking dielectric layer.

12. The memory device of claim 10, wherein an interface between the inner blocking dielectric layer and the first annular semiconductor cap is located above a horizontal plane including a highest point within an interface between the outer blocking dielectric layer and the first annular semiconductor cap.

13. The memory device of claim 1, further comprising a second annular semiconductor cap contacting a bottom surface segment of the source contact layer, comprising a same material as the first annular semiconductor cap, and located within a cylindrical vertical plane containing an outer sidewall of the memory film.

14. The memory device of claim 13, further comprising a dielectric cap structure embedded within the lower source-level semiconductor layer, wherein:
   memory film comprises at least one blocking dielectric layer, a charge storage layer, and a tunneling dielectric layer; and
   the dielectric cap structure comprises a layer stack including a same set of materials as the memory film.

* * * * *